United States Patent
Uchino et al.

(10) Patent No.: US 11,206,571 B2
(45) Date of Patent: Dec. 21, 2021

(54) BASE STATION

(71) Applicant: NTT DOCOMO, INC., Tokyo (JP)

(72) Inventors: Tooru Uchino, Tokyo (JP); Wuri Andarmawanti Hapsari, Tokyo (JP); Anil Umesh, Tokyo (JP); Hideaki Takahashi, Tokyo (JP); Sadayuki Abeta, Tokyo (JP)

(*) Notice: Subject to any disclaimer, the term of this patent is extended or adjusted under 35 U.S.C. 154(b) by 0 days.

(21) Appl. No.: 16/382,389

(22) Filed: Apr. 12, 2019

(65) Prior Publication Data
US 2019/0239117 A1     Aug. 1, 2019

Related U.S. Application Data

(62) Division of application No. 15/518,259, filed as application No. PCT/JP2016/056245 on Mar. 1, 2016, now abandoned.

(30) Foreign Application Priority Data

May 22, 2015   (JP) .................................. 2015-104999

(51) Int. Cl.
  *H04W 28/04*   (2009.01)
  *H04L 1/18*    (2006.01)
  (Continued)

(52) U.S. Cl.
  CPC ........... *H04W 28/04* (2013.01); *H04L 1/1825* (2013.01); *H04L 1/1887* (2013.01);
  (Continued)

(58) Field of Classification Search
  CPC .............................. H04L 47/14; H04W 92/12
  (Continued)

(56) References Cited

U.S. PATENT DOCUMENTS

2006/0215592 A1   9/2006   Tomoe et al.
2006/0240826 A1   10/2006  Shinozaki
(Continued)

FOREIGN PATENT DOCUMENTS

JP   2013-502793 A   1/2013
JP   2014-239439 A   12/2014
(Continued)

OTHER PUBLICATIONS

International Search Report issued in PCT/JP2016/056245 dated May 17, 2016 (3 pages).
(Continued)

*Primary Examiner* — Kiet M Doan
(74) *Attorney, Agent, or Firm* — Osha Bergman Watanabe & Burton LLP

(57) ABSTRACT

A base station is provided. The base station includes a first reception unit configured to receive, from a user apparatus included in a mobile communication system including the base station, another base station communicating with the base station, and the user apparatus communicating with the base station, first data including quality information used for scheduling controlling performed by the other base station, and second data different from the first data. The base station also includes a transmission unit configured to transmit the first data to the other base station by giving higher priority to the first data than to the second data.

9 Claims, 36 Drawing Sheets

(51) Int. Cl.
*H04W 88/08* (2009.01)
*H04W 72/04* (2009.01)
*H04W 92/20* (2009.01)
*H04L 1/00* (2006.01)
*H03M 13/03* (2006.01)
*H04W 24/10* (2009.01)

(52) U.S. Cl.
CPC ....... *H04W 72/048* (2013.01); *H04W 88/085* (2013.01); *H03M 13/03* (2013.01); *H04L 1/1822* (2013.01); *H04L 2001/0097* (2013.01); *H04W 24/10* (2013.01); *H04W 92/20* (2013.01)

(58) Field of Classification Search
USPC ....... 370/336, 412, 258, 311, 329, 241, 315, 370/254, 252, 343
See application file for complete search history.

(56) References Cited

U.S. PATENT DOCUMENTS

| | | | |
|---|---|---|---|
| 2007/0275657 | A1 | 11/2007 | Chang et al. |
| 2009/0060010 | A1 | 3/2009 | Maheshwari et al. |
| 2009/0191882 | A1 | 7/2009 | Kovacs et al. |
| 2009/0305715 | A1* | 12/2009 | Barve ............... H04W 72/1284 455/452.2 |
| 2010/0074233 | A1* | 3/2010 | Yi ........................... H04L 47/10 370/336 |
| 2012/0008547 | A1 | 1/2012 | Yokoyama et al. |
| 2012/0147815 | A1 | 6/2012 | Meyer et al. |
| 2013/0010745 | A1 | 1/2013 | Ko et al. |
| 2013/0094431 | A1 | 4/2013 | Terry et al. |
| 2014/0036855 | A1 | 2/2014 | Matsuo et al. |
| 2014/0211652 | A1* | 7/2014 | Shi ........................ H04W 24/08 370/252 |
| 2015/0045048 | A1 | 2/2015 | Xu et al. |
| 2015/0172937 | A1 | 6/2015 | Sasaki et al. |
| 2015/0230169 | A1* | 8/2015 | Hood ............... H04B 10/25753 370/311 |
| 2015/0236772 | A1* | 8/2015 | Hammarwall ....... H04B 7/0617 370/329 |

FOREIGN PATENT DOCUMENTS

| | | |
|---|---|---|
| WO | 2009050174 A1 | 4/2009 |
| WO | 2011/020922 A1 | 2/2011 |
| WO | 2014/006936 A1 | 1/2014 |

OTHER PUBLICATIONS

Written Opinion of the International Searching Authority issued in PCT/JP2016/056245 dated May 17, 2016 (3 pages).

The partial supplementary European Search Report issued in corresponding European Application No. 16799625.5, dated Apr. 20, 2018 (13 pages).

Extended European Search Report issued in corresponding European Application No. 16799625.5, dated Aug. 27, 2018 (13 pages).

* cited by examiner

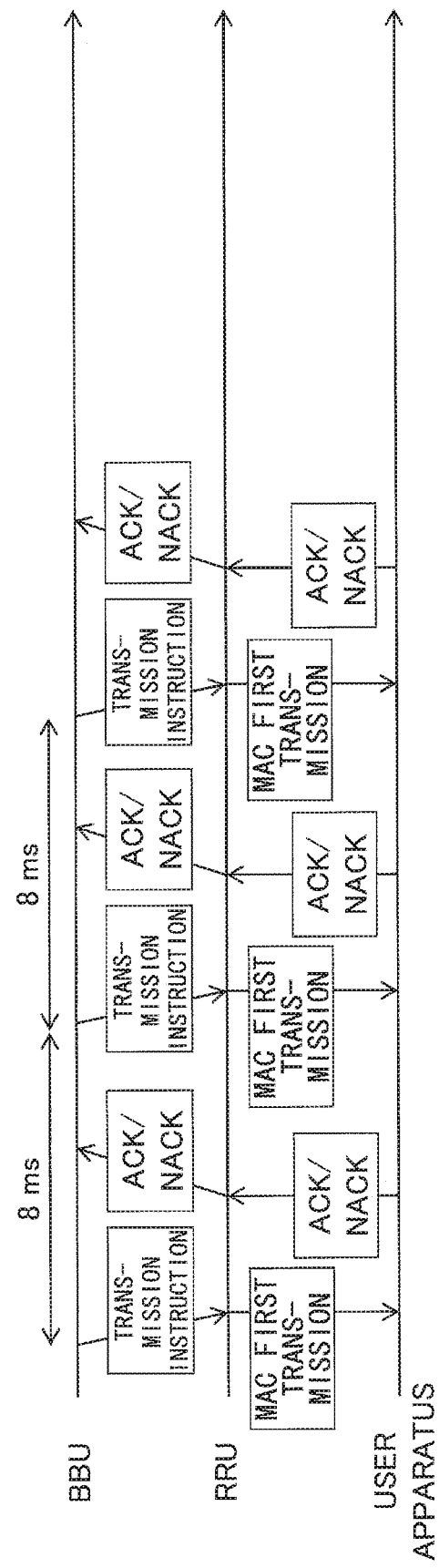

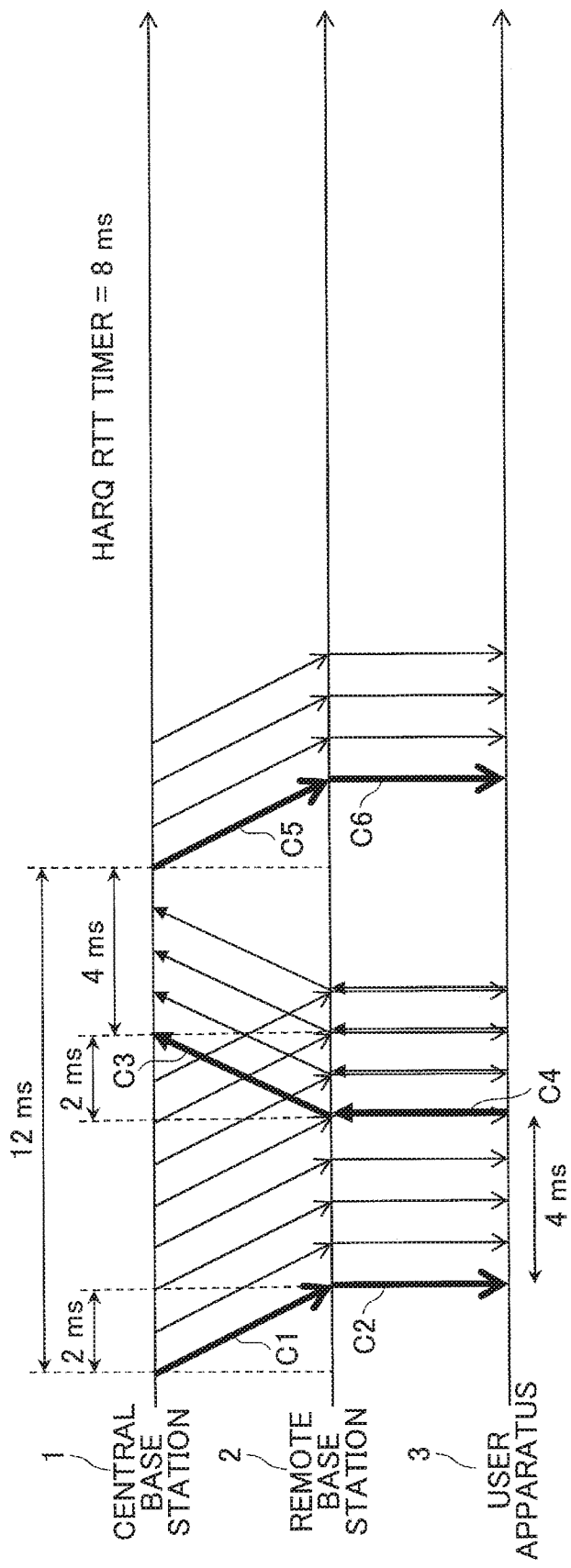

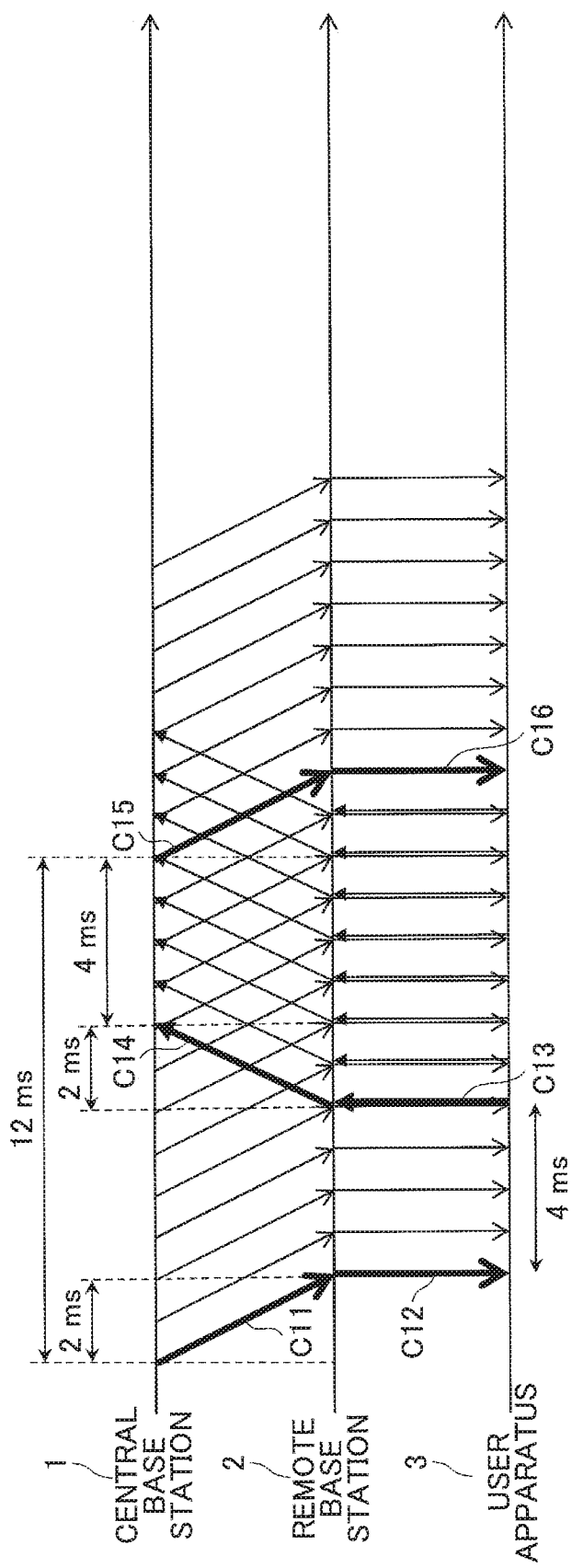

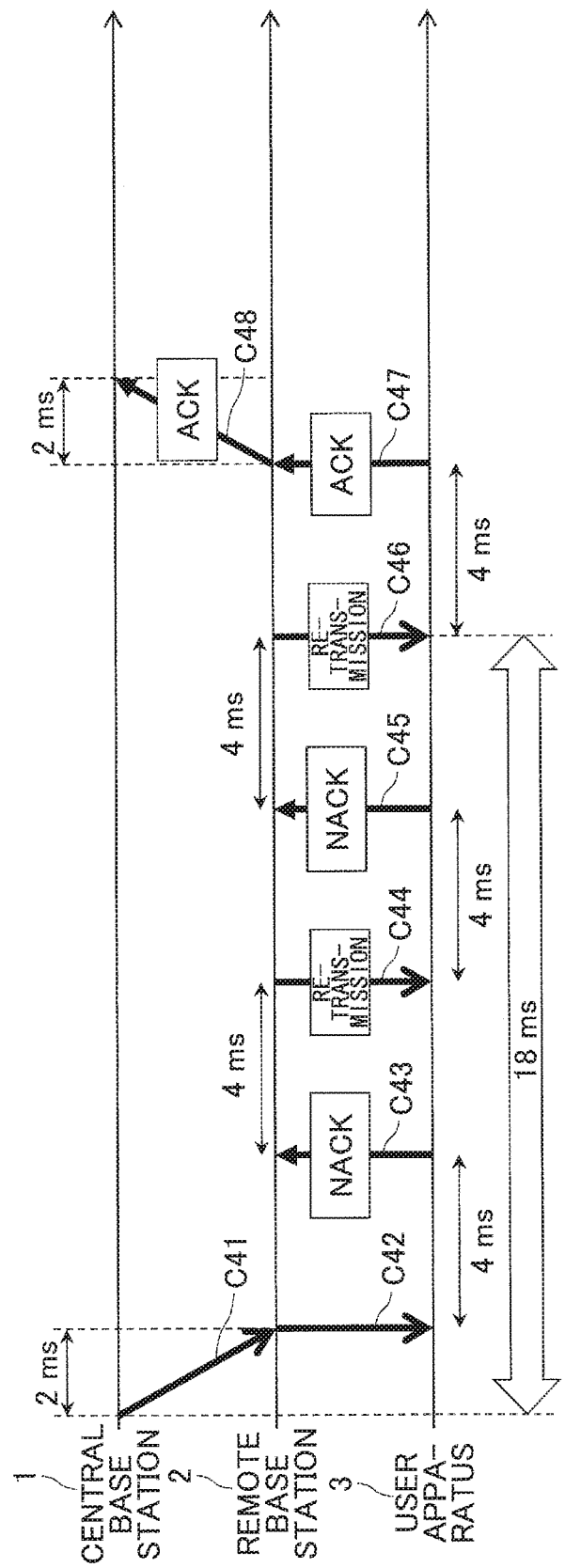

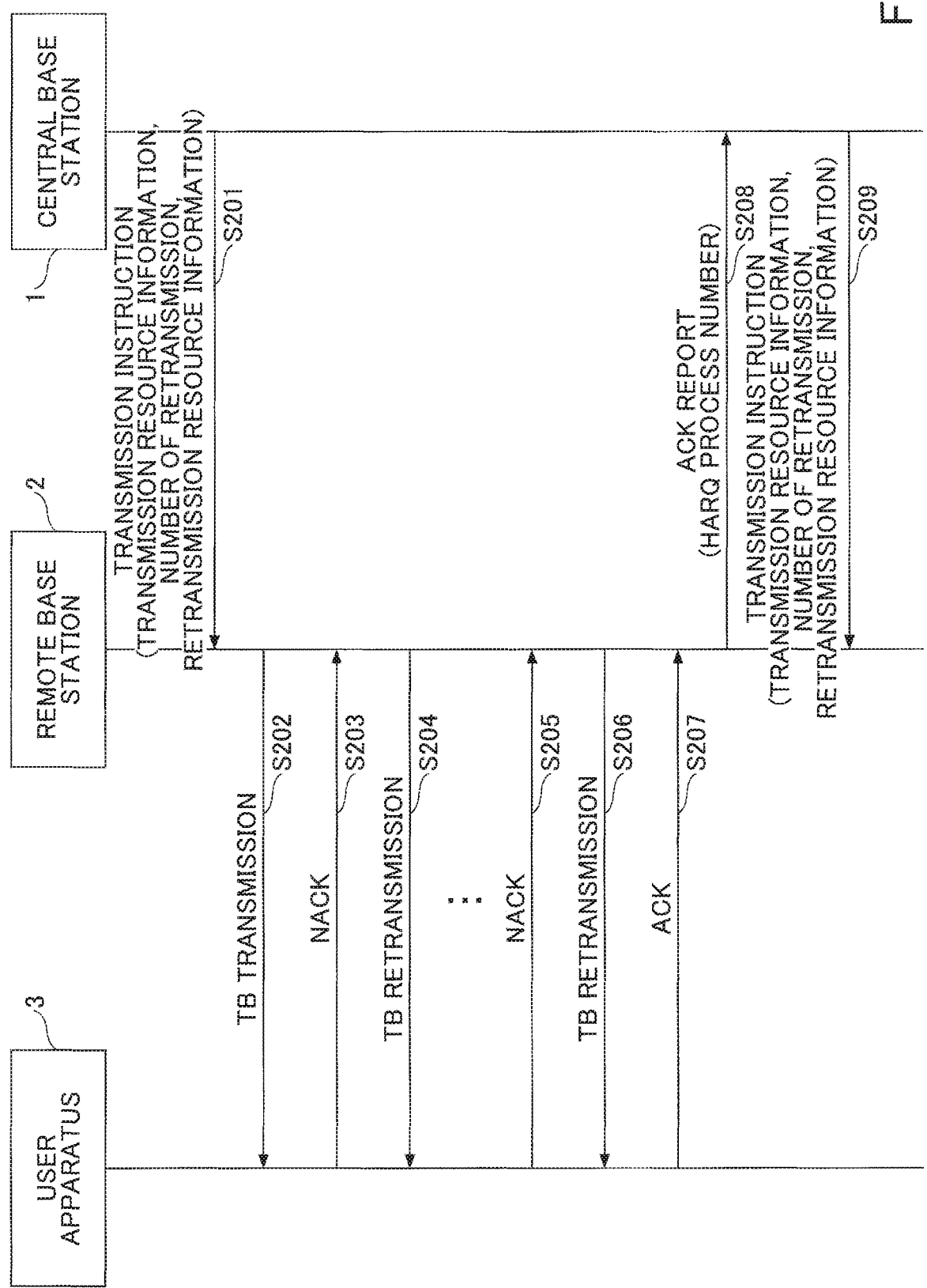

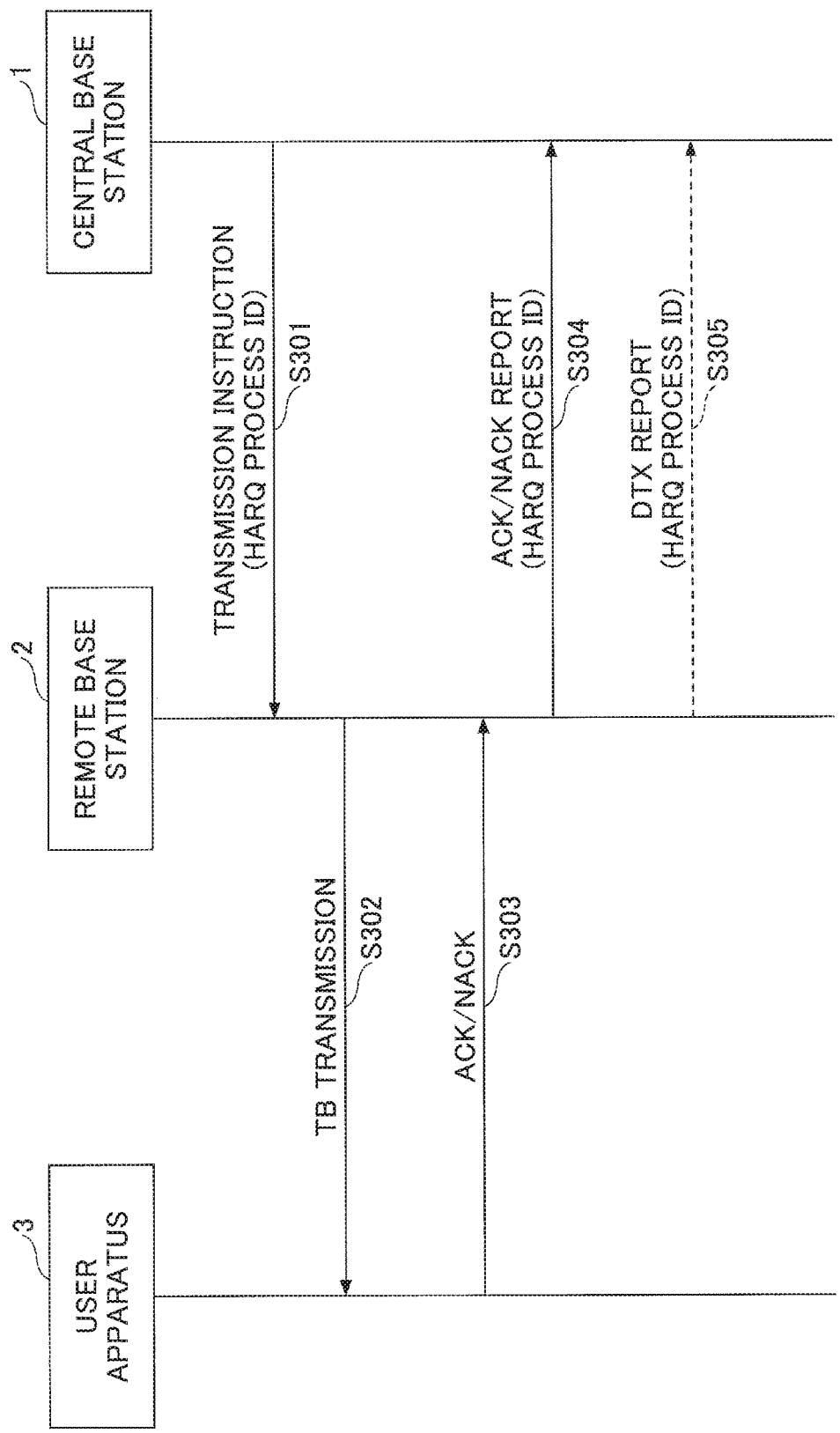

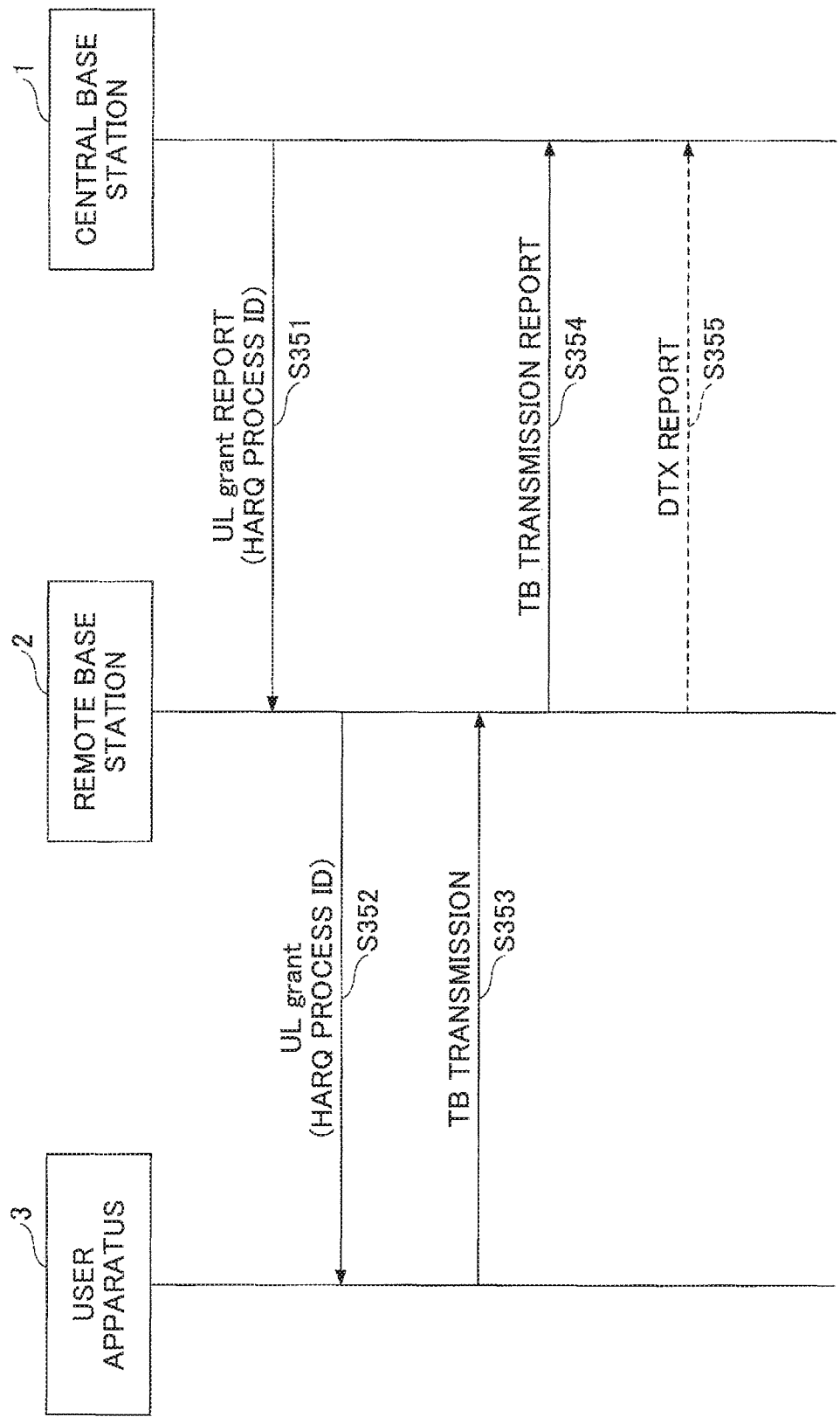

BASE STATION

CROSS REFERENCE TO RELATED APPLICATIONS

This application is a divisional application of U.S. patent application Ser. No. 15/518,259, filed on Apr. 11, 2017, which is a U.S. national stage application of International Patent Application No. PCT/JP2016/056245, filed on Mar. 1, 2016, which claims priority to Japanese Patent Application No. JP2015-104999, filed on May 22, 2015. The entire contents of these applications are incorporated herein by reference.

BACKGROUND OF THE INVENTION

1. Field of the Invention

The present invention relates to a base station.

2. Description of the Related Art

In a long term evolution (LTE) system, in order to efficiently support a high traffic area such as a hot spot, a technology called a centralized radio access network (C-RAN) has been investigated with which it is possible to keep apparatus cost low while increasing the number of cells included in the system.

The C-RAN includes one or more remote radio units (RRUs), which are remotely installed base stations, and a baseband unit (BBU), which is a base station as a centralized RRU controller. The RRUs and the BBU are connected to each other by using a common public radio interface (CPRI). The BBU has functions of layer 1 through layer 3 included in an evolved NodeB (eNB) as an LTE base station. An orthogonal frequency division multiplexing (OFDM) signal, generated by the BBU, is sampled and transmitted to the RRU via the CPRI, and transmitted from a radio frequency (RF) functional unit included in the RRU.

FIG. 1 is a drawing illustrating a configuration example of a C-RAN. In an example of FIG. 1, two RRUs are connected to one BBU via CPRIs.

CITATION LIST

Patent Literature

[PTL 1] Japanese Unexamined Patent Application Publication No. 2014-239439

SUMMARY OF THE INVENTION

A bandwidth necessary for a CPRI is about 16 times the peak rate supported by a BBU. For example, in the case where a system bandwidth is 20 MHz and a BBU supports radio communications of 2×2 multi input multi output (MIMO), a bandwidth necessary for a CPRI is about 2.4 Gbps.

Currently, a radio communication technology called "5th generation" has been studied in order to realize a peak rate equal to or greater than 10 Gbps and further reduced delay. When a radio communication technology of the 5th generation is introduced, there is a problem in that the bandwidth necessary for a CPRI increases dramatically, and the CPRI installation cost also increases.

Therefore, it has been investigated to reduce information amount transmitted by a CPRI by transferring a part of layer functions from a BBU to an RRU. Various methods can be considered about which layer function should be transferred. For example, it has been investigated to transfer the layer 1 function included in a BBU to an RRU. Further, for example, it has been also investigated to transfer the layer 1 function and a part of the layer 2 function (e.g., hybrid automatic repeat request (HARQ) function) to an RRU.

It is a prerequisite for a CPRI to use low-delay transmission path such as an optical fiber. However, as described above, under a situation in which the bandwidth necessary for a CPRI increases dramatically, it is expected that the further reduction of the installation cost will be required. For example, it is expected that, instead of the optical fiber, an IP transmission path such as the Ethernet (registered trademark) will be used. Further, it may be also expected that, relying on a statistical multiplexing effect, an optical fiber, the bandwidth of which optical fiber is less than the bandwidth necessary for the peak rate, may be used.

Transmission delay of the IP transmission path such as the Ethernet (registered trademark) is greater than that of an optical fiber. Further, in the case where an optical fiber, the bandwidth of which optical fiber is less than the bandwidth necessary for the peak rate, is used, there is a possibility that the transmission delay becomes greater depending on the traffic amount flowing in the CPRI. Here, in the case where the CPRI transmission delay becomes greater, a problem described below may occur.

First, the first problem will be described referring to figures. FIG. 2A and FIG. 2B are drawings illustrating a problem. FIG. 2A illustrates a state in which the transmission delay has not occurred (a state in which the transmission delay is within a specified range), and FIG. 2B illustrates a state in which the transmission delay has occurred (a state in which the transmission delay is great). It should be noted that it is assumed in FIG. 2A and FIG. 2B that the layer 1 function and an HARQ processing function of the functions of the BBU have been transferred to the RRU. In other words, it is assumed that the BBU performs scheduling operations including generation of a medium access control protocol data unit (MAC PDU) to be transmitted to a user apparatus, and instructing the MAC PDU transmission, that a MAC entity generates a transport block (TB) from the MAC PDU, and that the RRU performs HARQ processing for transmitting the generated TB to the user apparatus.

As illustrated in FIG. 2A, in conventional LTE, a HARQ round trip time (RTT) timer is 8 ms. In other words, it is possible for the BBU to instruct transmission of the next MAC PDU (or, retransmission of the MAC PDU) 8 ms after transmitting to the RRU an instruction of the MAC PDU transmission.

On the other hand, as illustrated in FIG. 2B, in the case where the transmission delay has occurred in a CPRI between the BBU and the RRU, the BBU cannot transmit an instruction of transmitting the next (new) MAC PDU even when 8 ms has elapsed after transmitting to the RRU an instruction of the MAC PDU transmission. In other words, in FIG. 2B, when compared with FIG. 2A, the throughput of the user data transmitted/received between the BBU and the user apparatus is reduced because the number of MAC PDUs which can be transmitted within a predetermined time decreases.

Further, similarly, in the case where the transmission delay has occurred in a CPRI between the BBU and the RRU, the BBU cannot instruct retransmission of the MAC PDU even when 8 ms has elapsed after transmitting to the RRU an instruction of the MAC PDU transmission. In other words, in FIG. 2B, when compared with FIG. 2A, in the case where a NACK is returned from the user apparatus, the time before the TB is retransmitted will be increased. In other words, as the transmission delay of the user data transmitted and received between the BBU and the user apparatus increases, more time is required for retransmission, and, as a result, the throughput will be reduced.

Next, the second problem will be described. It is expected that the transmission delay which occurs in a CPRI is not necessarily constant. For example, there is a possibility that fluctuations occur in the transmission delay because, in an IP transmission path such as the Ethernet (registered trademark), an IP packet is transmitted basically according to best efforts. Further, in the case where an optical fiber, the bandwidth of which optical fiber is less than the bandwidth necessary for the peak rate, is used, there is a possibility that the fluctuations occur in the transmission delay because the amount of traffic flowing in a CPRI changes according to time zones.

In the HARQ processing described above, multiple HARQ processes are running in the user apparatus and the base station, respectively, and transmission and reception of a TB and an ACK/NACK are performed between a specific process of the user apparatus and a specific process of the base station. Further, it is defined that the user apparatus (or the base station) should transmit an ACK/NACK in a subframe 4 ms after the TB reception so that the base station (or the user apparatus) can determine a process ID which corresponds to the ACK/NACK transmitted from the user apparatus (or the base station) corresponding to the TB transmitted by the HARQ process of which process ID.

However, if transmission delay occurs in a CPRI and fluctuations occur in the transmission delay, then even when the user apparatus (or the base station) transmits an ACK/NACK via a subframe 4 ms after the TB reception, the base station (or the user apparatus) is not necessarily able to receive the ACK/NACK via the subframe after 4 ms. In other words, the base station (or the user apparatus) cannot determine the process ID which corresponds to the ACK/NACK corresponding to the TB transmitted by the HARQ process of which process ID, and cannot perform HARQ processing properly.

Further, if transmission delay occurs in a CPRI and fluctuations occur in the transmission delay, then there is a possibility that a problem occurs in a process other than the HARQ process. For example, the user apparatus reports quality information (channel state information (CSI)) to the base station so that the base station can perform appropriate scheduling operations. However, if transmission delay occurs in a CPRI and fluctuations occur in the transmission delay, then the base station cannot determine the quality information of which timing (which subframe) has been reported by the user apparatus. In other words, the base station cannot perform appropriate scheduling operations.

In view of the above second problem, the present invention has been made. An object of the present invention is to provide a technology which enables performing appropriate communications even in the case where the transmission delay between the base station and a remote base station is great in a mobile communication network based on a C-RAN.

A base station is provided. The base station includes a first reception unit configured to receive, from a user apparatus included in a mobile communication system including the base station, another base station communicating with the base station, and the user apparatus communicating with the base station, first data including quality information used for scheduling controlling performed by the other base station, and second data different from the first data, and a transmission unit configured to transmit the first data to the other base station by giving higher priority to the first data than to the second data.

According to one or more embodiments, a technology is provided which may enable performing appropriate communications even in the case where the transmission delay between the base station and a remote base station is great in a mobile communication network based on a C-RAN.

BRIEF DESCRIPTION OF THE DRAWINGS

FIG. 2A is a drawing illustrating a problem.

FIG. 4A is a drawing illustrating an overview of a process according to a first embodiment.

FIG. 4B is a drawing illustrating an overview of a process according to a first embodiment.

FIG. 10B is a drawing illustrating an overview of a process according to a second embodiment.

FIG. 11 is a drawing illustrating HARQ processing according to a second embodiment.

FIG. 17 is a sequence diagram illustrating HARQ processing (downlink) according to a third embodiment.

FIG. 21 is a sequence diagram illustrating HARQ processing (uplink) according to a third embodiment.

DETAILED DESCRIPTION

Figure 1:
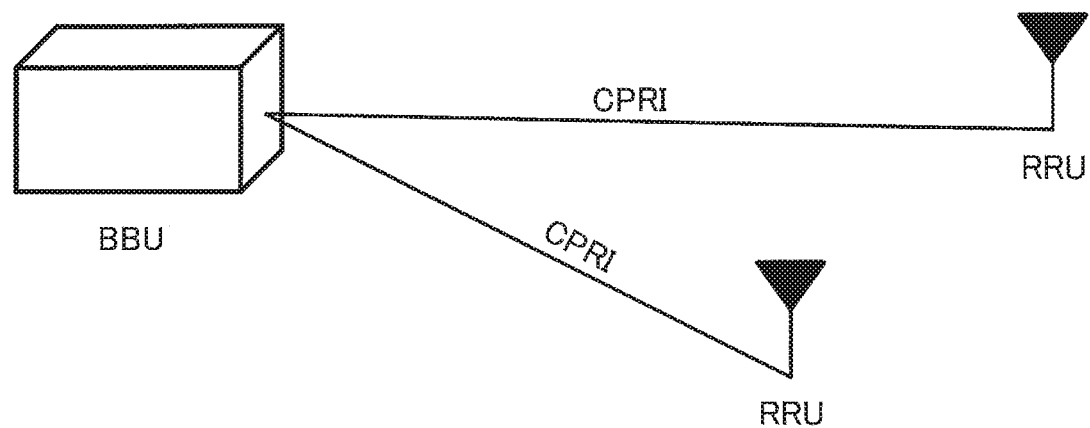
FIG. 1 is a drawing illustrating a configuration example of C-RAN.
Figure 2B:
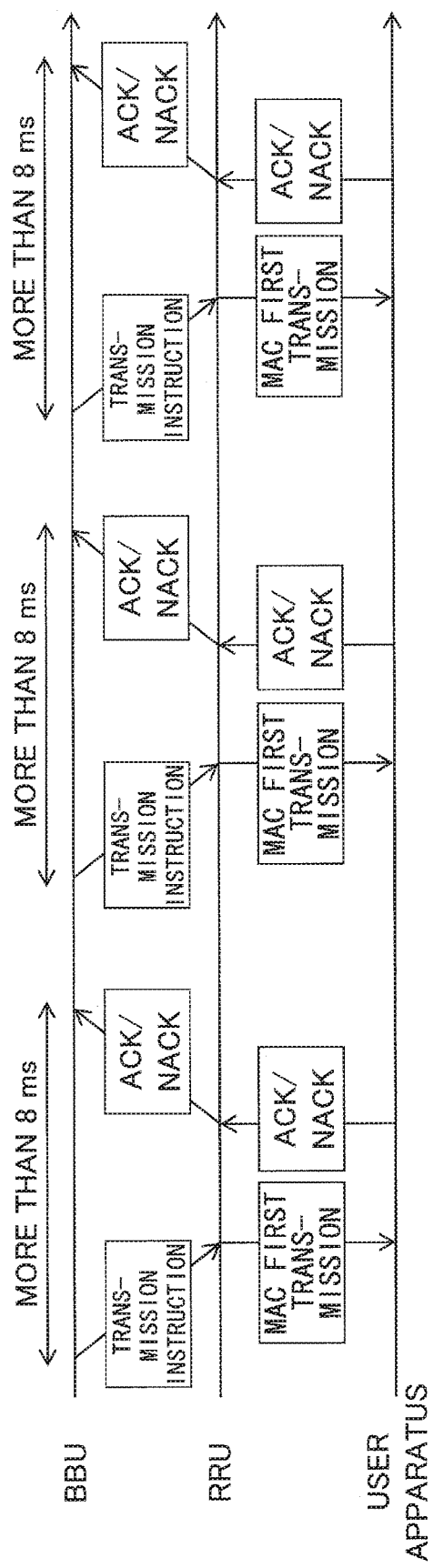
FIG. 2B is a drawing illustrating a problem.

In the following, referring to the drawings, embodiments of the present invention will be described. It should be noted that the embodiments described below are merely examples and the embodiments to which the present invention is applied are not limited to the following embodiments. For example, it is assumed that a mobile communication system according to one or more embodiments complies with LTE standard. However, the present invention can be applied, not limited to LTE, but can also be applied to other schemes. It should be noted that, in the application specification and claims, the term "LTE" is used, not only for meaning a communication method corresponding to 3GPP release 8 or 9, but also for including a communication method corresponding to 3GPP release 10, 11, 12, 13, or later. Further, it is assumed that a mobile communication system according to one or more embodiments is based on, but not limited to, a network of a C-RAN <Overall System Configuration>

Figure 3:
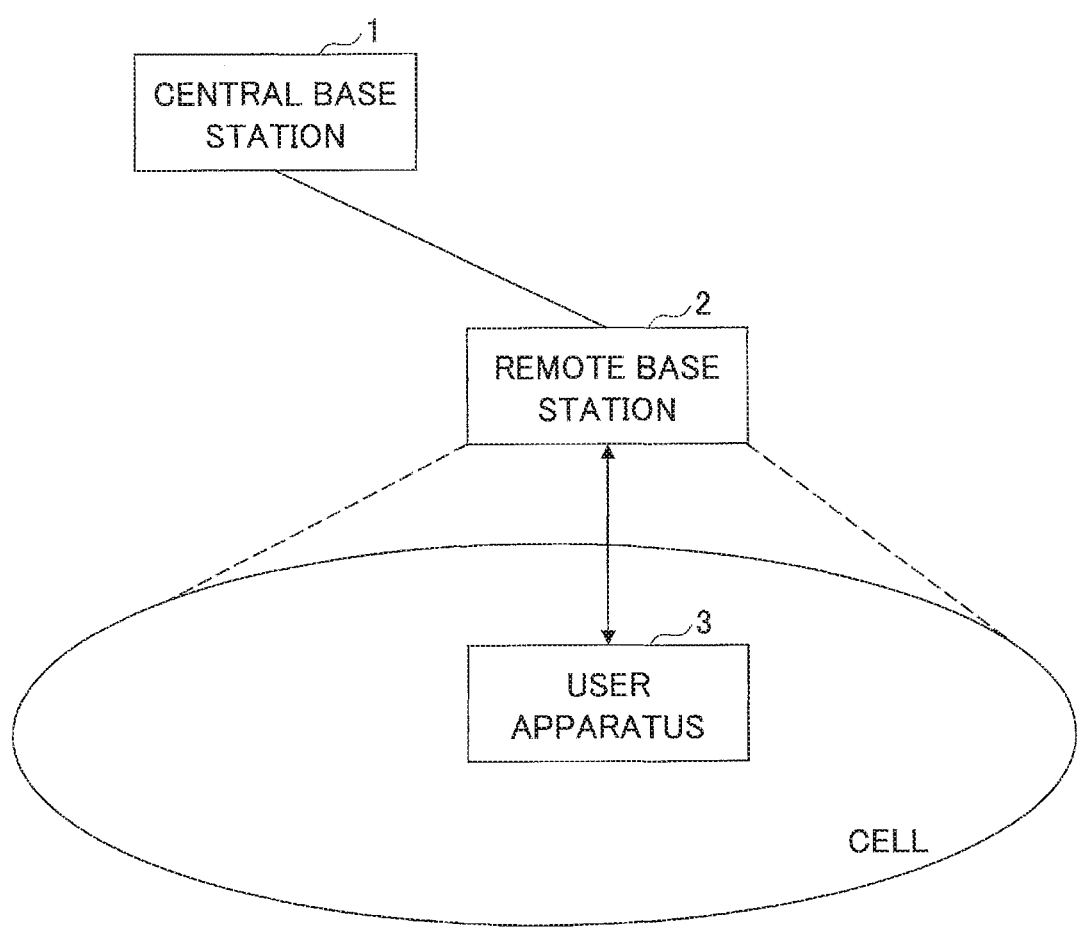
FIG. 3 is a drawing illustrating an example of a system configuration of a mobile communication system according to one or more embodiments.

FIG. 3 is a drawing illustrating an example of a system configuration of a mobile communication system according to one or more embodiments. As illustrated in FIG. 3, a mobile communication system according to one or more embodiments includes a central base station 1, a remote base station 2, and a user apparatus 3. In FIG. 1, for the sake of convenience, a single remote base station 2 and a single user apparatus 3 are illustrated. However, multiple remote base stations 2 and multiple user apparatuses 3 may exist. Further, the remote base station 2 forms a cell. In FIG. 3, a single cell is illustrated. However, when carrier aggregation (CA) is provided, multiple cells exist. For example, the central base station may form another one or more cells.

The central base station 1 may be referred to as a BBU in a C-RAN, or referred to as an eNB. Further, the remote base station 2 may be referred to as a RRU in a C-RAN.

In the following, a first embodiment and a second embodiment corresponding to the first problem, and a third embodiment and a fourth embodiment corresponding to the second problem will be described.

In the following, the first and second embodiments will be described separately from the third and fourth embodiments. However, these embodiments can be arbitrarily combined.

First Embodiment

<Process Overview>

In a mobile communication system according to the first embodiment, the throughput of user data transmitted and received between the central base station 1 and the user apparatus 3 is improved by changing HARQ processing methods according to transmission delay time between the central base station 1 and the remote base station 2.

It should be noted that the first embodiment can be applied to a case where the layer 1 function of the central base station 1 has been transferred to the remote base station 2, and a case where the layer 1 function and the HARQ processing function of the central base station 1 have been transferred to the remote base station 2.

In the case where the layer 1 function and the HARQ processing function have been transferred to the remote base station 2, the scheduling operations including MAC PDU transmission instruction, radio resource allocation, etc., are performed by the central base station 1. Further, the remote base station 2 performs an operation related to generating a TB from a MAC PDU and transmitting the generated TB to the user apparatus, an operation related to retransmitting the TB, an operation related to generating a MAC PDU from a TB and transmitting the generated MAC PDU to the central base station 1, and an operation related to transmitting an ACK/NACK to the user apparatus 3.

FIG. 4A and FIG. 4B are drawings illustrating an overview of a process according to the first embodiment. It should be noted that in FIGS. 4A and 4B, for the sake of convenience, ACK/NACKs are partially omitted. FIG. 4A illustrates an operation example in the case where conventional LTE HARQ processing is applied to a mobile communication system according to one or more embodiments. It should be noted that, in FIG. 4A, it is assumed that the HARQ RTT timer is 8 ms. Further, it is assumed that the transmission delay between the central base station 1 and the remote base station 2 is 2 ms.

As illustrated in FIG. 4A, a MAC PDU (or TB) is transmitted from the central base station 1 (C1), and arrives at the remote base station 2 after 2 ms. Further, the TB is transmitted from the remote base station 2 to the user apparatus 3 (C2). The user apparatus 3 decodes the received TB, transmits a ACK to the remote base station in the case where the TB is decoded properly, and transmits a NACK to the remote base station in the case where the TB is not decoded properly (C3). Further, the ACK or the NACK is transmitted from the remote base station 2 to the central base station 1 (C4), and arrives at the central base station 1 after 2 ms. Because the HARQ RTT timer is 8 ms, the central base station 1 is supposed to instruct transmission of a new MAC PDU or retransmission of the TB at least 4 ms after the ACK/NACK is received (C5).

Here, 8 TBs, including C2, have been transmitted to the user apparatus 3 during a period between when the remote base station 2 has transmitted a TB to the user apparatus 3 (C2) and when a TB is transmitted to the user apparatus 3 (C6). According to conventional LTE, because the HARQ RTT timer is 8 ms, 8 HARQ processes are running in the HARQ processing. In other words, 8 TBs, including C2, are processed and transmitted in parallel by having 8 HARQ processes performing transmission in parallel.

In one or more embodiments, transmission delay occurs between the central base station 1 and the remote base station 2. As a result, there is time when no signal is transmitted, from the remote base station 2, between ACK/NACK reception by the remote base station 2 (C3) and TB transmission (C6). In other words, the fact that there is time when no user data is transmitted and received will be a cause of a reduced throughput.

Therefore, in the first embodiment, according to the transmission delay between the central base station 1 and the remote base station 2, the number of HARQ processes is increased.

FIG. 4B illustrates an operation example in the case where the number of HARQ processes is 12. It should be noted that C11 through C16 in FIG. 4B correspond to C1 through C6 in FIG. 4A, respectively. In an example of FIG. 4B, TBs are transmitted from the remote base station 2 even during a period between when the remote base station 2 receives an ACK/NACK (C13) and when a TB is transmitted (C16). In other words, it is possible to improve the throughput by reducing the time when no user data is transmitted and received.

<Processing Steps>
(Transmission Delay Measurement Process)

Figure 5:
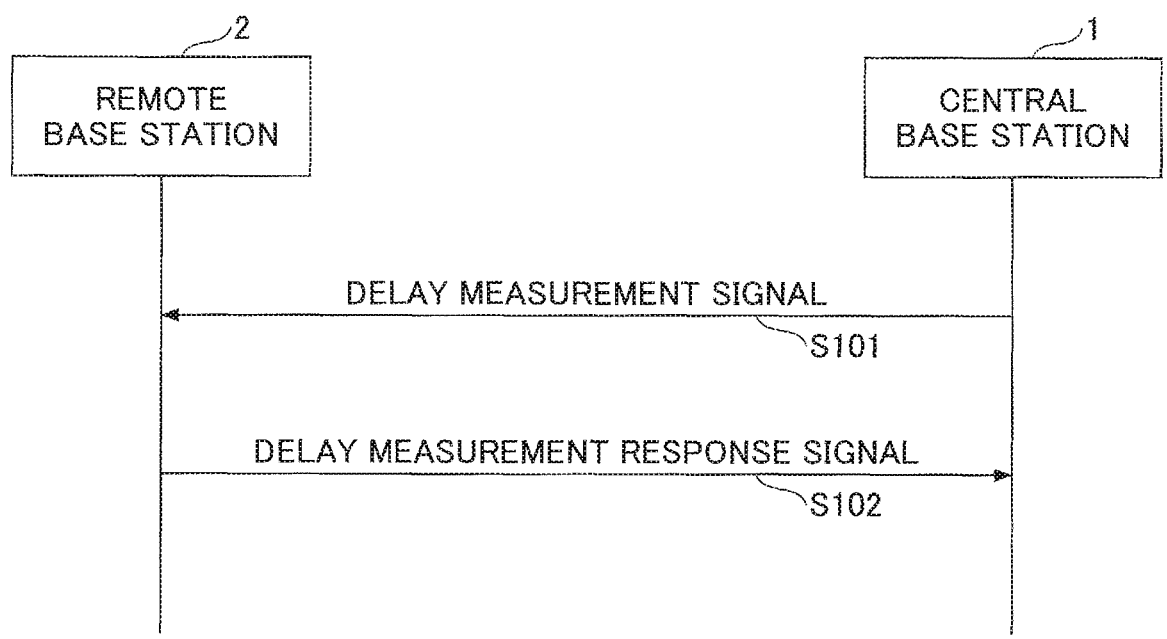
FIG. 5 is a sequence diagram illustrating an example of processing steps for measuring delay time according to one or more embodiments.

FIG. 5 is a sequence diagram illustrating an example of processing steps for measuring delay time according to the first embodiment. Referring to FIG. 5, the processing steps for measuring the transmission delay between the central base station 1 and the remote base station 2 will be described. It should be noted that the following processing steps may be performed automatically at the start-up of the central base station 1 and the remote base station 2 (at the power supply start-up, etc.) or may be performed by an operator's instruction. Further, by taking into account that the transmission delay changes, the following processing steps may be performed periodically at a predetermined timing. Further, in the case where there are multiple remote base stations 2, processing steps of step S101 and step S102 will be performed between the central base station 1 and each of the remote base stations 2.

In step S101, the central base station 1 transmits a delay measurement signal to the remote base station 2. The delay measurement signal may include, for example, information for uniquely identifying the central base station 1 as a transmission source (BBU identifier, etc.) and information for uniquely identifying the remote base station 2 as a transmission destination. The information for uniquely identifying the remote base station 2 may be an RRU identifier, an identifier of a cell under the RRU (CellIdentity, sCellIdentity), a carrier frequency, etc. Further, the delay measurement signal may include a time stamp of the time when the signal is transmitted by the central base station 1, a system frame number (SFN), or a subframe number. Further, the delay measurement signal may include an offset time between when the delay measurement signal is received by the remote base station 2 and when a delay measurement response signal will be transmitted by the remote base station 2.

In step S102, the remote base station 2 transmits the delay measurement response signal to the central base station 1. The delay measurement response signal may include, for example, information for uniquely identifying the central base station 1 as a transmission destination (BBU identifier, etc.) and information for uniquely identifying the remote base station 2 as a transmission resource. The information for uniquely identifying the remote base station 2 may be an RRU identifier, an identifier of a cell under the RRU (CellIdentity, sCellIdentity), a carrier frequency, etc. Further, the delay measurement response signal may include a time stamp of the time when the delay measurement signal has been received from the central base station 1 (or, when the delay measurement response signal is transmitted to the central base station 1), a system frame number, or a subframe number.

Further, in order to make the transmission delay measurement easier for the central base station 1, the remote base station 2 may further include in the delay measurement response signal the time stamp, the system frame number (SFN), or the subframe number included in the delay measurement signal. Further, in the case where the offset time is included in the delay measurement signal, the remote base station 2 may transmit the delay measurement response signal to the central base station 1 after an elapse of the offset time.

Upon receiving the delay measurement response signal, the central base station 1 calculates the transmission delay time between the central base station 1 and the remote base station 2 by comparing the time when the delay measurement signal has been transmitted and the time when the delay measurement response signal is received, and stores the calculated transmission delay time in a memory. Further, in the case where the delay measurement response signal includes the time stamp of the time when the delay measurement signal has been transmitted and the time stamp of the time when the delay measurement response signal is received, the central base station 1 may calculate the transmission delay time between the central base station 1 and the remote base station 2 by comparing the time stamps, and store the calculated transmission delay time in the memory.

It should be noted that the stored transmission delay time may be a round trip time (RTT), or one direction of the transmission delay time (that is, RTT/2).

(HARQ Processing)

Figure 6:
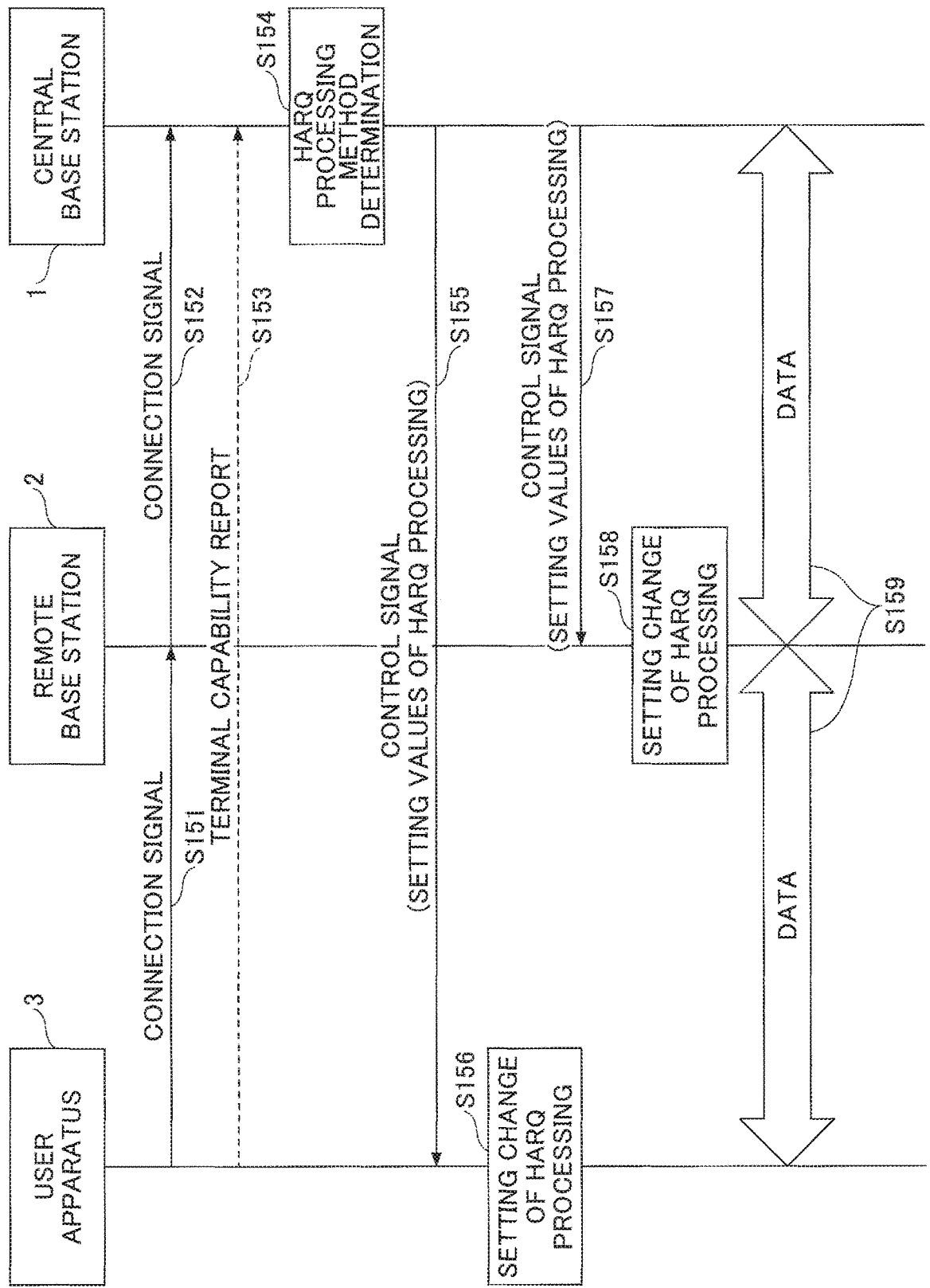
FIG. 6 is a drawing illustrating HARQ processing according to a first embodiment.

FIG. 6 is a sequence diagram illustrating HARQ processing according to the first embodiment. Referring to FIG. 6, processing steps will be described in which HARQ process settings are changed according to the transmission delay time between the central base station 1 and the remote base station 2.

In step S151 and step S152, the user apparatus 3 transmits a connection signal to the remote base station 2 in order to connect to the remote base station 2 and the central base station 1. The connection signal includes, for example, a series of signals used for a random access procedure for connecting to a mobile communication system according to the first embodiment. For example, the connection signal includes a random access preamble and an RRC connection request which are transmitted via a random access channel (RACH). It should be noted that, in processing steps of step S152, when the remote base station 2 transmits the RRC connection request received from the user apparatus 3 to the central base station 1, the remote base station 2 may transmit to the central base station 1 information for uniquely identifying the remote base station 2. The information for uniquely identifying the remote base station 2 may be, for example, an RRU identifier, an identifier of a cell under the RRU (CellIdentity, sCellIdentity), a carrier frequency, etc. According to the processing steps of step S152, the central base station 1 determines via which remote base station 2 the user apparatus 3 is connected.

In step S153, the user apparatus 3 may transmit to the central base station 1 a terminal capability reporting signal including capability information in order to report to the central base station 1 information indicating an upper limit of the number of HARQ processes the user apparatus 3 can handle, or indicating the upper limit of the RTT timer (hereinafter, referred to as "capability information"). The terminal capability reporting signal may be, for example, an RRC signal (e.g., UE capability information), a MAC signal, or a physical layer signal. Further, a specific UE category may be defined in advance between the central base station 1 and the user apparatus 3, and the specific UE category may be included in the capability information. In this case, the central base station 1 may determine the upper limit of the number of HARQ processes the user apparatus 3 can handle, or the upper limit of the HARQ RTT timer based on the specific UE category.

In step S154, the central base station 1 determines a HARQ processing method based on the transmission delay time between the central base station 1 and the remote base station 2. The central base station 1 may determine the HARQ processing method by, for example, adding the transmission delay time to a setting value of a conventional LTE HARQ RTT timer. Specifically, in the case where the transmission delay (RTT) is 8 ms, the central base station 1 may determine 8 ms+8 ms=16 ms as a HARQ RTT timer, and determine that the number of HARQ processes used for the HARQ processing is 16.

It should be noted that, in the case where the capability information of the user apparatus 3 has been obtained in the processing steps of step S153, the central base station 1 may determine the HARQ processing method within the upper limit of the number of the HARQ processes the user apparatus 3 can handle, or within the upper limit of the extensible HARQ RTT timer. Further, regarding the HARQ RTT timer, individual values for DL and UL may be set.

In step S155, the central base station 1 transmits a control signal to the user apparatus 3 in order to indicate the HARQ processing method to the user apparatus 3. The control signal includes the setting values (the number of HARQ processes and/or HARQ RTT timer) of the HARQ processing determined in the processing steps of step S154. The control signal may be, for example, an RRC signal (RRC connection reconfiguration, etc.) a MAC signal, or a physical layer signal.

In step S156, the user apparatus 3 changes HARQ processing settings based on the HARQ processing setting values received from the central base station 1. It should be noted that, in the case where only the HARQ RTT timer is transmitted from the central base station 1, the user apparatus 3 may read the value of the HARQ RTT timer as the number of HARQ processes. For example, in the case where the value of the HARQ RTT timer is 16 ms, the user apparatus may read 16 as the number of HARQ processes. Further, the user apparatus 3 may reset for a moment a soft buffer and various kinds of timer values used for the HARQ processing in processing steps of step S156. Further, the user apparatus 3 may divide again the soft buffer according to the number of HARQ processes after the setting change in processing steps of step S156.

In step S157, the central base station 1 transmits a control signal to the remote base station 2 in order to indicate the HARQ processing method to the remote base station 2. The control signal includes the setting values (the number of HARQ processes and/or HARQ RTT timer) of the HARQ processing determined in the processing steps of step S154. The control signal is, for example, a signal of transmission protocol defined between the remote base station 2 and the central base station 1.

In step S158, the remote base station 2 changes HARQ processing settings based on the HARQ processing setting values received from the central base station 1. It should be noted that, in the case where only the HARQ RTT timer is transmitted from the central base station 1, the remote base station 2 may read the value of the HARQ RTT timer as the number of HARQ processes. For example, in the case where the value of the HARQ RTT timer is 16 ms, the remote base station 2 may read 16 as the number of HARQ processes. Further, the remote base station 2 may reset for a moment a soft buffer and various kinds of timer values (HARQ RTT timer, etc.) used for the HARQ processing in processing steps of step S158. Further, the remote base station 2 may divide again the soft buffer according to the number of HARQ processes after the setting change in processing steps of step S158.

In step S159, data transmission and reception are performed among the user apparatus 3, the remote base station 2, and the central base station 1 by using the changed settings of the HARQ processing.

It should be noted that, in the case where a cell under the remote base station 2 is configured according to time division duplex (TDD), the central base station 1 may determine the HARQ processing method by taking into account a TDD Config in processing steps of step S154. For example, HARQ processing methods according to the transmission delay time (ACK/NACK transmission timing and the number of HARQ processes, etc., for each TDD Config) may be shared with the user apparatus 3 and the remote base station 2 beforehand, and the central base station 1 may transmits to the user apparatus 3 and the remote base station 2 information indicating which HARQ processing method is used in processing steps of step S155 and step S157. Further, as another method, the central base station 1 may simply transmit the transmission delay time to the user apparatus 3 and the remote base station 2 in processing steps of step S155 and step S157. In this case, the user apparatus 3 and the remote base station 2 may change the settings of the HARQ processing according to the HARQ processing method based on the predetermined logic.

Further, in the case where the transmission delay change is detected by periodically performing the processing steps illustrated in FIG. 5, the central base station 1 may update the setting values of the HARQ processing set in the remote base station 2 and the user apparatus 3 by performing again the processing steps of step S155 and step S157

Further, in the case where the HARQ processing is performed by the central base station 1 (in the case where only the layer 1 function is transferred to the remote base station 2), the processing steps of step S157 and step S158 are omitted.

<Functional Configuration>
(Central Base Station)

Figure 7:
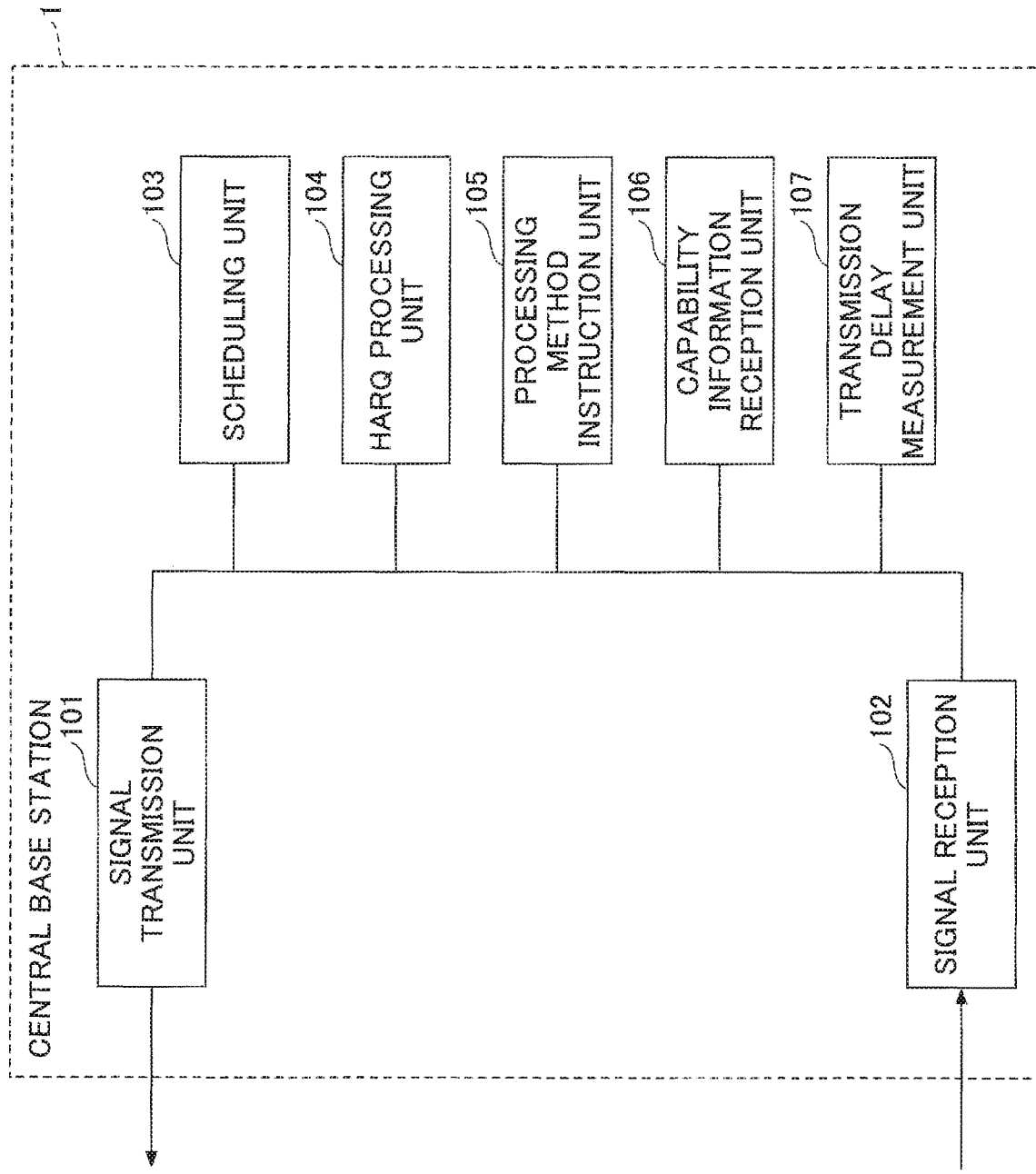
FIG. 7 is a drawing illustrating an example of a functional configuration of a central base station according to one or more embodiments.

FIG. 7 is a drawing illustrating an example of a functional configuration of a central base station 1 according to the first embodiment. As illustrated in FIG. 7, the central base station 1 includes a signal transmission unit 101, a signal reception unit 102, a scheduling unit 103, a HARQ processing unit 104, a processing method instruction unit 105, a capability information receiving unit 106, and a transmission delay measurement unit 107. It should be noted that FIG. 7 illustrates functional units of the central base station 1 especially related to the first embodiment only, and thus, the central base station 1 also includes at least functions for performing operations according to LTE (not shown in the figure). Further, a functional structure illustrated in FIG. 7 is only an example. Functional classification and names of functional units may be anything as long as operations related to one or more embodiments can be performed. It should be noted that the HARQ processing unit 104 may be included only in the case where the HARQ processing is performed by the central base station 1 (in the case where only the layer 1 function is transferred to the remote base station 2).

The signal transmission unit 101 includes a function for transmitting to the remote base station 2 various kinds of signals up to layer 2 generated from an upper layer signal which should be transmitted from the central base station 1. The signal reception unit 102 includes a function for receiving various kinds of signals from the remote base station 2, and obtaining upper layer signals from the received layer 2 signals.

The scheduling unit 103 includes a function for performing the HARQ processing. Specifically, the scheduling unit 103 performs processes including instructing the HARQ process of the remote base station 2 to transmit a MAC PDU, receiving an ACK/NACK from the remote base station 2, instruction of TB retransmission, etc. Further, the scheduling unit 103 performs allocating radio resources, etc., necessary for the remote base station 2 to transmit and receive a TB and an ACK/NACK. Further, the scheduling unit 103 performs allocating uplink radio resources, indicating a HARQ process ID of the HARQ process used in the HARQ processing of the remote base station 2, and generating a UL grant. Further, in the case where the HARQ processing is performed by the central base station 1, the scheduling unit 103 controls the HARQ processing unit 104 instead of controlling the HARQ processing of the remote base station 2.

The HARQ processing unit 104 performs HARQ processing with the user apparatus 3. The HARQ processing unit 104 generates a TB from a MAC PDU, and transmits the generated TB to the remote base station 2 by using a predetermined HARQ process. Further, the HARQ processing unit 104 performs TB retransmission based on the ACK/NACK received from the remote base station 2.

Further, the HARQ processing unit 104 may reset for a moment a soft buffer and various kinds of timer values (HARQ RTT timer, etc.) used for the HARQ processing in the case where the HARQ processing method is changed. Further, the HARQ processing unit 104 may divide again the soft buffer according to the number of HARQ processes after the setting change.

The processing method instruction unit 105 determines the HARQ processing setting values (the number of HARQ processes and/or HARQ RTT timer) based on the transmission delay time between the central base station 1 and the remote base station 2 measured by the transmission delay measurement unit 107. Further, the processing method instruction unit 105 transmits the determined HARQ processing setting values to the remote base station 2 and the user apparatus 3 via the signal transmission unit 101. Further, the processing method instruction unit 105 may determine the HARQ processing setting values within a range of capability information of the user apparatus 3.

The capability information receiving unit 106 receives the capability information from the user apparatus 3, associates the capability information with an identifier for uniquely identifying the user apparatus 3 (UEID, IMSI, radio network temporary ID (RNTI), etc.) and stores the associated result in a memory.

The transmission delay measurement unit 107 measures the transmission delay time between the central base station 1 and the remote base station 2, and stores the measurement result in the memory. It should be noted that the stored transmission delay time may be a round trip time (RTT), or one direction of the transmission delay time (that is, RTT/2).

(Remote Base Station)

Figure 8:
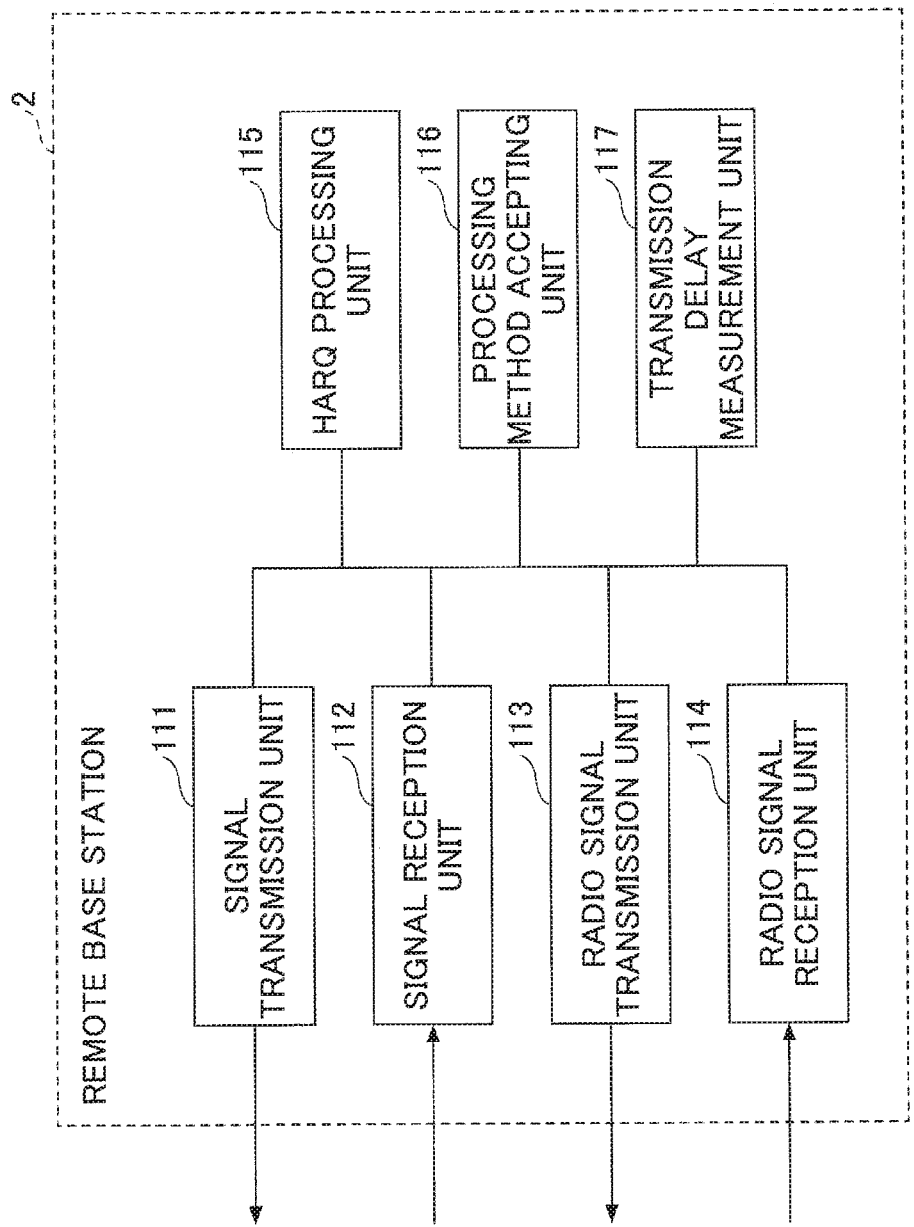
FIG. 8 is a drawing illustrating an example of a functional configuration of a remote base station according to one or more embodiments.

FIG. 8 is a drawing illustrating an example of a functional configuration of a remote base station 2 according to the first embodiment. As illustrated in FIG. 8, the remote base station 2 includes a signal transmission unit 111, a signal reception unit 112, a radio signal transmission unit 113, a radio signal reception unit 114, a HARQ processing unit 115, a processing method accepting unit 116, and a transmission delay measurement unit 117. It should be noted that FIG. 8 illustrates functional units of the remote base station 2 especially related to the first embodiment only, and thus, the remote base station 2 also includes at least functions for performing operations according to LTE (not shown in the figure). Further, a functional structure illustrated in FIG. 8 is only an example. Functional classification and names of functional units may be anything as long as operations related to one or more embodiments can be performed.

It should be noted that the HARQ processing unit 115 may not be included in the remote base station 2 in the case where the HARQ processing is performed by the central base station 1 (in the case where only the layer 1 function is transferred to the remote base station 2).

The signal transmission unit 111 includes a function for generating a layer 1 signal to be transmitted to the central base station 1 from a radio signal received from the radio signal reception unit 114, and transmitting the generated signal to the central base station 1. The signal reception unit 112 includes a function for generating a layer 1 signal from a signal received from the central base station 1, and transmitting the generated signal to the radio signal transmission unit 113. The radio signal transmission unit 113 transmits the layer 1 signal received from the signal reception unit 112 to the user apparatus 3 by using a radio signal. The radio signal reception unit 114 transmits the radio signal received from the user apparatus 3 to the signal transmission unit 111.

The HARQ processing unit 115 performs HARQ processing with the user apparatus 3 based on the instruction from the central base station 1. The HARQ processing unit 115 generates a TB from a MAC PDU received from the central base station 1, and transmits the generated TB to the user apparatus 3 by using a predetermined HARQ process. Further, the HARQ processing unit 115 transmits an ACK/NACK received from the user apparatus 3 to the central base station 1. Further, the HARQ processing unit 115 receives a TB retransmission instruction from the central base station 1, and retransmits the TB of redundancy version (RV) specified by the retransmission instruction. Further, the HARQ processing unit 115 receives an instruction from the processing method accepting unit 116, and changes the HARQ processing method. Further, the HARQ processing unit 115 may reset for a moment a soft buffer and various kinds of timer values (HARQ RTT timer, etc.) used for the HARQ processing in the case where the HARQ processing method is changed. Further, the HARQ processing unit 115 may divide again the soft buffer according to the number of HARQ processes after the setting change.

The processing method accepting unit 116 receives HARQ processing setting values (the number of HARQ processes and/or HARQ RTT timer) from the central base station 1. Further, the processing method accepting unit 116 instructs the HARQ processing unit 115 to perform the HARQ processing based on the received HARQ processing setting values. The transmission delay measurement unit 107 receives a delay measurement signal from the central base station 1, and transmits a delay measurement response signal to the central base station 1. The transmission delay measurement unit 107 may add a predetermined time stamp to the delay measurement response signal, and transmit the added result.

(User Apparatus)

Figure 9:
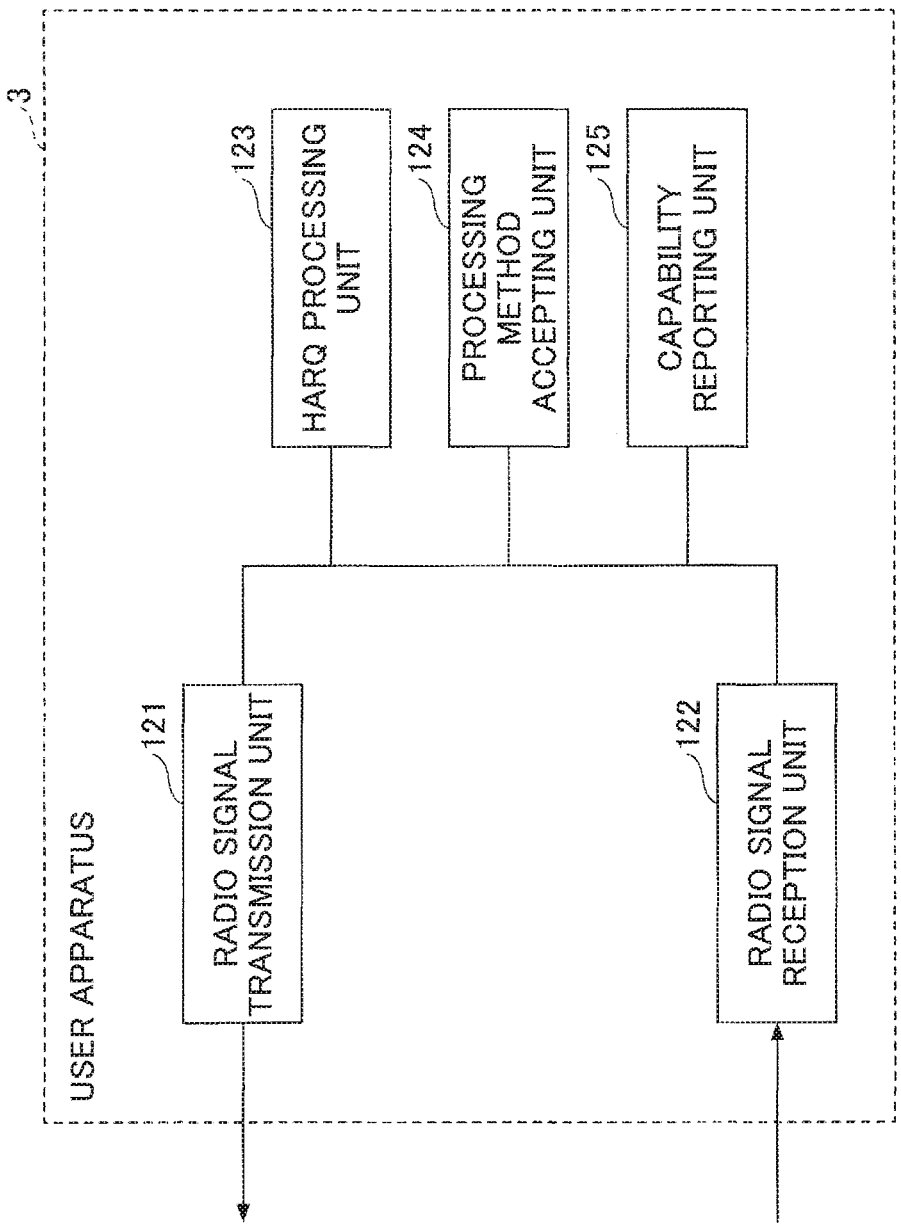
FIG. 9 is a drawing illustrating an example of a functional configuration of a user apparatus according to one or more embodiments.

FIG. 9 is a drawing illustrating an example of a functional configuration of a user apparatus 3 according to the first embodiment. As illustrated in FIG. 9, the user apparatus 3 includes a radio signal transmission unit 121, a radio signal reception unit 122, a HARQ processing unit 123, a processing method accepting unit 124, and a capability reporting unit 125. It should be noted that FIG. 9 illustrates functional units of the user apparatus 3 especially related to the first embodiment only, and thus, the user apparatus 3 further includes at least functions for performing operations according to LTE (not shown in the figure). Further, a functional structure illustrated in FIG. 9 is only an example. Functional classification and names of functional units may be anything as long as operations related to one or more embodiments can be performed.

The radio signal transmission unit 121 includes a function for generating, from an upper layer signal which should be transmitted from the user apparatus 3, various kinds of physical layer signals and wirelessly transmitting the generated signals. The radio signal reception unit 122 includes a function for wirelessly receiving various kinds of signals from the remote base station 2, and obtaining upper layer signals from the received physical layer signals.

The HARQ processing unit 123 performs HARQ processing with the remote base station 2 or the central base station 1 based on the instruction from the central base station 1. Further, The HARQ processing unit 123 receives an instruction from the processing method accepting unit 124, and changes the HARQ processing method. Further, the HARQ processing unit 123 may reset for a moment a soft buffer and various kinds of timer values used for the HARQ processing in the case where the HARQ processing method is changed. Further, the HARQ processing unit 123 may divide again the soft buffer according to the number of HARQ processes after the setting change.

The processing method accepting unit 124 receives (obtains) HARQ processing setting values (the number of HARQ processes and/or HARQ RTT timer) from the central base station 1. Further, the processing method accepting unit 116 instructs the HARQ processing unit 123 to perform the HARQ processing based on the received HARQ processing setting values.

The capability reporting unit 125 transmits capability information of the user apparatus 3 to the central base station 1.

<Summary>

As described above, according to the first embodiment, a user apparatus in a mobile communication system is provided. The mobile communication system includes a first base station, a second base station communicating with the first base station, and the user apparatus communicating with the first base station. The user apparatus includes an obtaining unit configured to obtain from the second base station indication information which indicates an error correction operation performed between the first base station and the user apparatus; and a communication unit configured to communicate with the first base station by performing the error correction processing based on the indication information. According to the user apparatus, in a mobile communication system based on a C-RAN, it is possible to reduce an impact on the user data throughput even in the case where the transmission delay between the base station and the remote base station is big.

Further, the indication information may include the number of processes used for the error correction processing. With the above arrangement, the number of HARQ processes used for the error correction processing operation can be enhanced, the number of transport blocks which can be transmitted and received simultaneously is increased, and the throughput can be improved.

Further, the communication unit may clear the buffer used for the error correction processing in the case where the indication information is received from the second base station. With the above arrangement, in the case where the HARQ processing method is changed, it is possible to prevent a malfunction due to old remaining transport blocks in the buffer.

Further, according to the first embodiment, a base station used as a second base station in a mobile communication system is provided. The mobile communication system includes a first base station, the second base station communicating with the first base station, and a user apparatus communicating with the first base station. The base station includes an indication unit configured to determine indication information indicating operations for an error correction process performed between the first base station and the user apparatus; and a reporting unit configured to transmit the indication information to the first base station and the user apparatus. According to the central base station, in a mobile communication system based on a C-RAN, it is possible to reduce an impact on the user data throughput even in the case where the transmission delay between the base station and the remote base station is big.

Further, the base station may have a measurement unit for measuring the transmission delay time, and the measurement unit may measure the transmission delay time based on the time when a delay measurement signal is transmitted to the first base station and the time when a response signal for the delay measurement signal is received from the first base station. With the above arrangement, it is possible to measure an accurate transmission delay time between the central base station 1 and the remote base station 2.

Further, the measurement unit may detect that the transmission delay time has changed by measuring the transmission delay time at a predetermined interval. In the case where it is detected that the transmission delay time has changed, the indication unit may update the indication information based on the changed transmission delay time, and the reporting unit may transmit the updated indication information to the first base station and the user apparatus. With the above arrangement, even in the case where the transmission delay time between the central base station 1 and the remote base station 2 changes, it is possible to optimize the number of processes used for the HARQ processing and to improve the throughput.

Further, the "unit" included in the above apparatuses may be substituted for by "means", "circuit", "device", etc.

Second Embodiment

<Process Overview>

In a mobile communication system according to a second embodiment, it is assumed that the transmission delay time occurs between the central base station 1 and the remote base station 2, and retransmission processing in the HARQ processing is performed by the remote base station 2. With the above arrangement, it is possible to avoid decreased throughput of user data transmitted and received between the central base station 1 and the user apparatus 3, and it is possible to reduce the impact on the transmission delay of the user data by reducing the time required for the retransmission processing of the HARQ processing to almost the same time as the conventional LTE.

In the second embodiment, it is assumed that the layer 1 function and the HARQ processing function, of the functions included in the central base station 1, have been transferred to the remote base station 2. More specifically, it is assumed that scheduling operations such as indicating MAC PDU transmission and allocating radio resources are performed by the central base station 1, and that the HARQ processing, in which a TB is generated from a MAC PDU by a MAC entity, and the TB retransmission processing are performed by the remote base station 2.

Figure 10A:
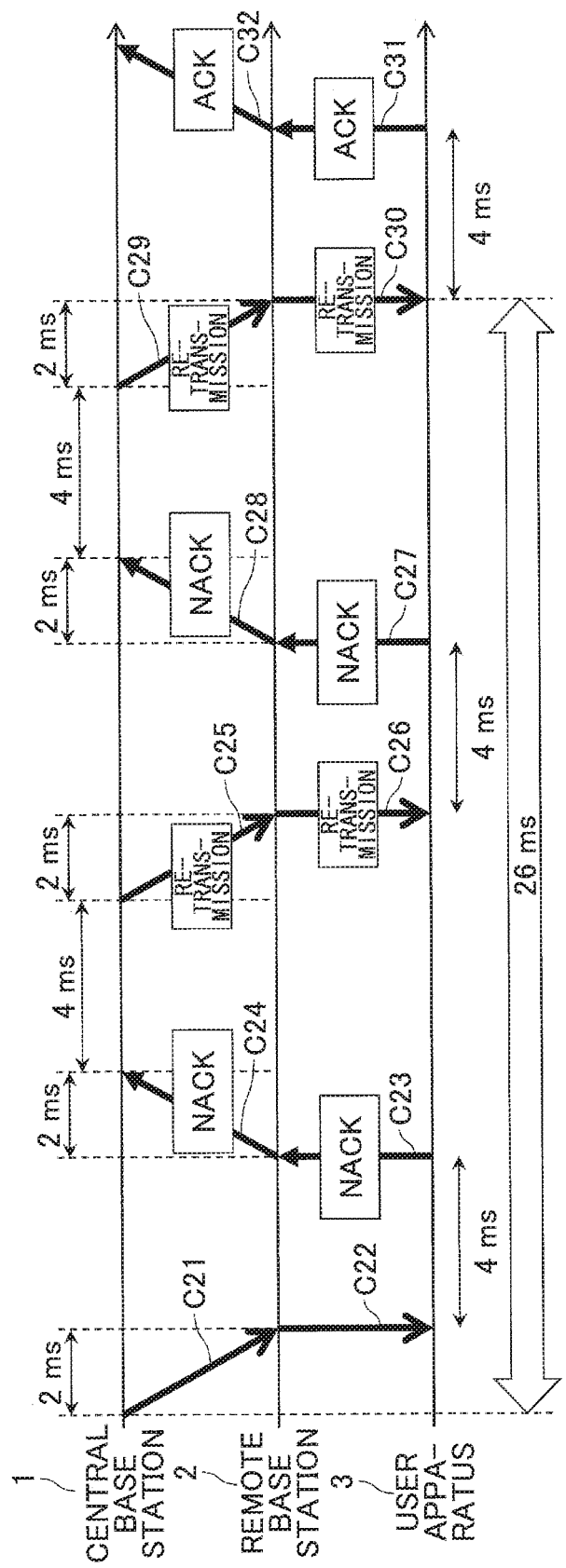
FIG. 10A is a drawing illustrating an overview of a process according to a second embodiment.

FIG. 10A and FIG. 10B are drawings illustrating an overview of a process according to the second embodiment. FIG. 10A illustrates an operation example in the case where conventional LTE HARQ processing is applied to a mobile communication system according to one or more embodiments. It should be noted that, in FIG. 10A, it is assumed that the HARQ RTT timer is 8 ms. Further, it is assumed that the transmission delay between the central base station 1 and the remote base station 2 is 2 ms.

As illustrated in FIG. 10A, a MAC PDU (or TB) is transmitted from the central base station 1 (C21), and, after 2 ms, arrives at the remote base station 2. Further, the TB is transmitted from the remote base station 2 to the user apparatus 3 (C22). The user apparatus 3 decodes the received TB, transmits an ACK to the remote base station 2 in the case where the TB is decoded properly, and transmits a NACK to the remote base station 2 in the case where the TB is not decoded properly. Here, it is assumed that the NACK has been transmitted from the user apparatus 3 to the remote base station 2 (C23). The NACK is transmitted from the remote base station 2 to the central base station 1 (C24), and, after 2 ms, arrives at the central base station 1. Because the HARQ RTT timer is 8 ms, the central base station 1 retransmits the TB at least 4 ms after the ACK/NACK is received (C25).

The retransmitted TB arrives at the remote base station 2 after 2 ms. Further, the retransmitted TB is transmitted from the remote base station 2 to the user apparatus 3 (C26). The user apparatus 3 performs decoding by using the received retransmitted TB (C26) and the received TB (C22), transmits an ACK to the remote base station 2 in the case where the TB is decoded properly, and transmits a NACK to the remote base station 2 in the case where the TB is not decoded properly. Here, it is assumed that the NACK has been transmitted from the user apparatus 3 to the remote base station 2 (C27). Afterwards, the similar steps will be performed (C28 through C30). The user apparatus 3 performs decoding by using the received TB (C30), the received TB (C22), and the received TB (C26), transmits an ACK to the remote base station 2 in the case where the TB is decoded properly, and transmits a NACK to the remote base station 2 in the case where the TB is not decoded properly. Here, it is assumed that the ACK has been transmitted from the user apparatus 3 to the remote base station 2 (C31).

Here, 26 ms is required from when the first MAC PDU has been transmitted from the central base station 1 (C21), to when the TB has been retransmitted twice and the TB is properly decoded by the user apparatus 3 (C30). In other words, in the case where TB retransmission is performed, more time equal to the transmission delay time amount between the central base station 1 and the remote base station 2 is required for processing TB retransmission. In other words, the user data transmission delay occurs, which leads to degradation of the user data throughput.

Therefore, in the second embodiment, the retransmission processing of the HARQ processing is performed by the remote base station 2. Further, in the conventional LTE retransmission processing, it is possible to retransmit a TB any time equal to or greater than 4 ms after the NACK reception. However, according to the second embodiment, the remote base station 2 must retransmit the TB exactly 4 ms after the NACK reception (performs so-called synchronized HARQ control).

FIG. 10B illustrates an operation example in the case where the retransmission processing of the HARQ processing is performed by the remote base station 2. As illustrated in FIG. 10B, the time required from when the first MAC PDU has been transmitted from the central base station 1 (C41) to when the TBs have been retransmitted twice, and the TB is decoded properly by the user apparatus 3 (C46) is reduced to 18 ms. Compared with the conventional LTE, the time is required for the processing from when the first MAC PDU has been transmitted from the central base station 1 to when the first MAC PDU arrives at the remote base station 2, but other processing of the TB retransmission requires about the same time as the conventional LTE. In other words, the time required for the TB retransmission processing is reduced to almost the same time as the conventional LTE. As a result, it is possible to avoid the decreased user data throughput.

<Processing Steps>

(HARQ Processing)

FIG. 11 is a sequence diagram illustrating the HARQ processing according to the second embodiment. Referring to FIG. 11, processing steps will be described in which the HARQ retransmission processing is performed directly between the remote base station 2 and the user apparatus 3 based on an instruction from the central base station 1.

In step S201, the central base station 1 transmits a transmission instruction signal. The transmission instruction signal is, for example, a transmission protocol signal defined between the central base station 1 and the remote base station 2. The transmission instruction signal includes various types of information items necessary for the TB transmission (hereinafter, referred to as "transmission resource information") in addition to a MAC PDU to be transmitted to the user apparatus 3. The transmission resource information includes, for example, resource information of a physical downlink shared channel (PDSCH) to which the TB is mapped, information set in a physical downlink control channel (PDCCH) (information related to downlink control information (DCI), etc.) an identifier of the user apparatus 3 (RNTI, etc.) and an identifier identifying a cell under the remote base station 2 (CellIndex, etc.) It should be noted that the information set in a PDCCH (DCI) includes a HARQ process ID.

Further, the transmission instruction signal may further include various types of information items necessary for TB retransmission (hereinafter, referred to as "retransmission resource information"). The retransmission resource information includes, for example, resource information of a PDSCH to which the TB is mapped, and information set in the PDCCH (information related to DCI, etc.) So-called adaptive retransmission is available by including the retransmission resource information in the transmission instruction signal. The adaptive retransmission is a method in which TB retransmission is performed by changing the radio resources used for TB retransmission different from the radio resources used for the first TB transmission. Further, the transmission instruction signal may include the number of retransmissions as an upper limit number allowed for the TB retransmission.

Further, the transmission instruction signal may not include the retransmission resource information. In this case, so-called non-adaptive retransmission is performed. The non-adaptive retransmission is a HARQ processing method in which the same radio resources as the first TB transmission are used for the TB retransmission.

In step S202, the remote base station 2 transmits a TB to the user apparatus 3. The user apparatus 3 decodes the received TB. The user apparatus 3 transmits an ACK to the remote base station 2 in the case where the TB is decoded properly, and transmits a NACK to the remote base station 2 in the case where the TB is not decoded properly. Here, it is assumed that the user apparatus 3 has failed to decode the TB properly.

In step S203, the user apparatus 3 transmits a NACK to the remote base station 2. The NACK is transmitted to the remote base station 2 by using a physical uplink control channel (PUCCH) or a physical uplink shared channel (PUSCH).

In step S204, the remote base station 2 retransmits the TB 4 ms after the NACK is received in step S203. In the case where the retransmission resource information is received in step S201, the remote base station 2 retransmits the TB by using the radio resources specified by the retransmission resource information. Further, in the case where the retransmission resource information is not received in step S201, the remote base station 2 retransmits the TB by using the same radio resources as the radio resources used for the TB transmission in step S202.

In step S205 and step S206, the similar processes as in step S203 and step S204 will be repeated if necessary.

In step S207, in the case where the TB is decoded properly, the user apparatus 3 transmits an ACK to the remote base station 2.

In step S208, the remote base station 2 transmits an ACK report to the central base station 1. In the ACK report, a HARQ process ID of a HARQ process used in the processing steps of step S202 through step S206 is included. By receiving the ACK report, it is possible for the central base station 1 to determine that the TB transmission is completed by the process of the HARQ process ID included in the ACK report.

In step S209, the central base station 1 transmits a transmission instruction signal to the remote base station 2 in order to transmit a new MAC PDU to the user apparatus 3. In the transmission resource information included in the transmission instruction signal in the processing steps of step S209, the HARQ process ID reported in step S208 is specified.

(Interrupt Processing)

According to the processing steps illustrated in FIG. 11, HARQ retransmission processing is performed by the remote base station 2. Therefore, in the second embodiment, in the case where it is necessary to transmit a high-priority MAC PDU to the user apparatus 3, it is possible for the central base station 1 to interrupt the retransmission processing being performed by the remote base station 2, and to transmit a new MAC PDU to the user apparatus 3.

Figure 12:
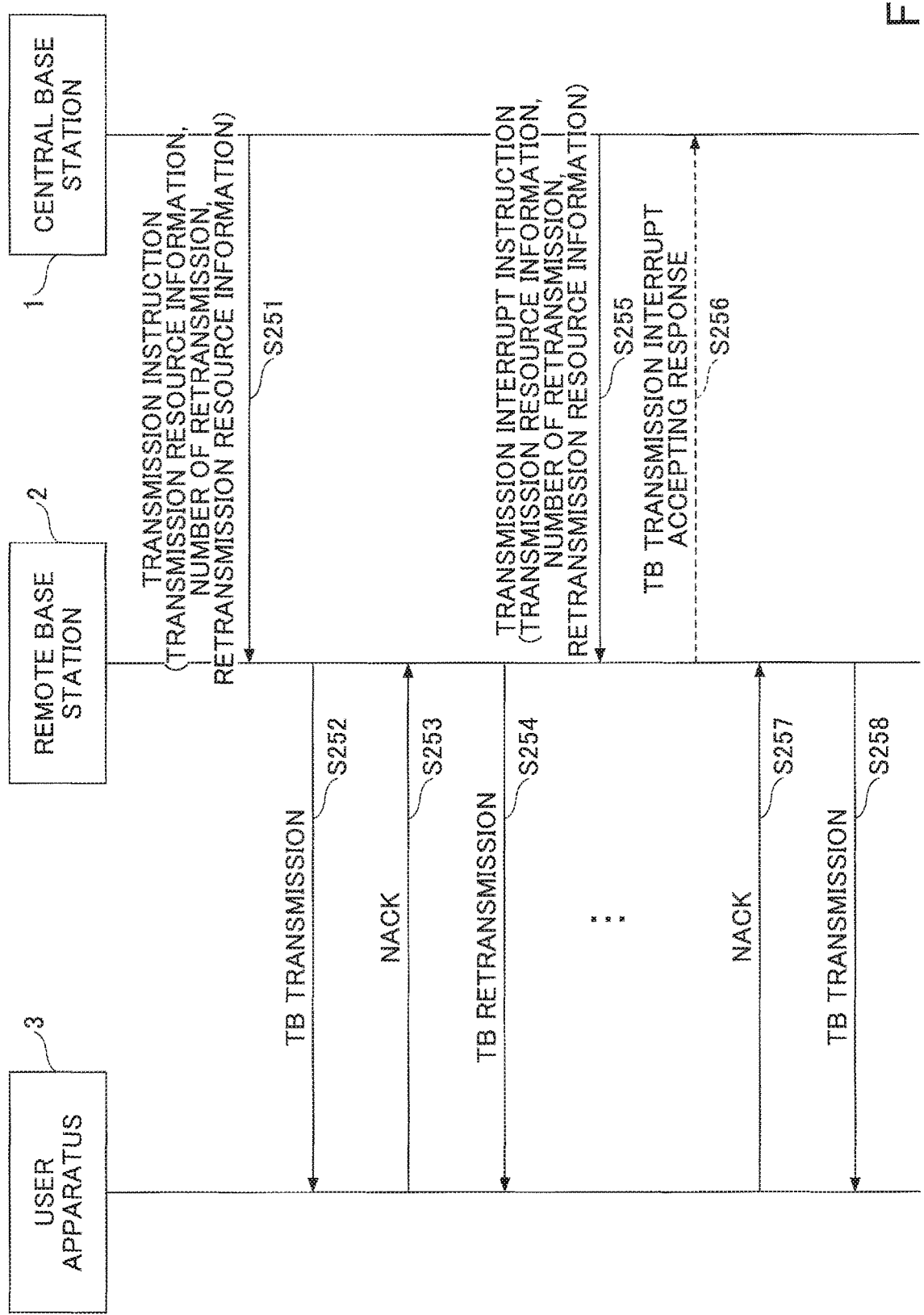
FIG. 12 is a drawing illustrating interrupt processing according to a second embodiment.

FIG. 12 is a sequence diagram illustrating interrupt processing according to the second embodiment.

The processing steps of step S251 through step S254 are the same as those of step S201 through step S204 of FIG. 11, respectively, and thus, the description is omitted.

In step S255, the central base station 1 transmits a transmission interrupt instruction signal to the remote base station 2. The transmission interrupt instruction signal is, for example, a transmission protocol protocol signal defined between the central base station 1 and the remote base station 2. The transmission interrupt instruction signal includes a new MAC PDU to be transmitted to the user apparatus 3, and a HARQ process ID of a HARQ process whose retransmission processing should be interrupted (stopped). Further, the transmission interrupt instruction signal may include transmission resource information. Further, the transmission interrupt instruction signal may include the number of retransmissions and retransmission resource information. It should be noted that the central base station 1 may transmit the transmission interrupt instruction signal at any timing.

Further, the central base station 1 may take into account the transmission delay time between the remote base station 2 and the central base station 1, and transmit the transmission interrupt instruction signal in accordance with the timing when the HARQ process, whose retransmission processing should be interrupted, performs the TB retransmission (step S254 in an example of FIG. 12). In this case, it is not necessary for the transmission interrupt instruction signal to include the HARQ process ID of the HARQ process whose retransmission processing should be interrupted. The remote base station 2 determines the HARQ process ID of the HARQ process whose retransmission process should be stopped based on the timing when the transmission interrupt instruction signal is received.

In step S256, the remote base station 2 may transmit a TB transmission interrupt accepting response signal to the central base station 1 in order to report to the central base station 1 that the transmission interrupt instruction signal has been received.

In step S257, the user apparatus 3 transmits a NACK to the remote base station 2.

In step S258, the remote base station 2 generates a TB from a MAC PDU received from the central base station 1 in processing steps of step S255, and transmits the generated TB to the user apparatus 3.

<Functional Configuration>

(Central Base Station)

Figure 13:
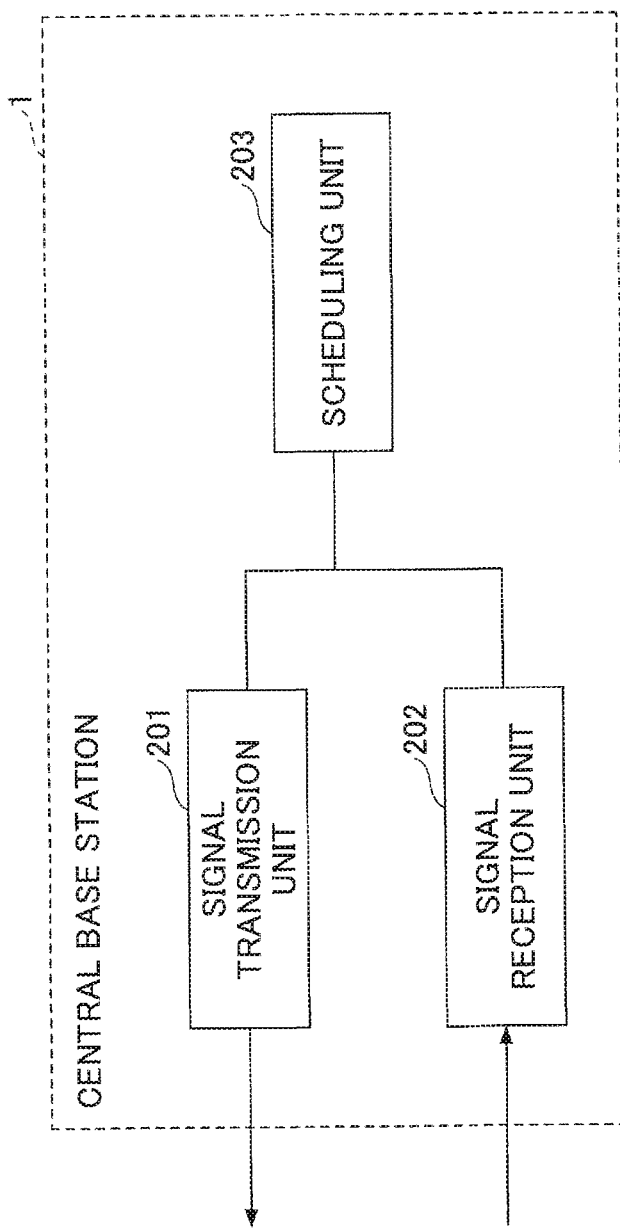
FIG. 13 is a drawing illustrating an example of a functional configuration of a central base station according to a second embodiment.

FIG. 13 is a drawing illustrating an example of a functional configuration of a central base station 1 according to the second embodiment. As illustrated in FIG. 13, the central base station 1 includes a signal transmission unit 201, a signal reception unit 202, and a scheduling unit 203. It should be noted that FIG. 13 illustrates functional units of the central base station 1 especially related to the second embodiment only, and thus, the central base station 1 also includes at least functions for performing operations according to LTE (not shown in the figure). Further, a functional structure illustrated in FIG. 13 is only an example. Functional classification and names of functional units may be anything as long as operations related to one or more embodiments can be performed.

The signal transmission unit 201 includes a function for transmitting to the remote base station 2 various kinds of signals up to layer 2 generated from an upper layer signal which should be transmitted from the central base station 1. The signal reception unit 202 includes a function for receiving various kinds of signals from the remote base station 2, and obtaining upper layer signals from the received layer 2 signals.

The scheduling unit 203 includes a function for controlling HARQ processing performed by the remote base station 2, a function for allocating radio resources necessary for the remote base station 2 to transmit a TB and an ACK/NACK, etc. Specifically, the scheduling unit 203 includes a function for instructing a HARQ process of the remote base station 2 to transmit the MAC PDU, a function for generating transmission resource information, and a function for generating retransmission resource information. Further, the scheduling unit 203 includes a function for interrupting the HARQ retransmission processing performed by the remote base station 2, and instructing the remote base station 2 to transmit a new TB.

(Remote Base Station)

Figure 14:
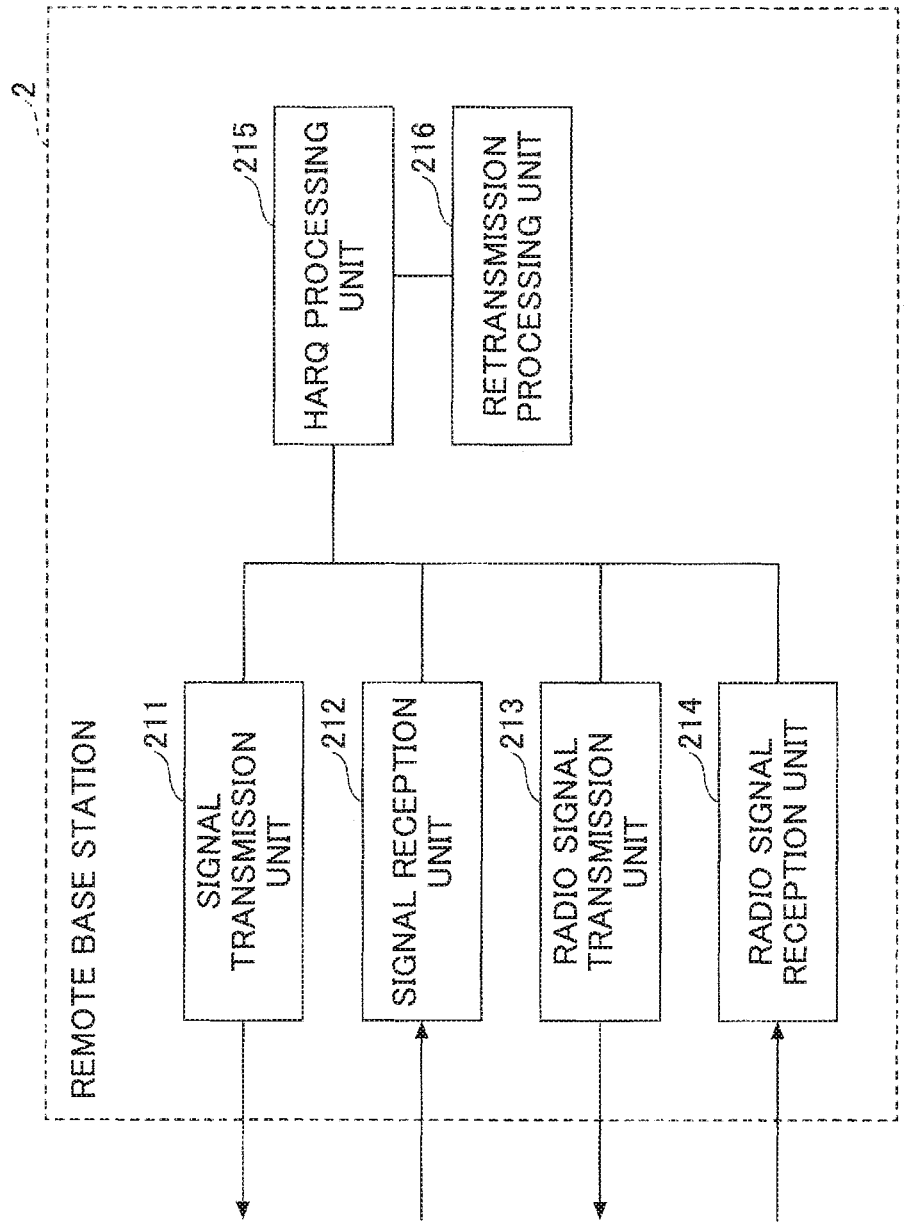
FIG. 14 is a drawing illustrating an example of a functional configuration of a remote base station according to a second embodiment.

FIG. 14 is a drawing illustrating an example of a functional configuration of a remote base station 2 according to the second embodiment. As illustrated in FIG. 14, the remote base station 2 includes a signal transmission unit 211, a signal reception unit 212, a radio signal transmission unit 213, a radio signal reception unit 214, a HARQ processing unit 215, and a retransmission processing unit 216. It should be noted that FIG. 14 illustrates functional units of the remote base station 2 especially related to the second embodiment only, and thus, the remote base station 2 also includes at least functions for performing operations according to LTE (not shown in the figure). Further, a functional structure illustrated in FIG. 14 is only an example. Functional classification and names of functional units may be anything as long as operations related to one or more embodiments can be performed.

The signal transmission unit 211 includes a function for generating a layer 1 signal to be transmitted to the central base station 1 from a radio signal received from the radio signal reception unit 214, and transmitting the generated signal to the central base station 1. The signal reception unit 212 includes a function for generating a layer 1 signal from a signal received from the central base station, and transmitting the generated signal to the radio signal transmission unit 213. The radio signal transmission unit 213 transmits the layer 1 signal received from the signal reception unit 212 to the user apparatus 3 by using a radio signal. The radio signal reception unit 214 transmits the radio signal received from the user apparatus 3 to the signal transmission unit 211.

Further, the signal reception unit 212 receives the transmission instruction signal from the central base station 1, and transmits to the HARQ processing unit 215 and the retransmission processing unit 216 the transmission resource information, the retransmission resource information, and the number of retransmissions included in the transmission instruction signal.

Further, the signal reception unit 212 receives the transmission interrupt instruction signal from the central base station 1, and transmits to the HARQ processing unit 215 and the retransmission processing unit 216 a new MAC PDU and the HARQ process ID included in the transmission interrupt instruction signal.

The HARQ processing unit 215 performs HARQ processing with the user apparatus 3 based on the instruction from the central base station 1. The HARQ processing unit 215 generates a TB from a MAC PDU received from the central base station 1, and transmits the TB to the user apparatus 3 by using the HARQ process and the radio resources specified by the central base station 1 according to the transmission resource information. Further, the HARQ processing unit 215 transmits an ACK received from the user apparatus 3 to the central base station 1.

Further, in the case where the transmission interrupt instruction signal is received from the central base station 1, the HARQ processing unit 215 generates a TB from a new MAC PDU included in the transmission interrupt instruction signal, and transmits the TB to the user apparatus 3.

In the case where a NACK is received from the user apparatus 3, the retransmission processing unit 216 generates a TB to be retransmitted, and retransmits the TB to the user apparatus 3 via the HARQ processing unit 215. Further, in the case where the number of retransmissions is specified by the central base station 1, the retransmission processing unit 216 performs retransmission processing within a range of the specified number. Further, in the case where radio resources to be used for the TB retransmission are specified by the central base station 1, the retransmission processing unit 216 instructs the HARQ processing unit 215 to perform retransmission processing by using the specified radio resources. Further, in the case where radio resources to be used for the TB retransmission are not specified by the central base station 1, the retransmission processing unit 216 instructs the HARQ processing unit 215 to perform retransmission processing by using the radio resources used for transmitting the TB for the first time.

Further, in the case where the transmission interrupt instruction signal is received from the central base station 1, the retransmission processing unit 216 instructs the HARQ processing unit 215 to stop the retransmission processing according to the HARQ process ID included in the transmission interrupt instruction signal.

(User Apparatus)

Figure 15:
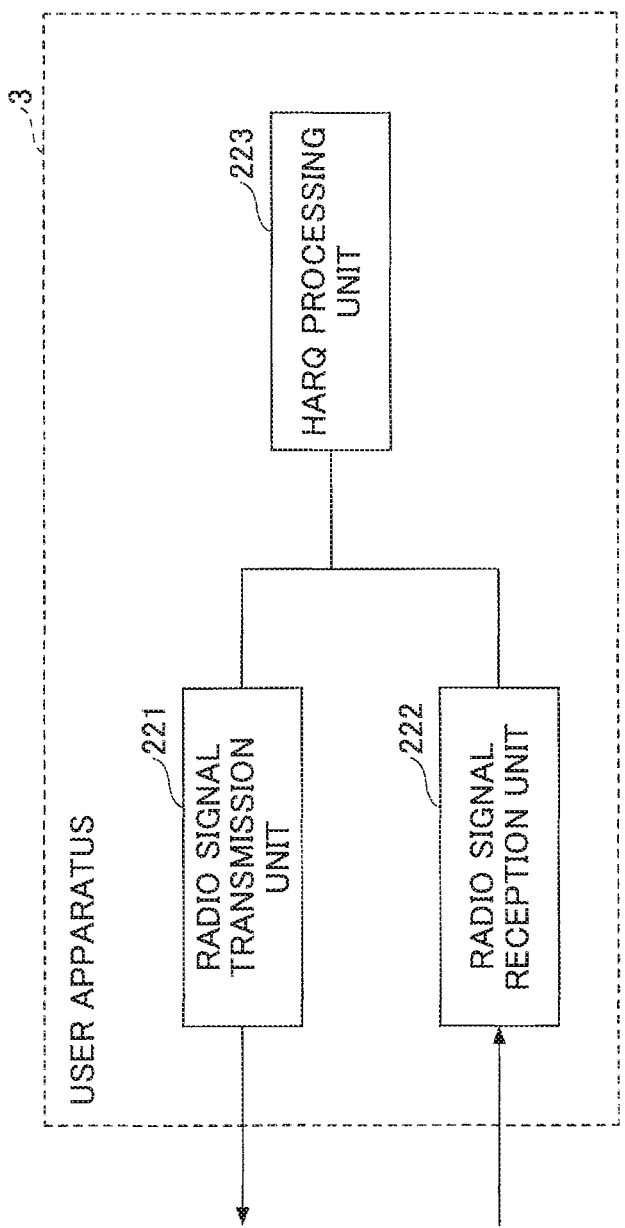
FIG. 15 is a drawing illustrating an example of a functional configuration of a user apparatus according to a second embodiment.

FIG. 15 is a drawing illustrating an example of a functional configuration of a user apparatus 3 according to the second embodiment. As illustrated in FIG. 15, the user apparatus 3 includes a radio signal transmission unit 221, a radio signal reception unit 222, and a HARQ processing unit 223. It should be noted that FIG. 15 illustrates functional units of the user apparatus 3 especially related to the second embodiment only, and thus, the user apparatus 3 further includes at least functions for performing operations according to LTE (not shown in the figure). Further, a functional structure illustrated in FIG. 15 is only an example. Functional classification and names of functional units may be anything as long as operations related to one or more embodiments can be performed.

The radio signal transmission unit 221 includes a function for generating various kinds of physical layer signals from an upper layer signal which should be transmitted from the user apparatus 3 and wirelessly transmitting the generated signals. The radio signal reception unit 222 includes a function for wirelessly receiving various kinds of signals from the remote base station 2, and obtaining upper layer signals from the received physical layer signals. The HARQ processing unit 223 performs HARQ processing with the remote base station 2.

<Summary>

As described above, according to the second embodiment, a base station is provided. The base station is used as a first base station in a mobile communication system which includes the first base station, a second base station communicating with the first base station, and a user apparatus communicating with the first base station. The base station includes an obtaining unit configured to obtain from the second base station data to be transmitted to the user apparatus and resource information indicating radio resources used for transmitting the data to the user apparatus; and a communication unit configured to perform error correction processing with the user apparatus and transmit the data to the user apparatus by using the radio resources indicated by the resource information. With the above base station as a remote base station 2, in a mobile communication system based on a C-RAN, it is possible to reduce an impact on the user data throughput even in the case where the transmission delay between the base station and the remote base station is big.

Further, in the case where a negative acknowledgment is received from the user apparatus, the communication unit may transmit to the user apparatus retransmission data in the error correction processing by using the radio resources indicated by the resource information. With the above arrangement, it is not necessary for the remote base station 2 to transmit a radio resource allocation request to the central base station 1 every time the user apparatus 3 transmits the retransmission data, and thus, it is possible for the remote base station 2 to efficiently transmit the retransmission data in the HARQ processing.

Further, the resource information may include information indicating radio resources used for transmitting the retransmission data in the error correction processing to the user apparatus. With the above arrangement, it is possible to use radio resources different from the radio resources used for transmitting the TB for the first time in the case of transmitting the retransmission data in the HARQ processing to the user apparatus, and thus, it is possible to allow the central base station 1 to perform flexible scheduling processing.

Further, the obtaining unit may obtain from the second base station second data to be transmitted to the user apparatus, and, in the case where a negative acknowledgment is received from the user apparatus, the communication unit may transmit to the user apparatus the second data instead of the retransmission data. With the above arrangement, it is possible to transmit data with higher priority to the user apparatus even in the case where the HARQ retransmission processing is being performed by the remote base station.

Further, the "unit" included in the above apparatuses may be substituted by "means", "circuit", "device", etc.

Third Embodiment

In a mobile communication system according to a third embodiment, it is assumed that the fluctuations of the transmission delay time occur between the central base station 1 and the remote base station 2. It is possible for the central base station 1 to properly determine a process of which HARQ process ID is used for the HARQ processing by including the HARQ process ID in the transmission protocol defined between the central base station 1 and the remote base station 2. With the above arrangement, it is possible for a mobile communication system according to the third embodiment to properly perform communications even in the case where fluctuations of the transmission delay time occur.

It should be noted that the third embodiment can be applied to a case where the layer 1 function, of the functions of the central base station 1, has been transferred to the remote base station 2, and a case where the layer 1 function and the HARQ processing function, of the functions of the central base station 1, have been transferred to the remote base station 2.

In the case where the layer 1 function and the HARQ processing function have been transferred to the remote base station 2, the scheduling operations including MAC PDU transmission instruction, radio resource allocation, etc., are performed by the central base station 1. Further, the remote base station 2 performs an operation related to generating a TB from a MAC PDU and transmitting the generated TB to the user apparatus, an operation related to retransmitting the TB, an operation related to generating a MAC PDU from a TB and transmitting the generated MAC PDU to the central base station 1, and an operation related to transmitting an ACK/NACK to the user apparatus 3.

<Process Overview (Downlink)>

Figure 16A:
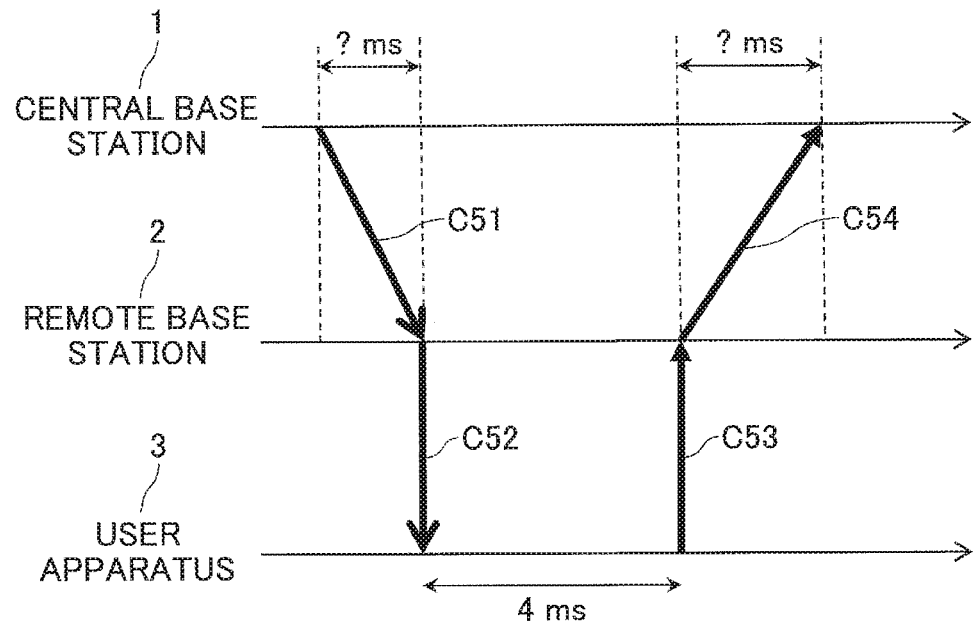
FIG. 16A is a drawing illustrating an overview of a process (downlink) according to a third embodiment.
Figure 16B:
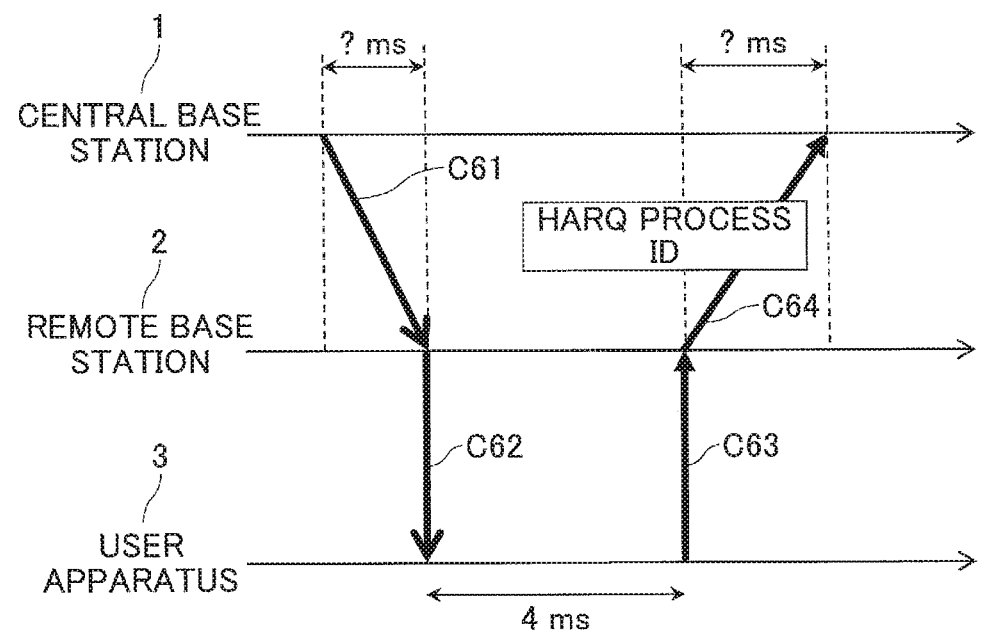
FIG. 16B is a drawing illustrating an overview of a process (downlink) according to a third embodiment.

FIG. 16A and FIG. 16B are drawings illustrating an overview of a process according to a third embodiment. FIG. 16A illustrates an operation example in the case where conventional LTE HARQ processing is applied to a mobile communication system according to one or more embodiments. It should be noted that, in FIG. 16A, it is assumed that fluctuations of transmission delay occur between the central base station 1 and the remote base station 2, and that the transmission delay is not constant.

As illustrated in FIG. 16A, a MAC PDU (or TB) is transmitted from the central base station 1 (C51), and, after a few ms, arrives at the remote base station 2. Further, the TB is transmitted from the remote base station 2 to the user apparatus 3 (C52). The user apparatus 3 decodes the received TB, transmits an ACK to the remote base station 2 in the case where the TB is decoded properly, and, after 4 ms, transmits a NACK to the remote base station 2 in the case where the TB is not decoded properly (C53). The ACK/NACK is transmitted from the remote base station 2 to the central base station 1 (C54), and, after a few ms, arrives at the central base station 1.

Here, the time is unknown, which time is from when the first MAC PDU (or the first TB) is transmitted from the central base station 1 (C51) to when the ACK/NACK arrives at the central base station 1 (C54). In the conventional LTE HARQ processing, an ACK/NACK is received 4 ms after the TB has been transmitted, and thus, it is possible for the central base station 1 to identify a process ID of the HARQ process from the ACK/NACK reception timing. However, in an example of FIG. 16A, an ACK/NACK is received at least more than 4 ms after the TB has been transmitted, and thus, it is not possible for the central base station 1 to identify the process ID of the HARQ process from the ACK/NACK reception timing.

In the case where a layer 1 function, of functions included in the central base station 1, is transferred to the remote base station 2 (that is, in the case where the central base station 1 performs the HARQ processing), it is not possible to determine the HARQ process ID, by the HARQ process of which HARQ process ID the ACK/NACK should be processed, and thus, the central base station 1 cannot properly perform the retransmission processing, etc.

Further, in the case where a layer 1 function and a HARQ processing function, of functions included in the central base station 1, are transferred to the remote base station 2, if it is not possible to determine the HARQ process ID, by the HARQ process of which HARQ process ID the ACK/NACK should be processed, then the central base station 1 cannot determine which MAC PDU has been successfully transmitted to the user apparatus 3.

Therefore, in a third embodiment, by including a HARQ process ID in the transmission protocol defined between the central base station 1 and the remote base station 2, it is possible for the central base station 1 to properly determine the HARQ process ID, a HARQ process of which HARQ process ID should be used for the HARQ processing.

FIG. 16B illustrates an operation example according to the third embodiment. C61 through C64 correspond to C51 through C54 of FIG. 16A, respectively. Referring to FIG. 16B, when an ACK/NACK is transmitted from the remote base station 2 to the central base station 1 (C64), a HARQ process ID is reported to the central base station 1. With the above arrangement, it is possible for the central base station 1 to properly determine the HARQ process ID, by the HARQ process of which HARQ process ID the ACK/NACK should be processed. Further, it is possible for the central base station 1 to determine which MAC PDU has been successfully transmitted to the user apparatus 3.

<Processing Steps>
(HARQ Processing (Downlink))

FIG. 17 is a sequence diagram illustrating a HARQ processing (downlink) according to a third embodiment. Referring to FIG. 17, processing steps for HARQ processing (downlink) will be described.

In step S301, the central base station 1 transmits a transmission instruction signal to the remote base station 2. The transmission instruction signal is, for example, a signal of transmission protocol defined between the central base station 1 and the remote base station 2. The transmission instruction signal includes, in addition to a MAC PDU (or a TB) to be transmitted to the user apparatus 3, various types of information items such as radio resources necessary for the TB transmission. The information items may be transmission resource information described in the second embodiment. It should be noted that a HARD process ID of a HARD process is included in the information items.

In step S302, the remote base station 2 transmits a TB to the user apparatus 3. It should be noted that, in the case where the remote base station 2 performs the HARQ processing, the remote base station 2 transmits the TB by using the HARQ process of the HARQ process ID included in the information items received in step S301. Further, the remote base station 2 transmits the TB to the user apparatus by using the radio resources indicated in the information items received in step S301.

Further, the user apparatus 3 decodes the received TB. The user apparatus 3 transmits an ACK to the remote base station 2 in the case where the TB is successfully decoded, and transmits a NACK to the remote base station 2 in the case where the TB is not successfully decoded.

In step S303, the user apparatus 3 transmits an ACK or a NACK to the remote base station 2. The ACK or NACK is transmitted to the remote base station 2 by using a PUCCH or a PUSCH.

In step S304, the remote base station 2 transmits an ACK/NACK reporting signal to the central base station 1. The ACK/NACK reporting signal is, for example, a signal of transmission protocol defined between the central base station 1 and the remote base station 2. The remote base station 2 includes the HARQ process ID in the ACK/NACK reporting signal, and transmits the ACK/NACK reporting signal to the central base station 1. It should be noted that the remote base station 2 may include the HARQ process ID in the header unit of the ACK/NACK reporting signal.

It should be noted that the remote base station 2 stores the HARQ process ID included in the various types of information items received in step S301, and includes the stored HARQ process ID in the ACK/NACK reporting signal. The remote base station 2 receives an ACK/NACK in step S303 4 ms after the remote base station 2 has transmitted the TB in step S302. Therefore, the remote base station 2 includes in the ACK/NACK reporting signal, for example, the HARQ process ID included in the transmission instruction signal corresponding to the TB transmitted 4 ms before.

It should be noted that, in the case where communications according to MIMO spatial multiplexing is being performed, two TBs are transmitted simultaneously in a predetermined subframe. In other words, the remote base station 2 receives from the user apparatus 3 two ACK/NACKs corresponding to the TBs in processing steps of step S304. In this case, the ACK/NACK reporting signal may include, for each of the ACK/NACKs, a codeword (and/or antenna port), a bearer ID of a RLC PDU included in a MAC PDU, a logical channel ID (LC-ID), a sequence number (SN) of the RLC PDU, a sequence number (SN) of a PDCP-PDU, and a MAC-control element (MAC-CE) type (e.g., logical channel ID (LCID) of the MAC-CE).

Further, in the case where communications according to CA is being performed, a TB is transmitted for each CC in a predetermined subframe. In other words, the remote base station 2 receives from the user apparatus 3 an ACK or a NACK for each CC in processing steps of step S304. In this case, the ACK/NACK reporting signal may include, for each of the ACK/NACKs, an identifier for uniquely identifying a CC (ServCellIndex, SCellIndex, a physical layer cell identity (PCI), carrier frequency, etc.)

In step S305, in the case where an ACK or a NACK cannot be received from the user apparatus 3 in processing steps of step S303 (in other words, in the case where an ACK or a NACK cannot be received 4 ms after the TB is transmitted in step S302), the remote base station 2 may transmit a discontinuous transmission (DTX) reporting signal to the central base station 1. In the DTX reporting signal, the HARQ process ID is included, the HARQ process of which HARQ process ID is supposed to receive an ACK or a NACK in processing steps of step S303.

It should be noted that the remote base station 2 stores the HARQ process ID included in the various types of information items received in step S301, and includes the stored HARQ process ID in the DTX reporting signal. The remote base station 2 can determine that the remote base station 2 is supposed to receive an ACK/NACK in step S303 4 ms after the remote base station 2 has transmitted the TB in step S302. Therefore, the remote base station 2 includes in the DTX reporting signal, for example, the HARQ process ID included in the transmission instruction signal corresponding to the TB transmitted 4 ms before.

HARQ Processing (Downlink) (Modified Example 1)

Figure 18:
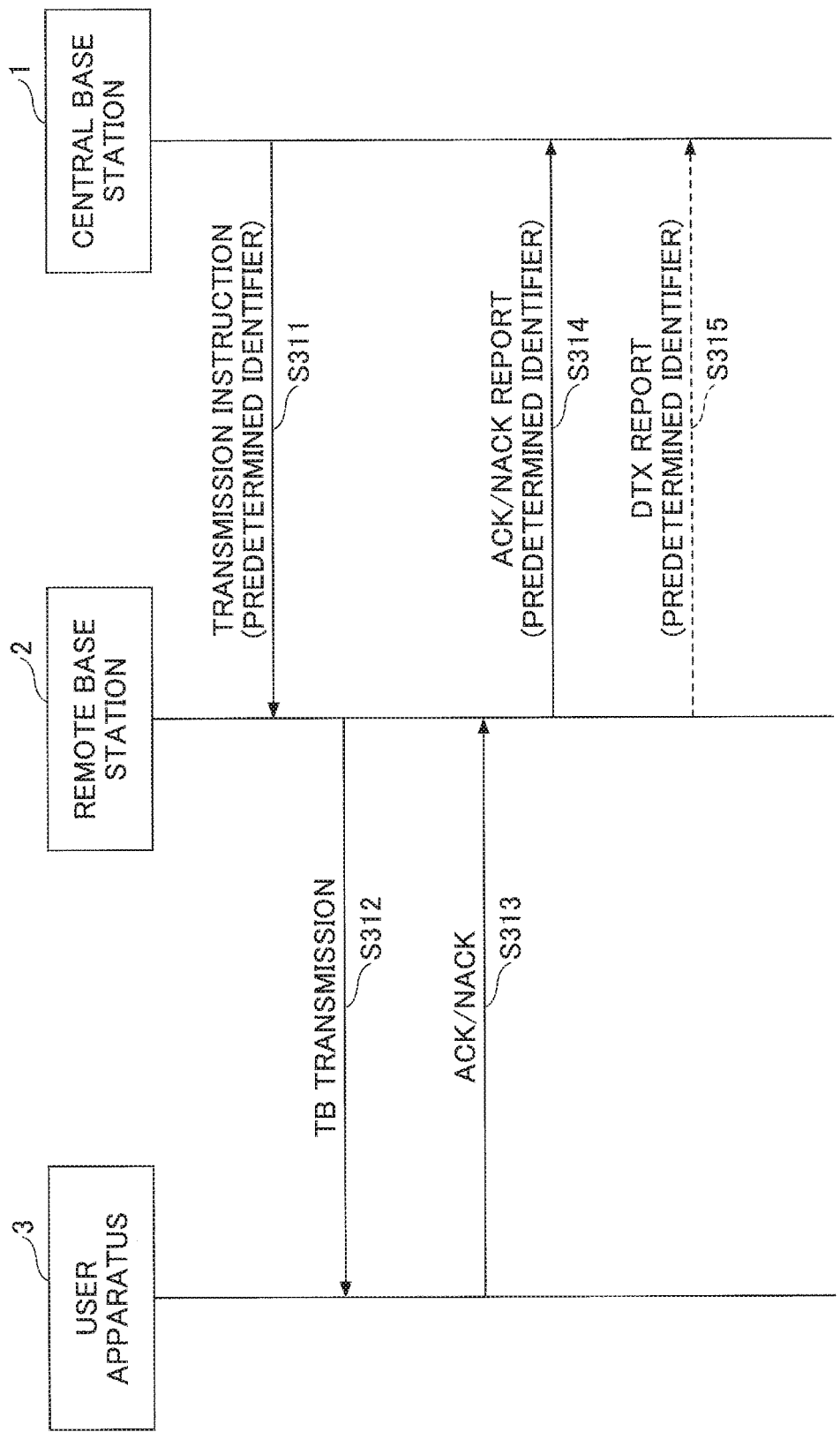
FIG. 18 is a sequence diagram illustrating HARQ processing (downlink) according to a third embodiment.

FIG. 18 is a sequence diagram illustrating HARQ processing (downlink)(modified example 1) according to a third embodiment. Referring to FIG. 18, processing steps for HARQ processing (downlink) (modified example 1) will be described. In the processing steps, different from processing steps of FIG. 17, the ACK/NACK reporting signal includes, instead of the HARQ process ID, an identifier used for identifying which transmission instruction signal the ACK/NACK reporting signal corresponds to. It should be noted that the things not specifically described are the same as those in FIG. 17.

In step S311, the central base station 1 transmits a transmission instruction signal to the remote base station 2. The transmission instruction signal includes a predetermined identifier for uniquely identifying the transmission instruction signal.

Step S312 and step S313 are the same as step S302 and step S303 of FIG. 17, respectively, and thus, the description is omitted.

In step S314, the remote base station 2 transmits an ACK/NACK reporting signal to the central base station 1. The remote base station 2 includes in the ACK/NACK reporting signal the predetermined identifier included in the transmission instruction signal received in processing steps of step S311, and transmits the ACK/NACK reporting signal to the central base station 1.

In step S315, in the case where the ACK or NACK cannot be received from the user apparatus 3 in processing steps of step S313 (in other words, in the case where an ACK or NACK cannot be received 4 ms after the TB is transmitted in step S312), the remote base station 2 may transmit a DTX reporting signal to the central base station 1. The remote base station 2 includes in the DTX reporting signal the predetermined identifier included in the transmission instruction signal received in processing steps of step S311, and transmits the DTX reporting signal to the central base station 1.

HARQ Processing (Downlink) (Modified Example 2)

Figure 19:
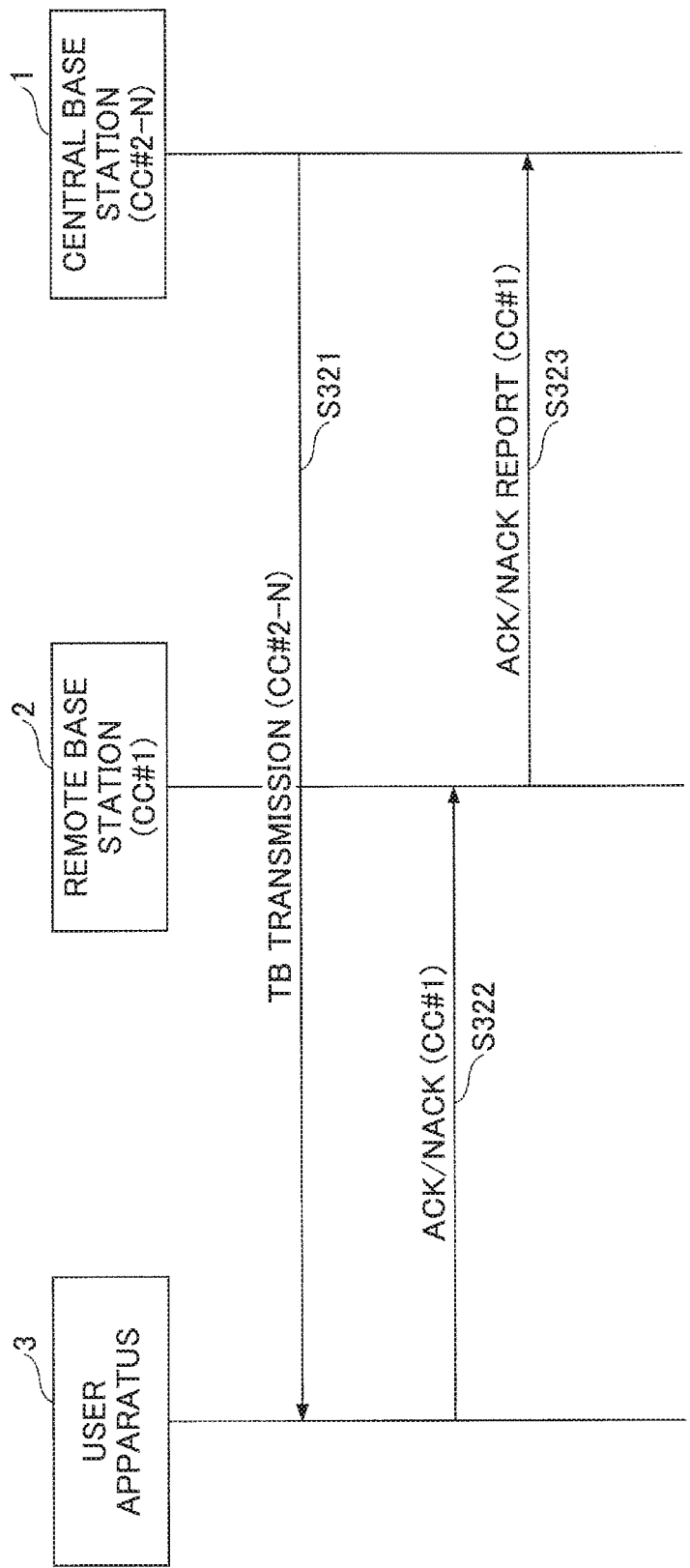
FIG. 19 is a sequence diagram illustrating HARQ processing (downlink) (modified example 2) according to a third embodiment.

FIG. 19 is a sequence diagram illustrating HARQ processing (downlink)(modified example 2) according to a third embodiment. Referring to FIG. 19, processing steps for HARQ processing (downlink) (modified example 2) will be described. It should be noted that the processing steps will be applied to only a case where a layer 1 function, of the functions included in the central base station 1, has been transferred to the remote base station 2 (that is, a case where the central base station 1 performs the HARQ processing).

In the processing steps, it is assumed that communications according to CA are performed. In the processing steps, the central base station 1 transmits the transmission instruction signal not to the remote base station 2, but directly to the user apparatus 3 via a CC under the central base station 1.

In general, in mobile communications, a downlink traffic amount is greater than an uplink traffic amount. As a result, it is expected that the transmission delay and the fluctuations of the transmission delay occur mainly in downlink. Therefore, by transmitting the transmission instruction signal of great amount of data directly to the user apparatus 3 via a CC under the central base station 1, the impact, due to the fluctuations of the transmission delay between the central base station 1 and the remote base station 2, is reduced as much as possible.

It should be noted that, in FIG. 19, it is assumed that CC #1 exists under the remote base station 2, and CC #2 through CC #N exist under the central base station 1.

In step S321, the central base station 1 transmits TBs to the user apparatus 3 by using CC #2 through CC #N under the central base station 1. It should be noted that the TBs are transmitted to the user apparatus 3 by using a PDCSH. Further, a HARD process ID is included in DCI of a PDCCH.

In step S322, the user apparatus 3 transmits an ACK or a NACK to the remote base station 2. The ACK or NACK is transmitted to the remote base station 2 by using a PUCCH or a PUSCH.

In step S323, the remote base station 2 transmits an ACK/NACK reporting signal to the central base station 1. The ACK/NACK reporting signal is, for example, a signal of transmission protocol defined between the central base station 1 and the remote base station 2. In the processing steps, it is assumed that the transmission delay between the central base station 1 and the remote base station 2 is small enough to be ignored in uplink. In other words, the central base station 1 recognizes the HARQ process ID by assuming that, the same as in conventional LTE, the ACK/NACK will be received 4 ms after the TBs have been transmitted in the processing steps of step S321.

It should be noted that, in the case where the HARQ processing is performed, it is necessary that at least one CC, of a plurality of CCs used for CA for the user apparatus 3, is under the central base station 1. Therefore, when the user apparatus 3 first camps on a radio network, it is desirable that the user apparatus 3 is not allowed to camp on a CC under the remote base station 2. Therefore, the central base station 1 may regulate cells under the remote base station 2. Further, the central base station 1 may regulate cells under the remote base station 2 by omitting a part of broadcast information for the cells under the remote base station 2.

It should be noted that, in the case where an uplink traffic amount is greater than a downlink traffic amount, it is expected that the transmission delay between the central base station 1 and the remote base station 2, and the fluctuations of the transmission delay occur mainly in uplink. Therefore, instead of processing steps illustrated in FIG. 19, the user apparatus 3 may transmit the ACK/NACK directly to the central base station 1 via a CC under the central base station 1. Specifically, the central base station 1 transmits a TB transmission instruction to the remote base station 2.

Subsequently, the remote base station 2 transmits a TB to the user apparatus 3. Subsequently, the user apparatus 3 transmits an ACK/NACK directly to the central base station 1. With the above arrangement, the impact, due to the fluctuations of the transmission delay between the central base station 1 and the remote base station 2, is reduced as much as possible.

<Process Overview (Uplink)>

Figure 20A:
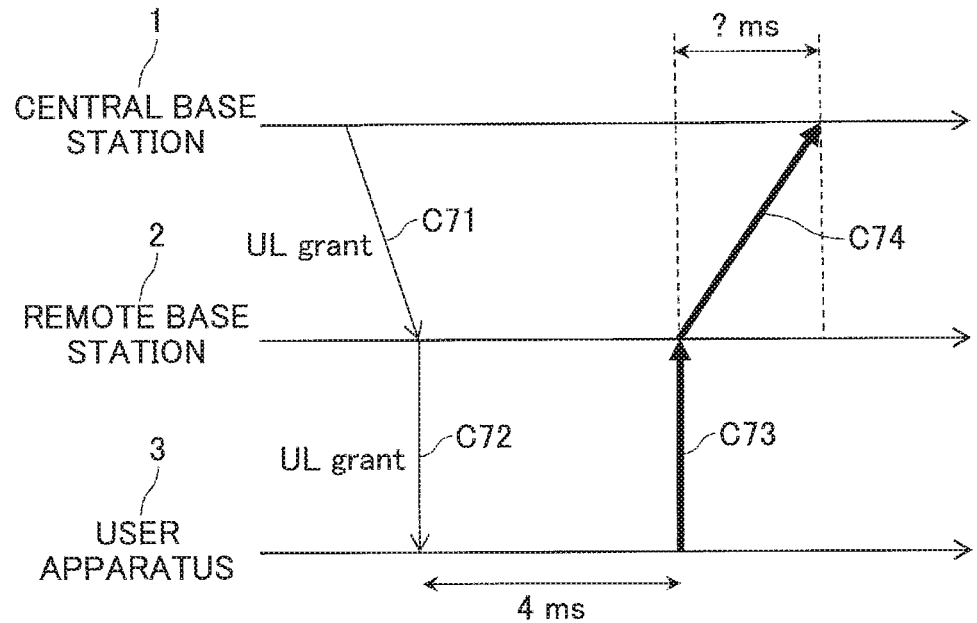
FIG. 20A is a drawing illustrating an overview of a process (uplink) according to a third embodiment.
Figure 20B:
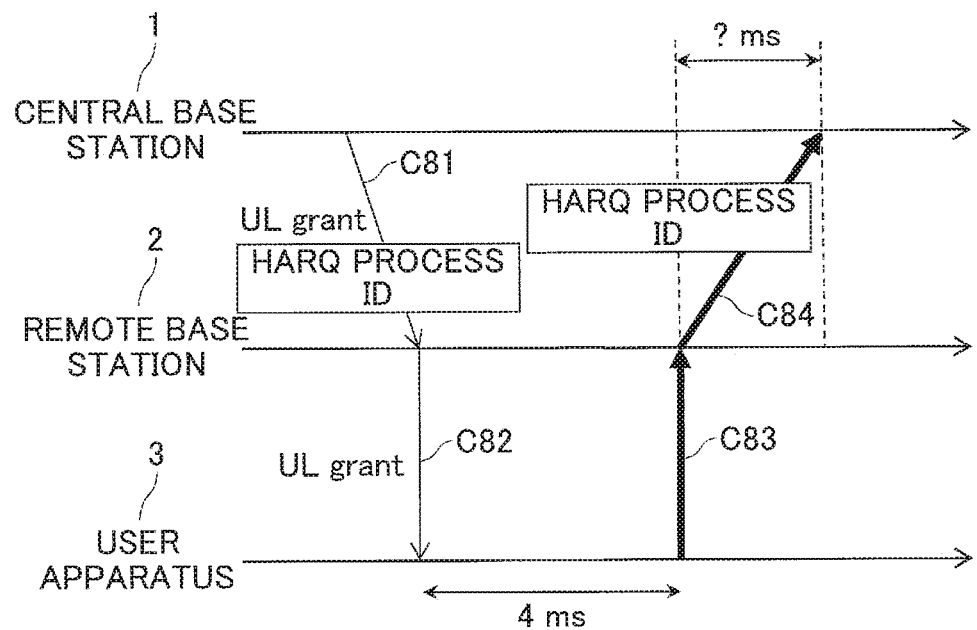
FIG. 20B is a drawing illustrating an overview of a process (uplink) according to a third embodiment.

FIG. 20A and FIG. 20B are drawings illustrating an overview of a process according to a third embodiment (uplink). FIG. 20A illustrates an operation example in the case where conventional LTE HARQ processing is applied to a mobile communication system according to one or more embodiments. It should be noted that, in FIG. 20A, it is assumed that fluctuations of transmission delay between the central base station 1 and the remote base station 2 occur, and that the transmission delay is not constant.

As illustrated in FIG. 20A, a UL grant is transmitted from the central base station 1, and after a few ms, arrives at the remote base station 2 (C71). Further, the UL grant is transmitted from the remote base station 2 to the user apparatus 3 (C72). The user apparatus 3 transmits a TB to the remote base station 2 four ms after the UL grant reception by using an uplink radio resource specified in the received UL grant (C73). The remote base station 2 transmits the TB (or MAC PDU) to the central base station 1. After a few ms, the TB (or MAC PDU) arrives at the central base station 1 (C74).

Here, the time is unknown, which time is from when the UL grant is transmitted from the central base station 1 (C71) to when the TB (or MAC PDU) arrives at the central base station 1 (C74). In the conventional LTE HARQ processing, the TB is received 4 ms after the UL grant is transmitted, and thus, it is possible to identify which UL grant the TB corresponds to from the TB reception timing. However, in an example of FIG. 20A, the TB (or MAC PDU) is received at least more than 4 ms after the UL grant is transmitted, and thus, it is not possible to identify which UL grant the TB (or MAC PDU) corresponds to from the TB (or MAC PDU) reception timing.

In the case where a layer 1 function, of functions included in the central base station 1, is transferred to the remote base station 2 (that is, in the case where the central base station 1 performs the HARQ processing), if it is not possible to determine which UL grant the received TB corresponds to, then it is not possible for the central base station 1 to transmit an ACK/NACK to the user apparatus 3 at the right timing. Further, in the case where a TB is retransmitted from the user apparatus 3 in the subsequent processing, it is not possible to determine which HARQ process should be used for processing the TB, and it is not possible to properly perform retransmission processing, etc. In other words, the HARQ process of the user apparatus 3 and the HARQ process of the central base station 1 will be out of synchronization.

Further, in the case where a layer 1 function and a HARQ processing function, of functions included in the central base station 1, are transferred to the remote base station 2, if it is not possible to identify which UL grant the received MAC PDU corresponds to, then it is expected that it is difficult to properly handle the uplink user data transmitted from the user apparatus 3.

Therefore, in a third embodiment, the central base station 1 associates the TB (or MAC PDU) with the UL grant by including the HARQ process ID in the transmission protocol defined between the central base station 1 and the remote base station 2.

FIG. 20B illustrates an operation example according to the third embodiment. C81 through C84 correspond to C71 through C74 of FIG. 20A, respectively. Referring to FIG. 20B, the central base station 1 transmits a UL grant and a HARQ process ID to the remote base station 2 (C81). Further, the remote base station 2 transmits a TB (or MAC PDU) and the HARQ process ID (C84). With the above arrangement, it is possible for the central base station 1 to properly associate the TB (or MAC PDU) with the UL grant.

<Processing Steps>

(HARQ Processing (Uplink))

FIG. 21 is a sequence diagram illustrating a HARQ processing (uplink) according to the third embodiment. Referring to FIG. 21, processing steps of HARQ processing (uplink) will be described.

In step S351, the central base station 1 transmits a UL grant reporting signal to the remote base station 2. The UL grant reporting signal is, for example, a signal of transmission protocol defined between the central base station 1 and the remote base station 2. In the UL grant reporting signal, a UL grant to be transmitted to the user apparatus 3 is included.

In order to uniquely associate the UL grant with a HARQ process, the central base station 1 includes the HARQ process ID in the UL grant reporting signal transmitted to the remote base station 2 in step S351. It should be noted that the central base station 1 may include the HARQ process ID in the header unit, etc., of the UL grant reporting signal and transmit the UL grant reporting signal to the remote base station 2, or, may include (embed) the HARQ process ID in the UL grant and transmit the UL grant reporting signal to the user apparatus 3.

Further, the central base station 1 may include a codeword or an antenna port in the UL grant. With the above arrangement, it is possible to let the user apparatus 3 transmit two TBs simultaneously at a predetermined subframe in the case where MIMO spatial multiplexing communications are performed in uplink.

In step S352, the remote base station 2 transmits the UL grant received in step S351 to the user apparatus 3 via a PDCCH.

Here, in the case where the HARQ process ID is included in the header unit, etc., of the UL grant reporting signal in the processing steps of step S351, and where the HARQ processing is performed by the remote base station 2, the remote base station 2 may transmit the UL grant via a PDCCH of a TTI (subframe), of TTIs (subframes) corresponding to HARQ process IDs used in the HARQ entity of the remote base station 2, corresponding to the HARQ process ID specified in step S351. With the above arrangement, the remote base station 2 only needs to transmit to the central base station 1 the HARQ process ID as is, the HARQ process of which HARQ process ID performs the processing of step S354 4 ms later, and thus, there is no need to change the interface between the remote base station 2 and the user apparatus 3.

Next, in the case where the HARQ process ID is included (embedded) in the UL grant received in processing steps of step S351, the remote base station 2 may transmit the UL grant to the user apparatus 3 via a PDCCH at any timing.

In step S353, a TB is mapped to the radio resource (PUSCH) specified by the UL grant and transmitted to the remote base station 2 by the user apparatus 3. It should be noted that, in the case where the HARQ process ID is included (embedded) in the UL grant, the TB processed by the HARQ process of the HARQ process ID may be mapped to a PUSCH at any timing and transmitted to the remote base station 2. In this case, further, the HARQ process ID is included in the PUSCH and transmitted to the remote base station 2 by the user apparatus 3.

On the other hand, in the case where the HARQ process ID is not included in the UL grant, according to the conventional LTE specification, by using a TTI (subframe) 4 ms after the UL grant reception, the TB is mapped to a PUSCH and transmitted to the remote base station 2.

In step S354, the remote base station 2 transmits a TB transmission reporting signal. The TB transmission reporting signal is, for example, a transmission protocol signal defined between the central base station 1 and the remote base station 2. In the case where the HARQ processing is performed by the remote base station 2, the remote base station 2 generates a MAC PDU by decoding the TB received in step S353 and transmits the TB transmission reporting signal to the central base station 1, in which signal the generated MAC PDU and the HARQ process ID are included. The remote base station 2 may include the MAC PDU in the payload of the TB transmission reporting signal and include the HARQ process ID in the header.

On the other hand, in the case where the HARQ processing is performed by the central base station 1, the remote base station 2 extracts the TB by demodulating the PUSCH received in step S353, and transmits the TB transmission reporting signal to the central base station 1, in which signal the extracted TB and the HARQ process ID are included. The remote base station 2 may include the TB in the payload of the TB transmission reporting signal and include the HARQ process ID in the header.

It should be noted that the remote base station 2 includes the HARQ process ID in the TB transmission reporting signal in the case where the HARQ process ID is included in the PUSCH received in step S353. Further, in the case where the HARQ process ID is not included in the PUSCH received in step S353 (that is, in the case where the HARQ processing is performed by the remote base station 2 and the user apparatus 3 has transmitted the PUSCH 4 ms after the UL grant reception), a HARQ process ID is included in the TB transmission reporting signal, which HARQ process ID corresponds to a HARQ process of the remote base station 2 which has performed the MAC PDU generation.

Further, in the case where communications according to CA is being performed, TBs are transmitted via CCs at a predetermined subframe. In other words, the remote base station 2 receives from the user apparatus 3 the TBs via CCs in processing steps of step S353. In this case, the TB transmission reporting signal may include identifiers for uniquely identifying CCs corresponding to the TBs (or MAC PDUs) (ServCellIndex, SCellIndex, physical layer cell identity (PCI), carrier frequency, etc.)

In step S355, in the case where a TB cannot be received from the user apparatus 3 in processing steps of step S353 (in other words, in the case where a TB cannot be received 4 ms after the UL grant is transmitted in step S352), the remote base station 2 may transmit a DTX reporting signal to the central base station 1.

<Functional Configuration>

(Central Base Station)

Figure 22:
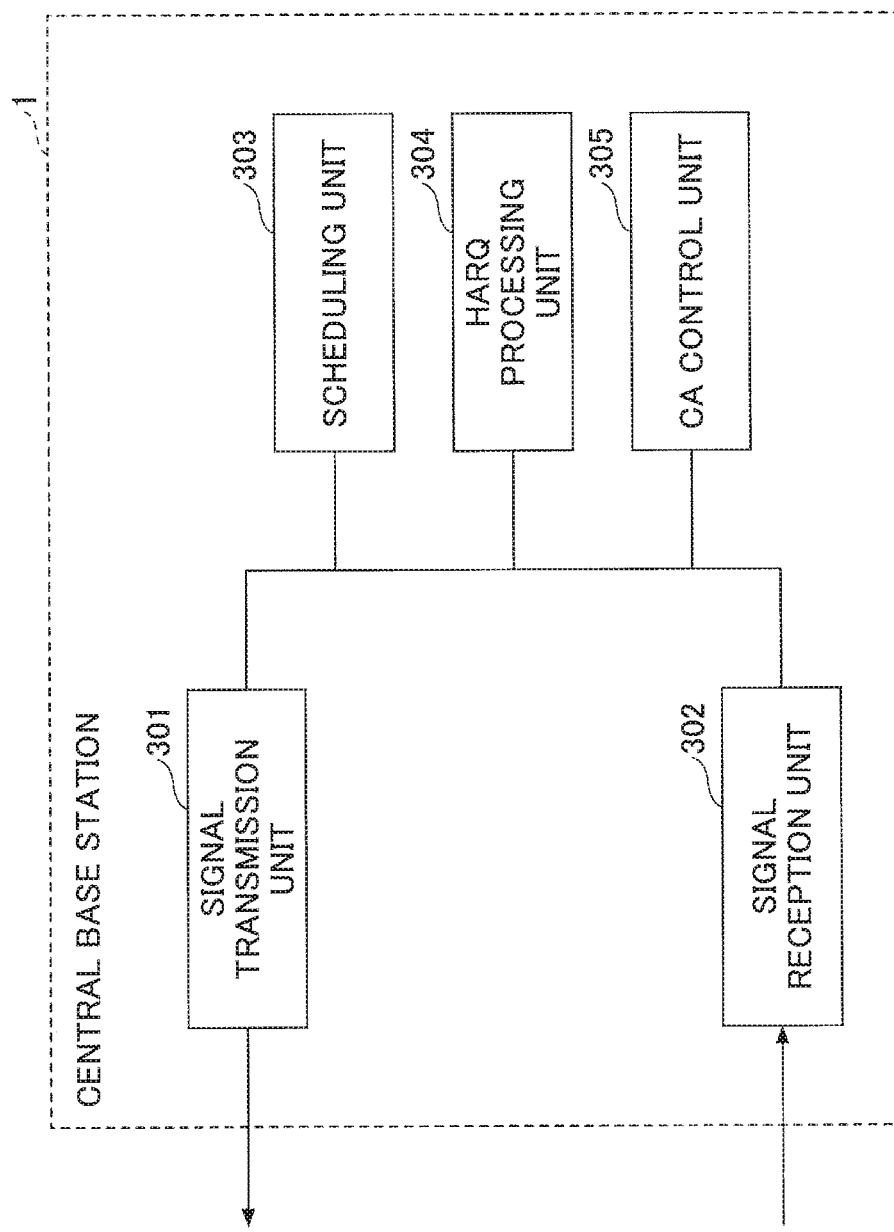
FIG. 22 is a drawing illustrating an example of a functional configuration of a central base station according to a third embodiment.

FIG. 22 is a drawing illustrating an example of a functional configuration of a central base station 1 according to the third embodiment. As illustrated in FIG. 22, the central base station 1 includes a signal transmission unit 301, a signal reception unit 302, a scheduling unit 303, a HARQ processing unit 304, and a CA control unit 305. It should be noted that FIG. 22 illustrates functional units of the central base station 1 especially related to the third embodiment only, and thus, the central base station 1 also includes at least functions for performing operations according to LTE (not shown in the figure). Further, a functional structure illustrated in FIG. 22 is only an example. Functional classification and names of functional units may be anything as long as operations related to one or more embodiments can be performed. It should be noted that the HARQ processing unit 304 may be included only in the case where the HARQ processing is performed by the central base station 1 (in the case where only the layer 1 function is transferred to the remote base station 2).

The signal transmission unit 301 includes a function for transmitting to the remote base station 2 various kinds of signals up to layer 2 generated from an upper layer signal which should be transmitted from the central base station 1. The signal reception unit 302 includes a function for receiving various kinds of signals from the remote base station 2, and obtaining upper layer signals from the received layer 2 signals.

The scheduling unit 303 includes a function for performing the HARQ processing. Specifically, the scheduling unit 303 performs the processing including instructing a HARQ process of the remote base station 2 to transmit a MAC PDU, receiving an ACK/NACK from the remote base station 2, indicating TB retransmission, etc. Further, the scheduling unit 303 performs necessary radio resource allocation, etc., for the remote base station 2 to transmit and receive a TB and an ACK/NACK. Further, the scheduling unit 303 performs allocating uplink radio resources, indicating a HARQ process ID of the HARQ process used in the HARQ processing of the remote base station 2, and generating a UL grant. Further, in the case where the HARQ processing is performed by the central base station 1, the scheduling unit 303 controls the HARQ processing unit 304 instead of controlling the HARQ processing of the remote base station 2.

The HARQ processing unit 304 performs HARQ processing with the user apparatus 3. The HARQ processing unit 304 generates a TB from a MAC PDU, and transmits the generated TB to the remote base station 2 by using a predetermined HARQ process. Further, the HARQ processing unit 304 performs TB retransmission based on the ACK/NACK received from the remote base station 2.

Further, the HARQ processing unit 304 generates a MAC PDU from a TB received from the user apparatus 3 via the remote base station 2, and transmits an ACK/NACK to the user apparatus 3 via the remote base station 2.

The CA control unit 305 instructs the user apparatus 3 to add a CC, remove a CC, etc. It should be noted that the CA control unit 305 may instruct the remote base station 2 to regulate the cells under the remote base station 2. Further, the CA control unit 305 may instruct the remote base station 2 to omit a part of broadcast information for the cells under the remote base station 2.

(Remote Base Station)

Figure 23:
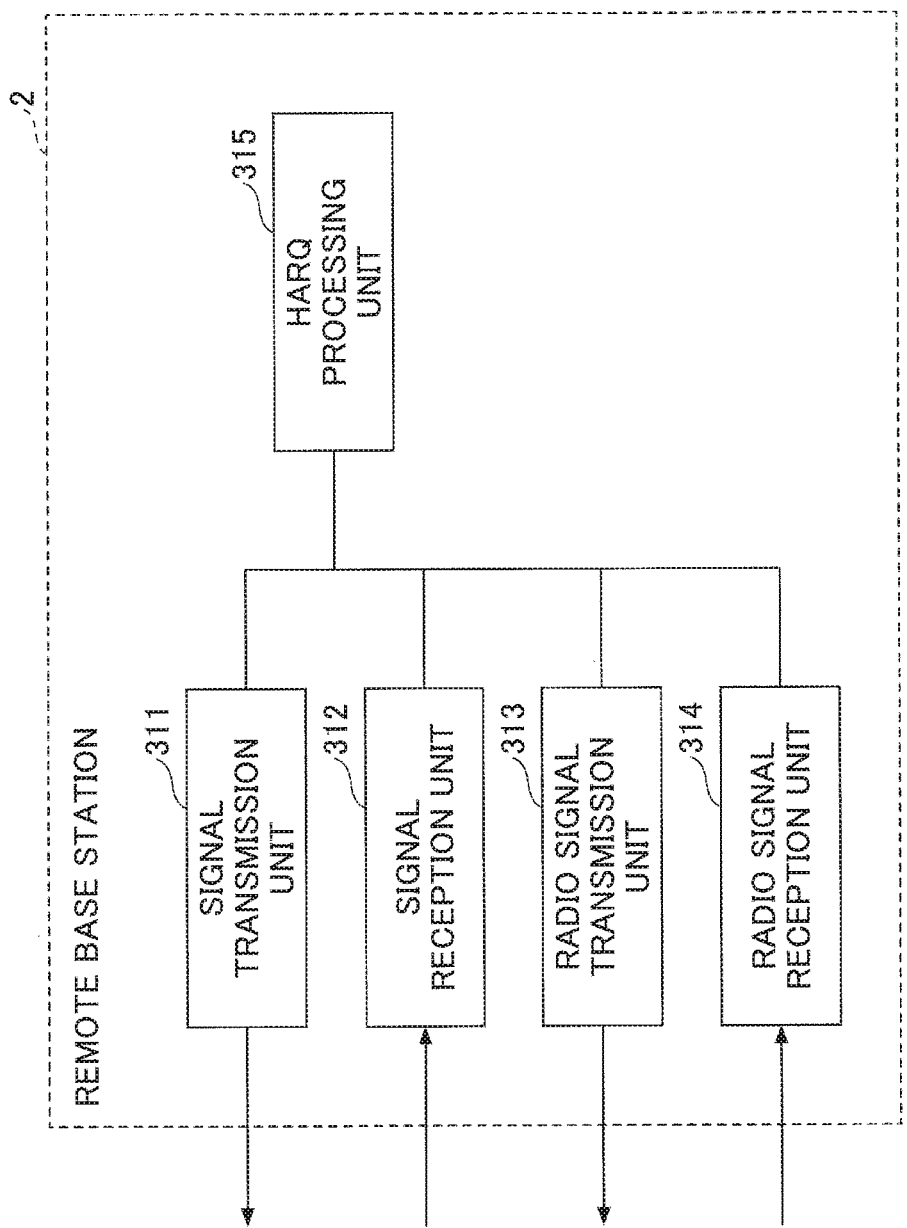
FIG. 23 is a drawing illustrating an example of a functional configuration of a remote base station according to a third embodiment.

FIG. 23 is a drawing illustrating an example of a functional configuration of a remote base station 2 according to the third embodiment. As illustrated in FIG. 23, the remote base station 2 includes a signal transmission unit 311, a signal reception unit 312, a radio signal transmission unit 313, a radio signal reception unit 314, and a HARQ processing unit 215. It should be noted that FIG. 23 illustrates functional units of the remote base station 2 especially related to the third embodiment only, and thus, the remote base station 2 also includes at least functions for performing operations according to LTE (not shown in the figure). Further, a functional structure illustrated in FIG. 23 is only an example. Functional classification and names of functional units may be anything as long as operations related to one or more embodiments can be performed. It should be noted that the HARQ processing unit 315 may not be included in the remote base station 2 in the case where the HARQ processing is performed by the central base station 1 (in the case where only the layer 1 function is transferred to the remote base station 2).

The signal transmission unit 311 includes a function for generating a layer 1 signal to be transmitted to the central base station 1 from a radio signal received from the radio signal reception unit 314, and transmitting the generated signal to the central base station 1. The signal reception unit 312 includes a function for generating a layer 1 signal from a signal received from the central base station 1, and transmitting the generated signal to the radio signal transmission unit 313. The radio signal transmission unit 313 transmits the layer 1 signal received from the signal reception unit 312 to the user apparatus 3 by using a radio signal. The radio signal reception unit 314 transmits the radio signal received from the user apparatus 3 to the signal transmission unit 311.

Further, the radio signal reception unit 314 receives a TB from the user apparatus 3, and transmits the received TB to the signal transmission unit 311 or the HARQ processing unit 315.

Further, the signal reception unit 312 receives a transmission instruction signal from the central base station 1, and obtains a HARQ process ID of a HARQ process from various types of information items included in the transmission instruction signal. Further, the signal reception unit 312 obtains a MAC PDU (or TB) included in the transmission instruction signal received from the central base station 1. Further, the signal reception unit 312 receives a UL grant report from the central base station 1, and obtains a UL grant and a HARQ process ID included in the UL grant report. Further, the signal reception unit 312 transmits the obtained HARQ process ID to the HARQ processing unit 315.

Further, the signal transmission unit 311 has a function for setting the HARQ process ID obtained by the signal reception unit 312 in the header part of a predetermined transmission protocol used between the central base station 1 and the remote base station 2, setting in the payload part of the predetermined transmission protocol the TB received by the radio signal reception unit 314 from the user apparatus 3 or the MAC PDU generated by the HARQ processing unit, and transmitting the header and the payload to the central base station 1.

The HARQ processing unit 315 performs HARQ processing with the user apparatus 3. The HARQ processing unit 315 generates a TB from a MAC PDU received from the central base station 1, and transmits the generated TB to the user apparatus 3 by using a predetermined HARQ process. Further, the HARQ processing unit 315 transmits an ACK/NACK received from the user apparatus 3 to the central base station 1. Further, the HARQ processing unit 315 receives a TB retransmission instruction from the central base station 1, and retransmits to the user apparatus 3 the TB of redundancy version (RV) specified by the retransmission instruction.

Further, the HARQ processing unit 315 generates a MAC PDU from a TB received from the user apparatus 3, and transmits the generated MAC PDU to the central base station 1 via the signal transmission unit 311. Further, the HARQ processing unit 315 transmits an ACK/NACK to the user apparatus 3.

Further, in the case where a HARQ process number used for HARQ processing is specified by the central base station 1, the HARQ processing unit 304 performs the HARQ processing by using the specified HARQ process.

(User Apparatus)

Figure 24:
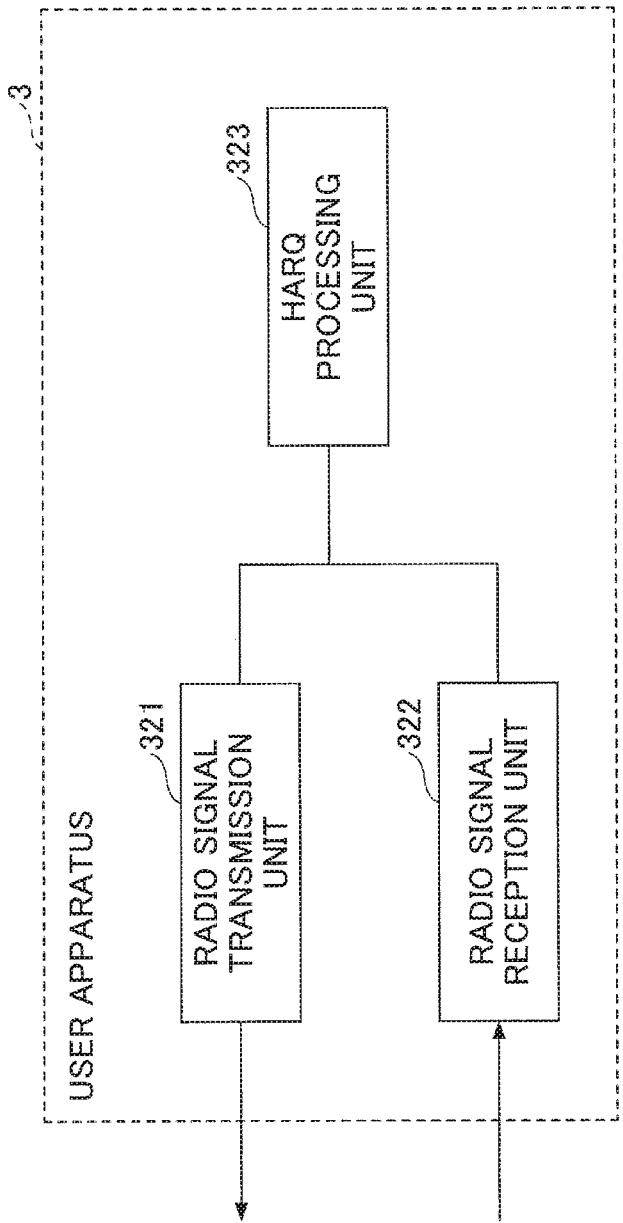
FIG. 24 is a drawing illustrating an example of a functional configuration of a user apparatus according to a third embodiment.

FIG. 24 is a drawing illustrating an example of a functional configuration of a user apparatus 3 according to the third embodiment. As illustrated in FIG. 24, the user apparatus 3 includes a radio signal transmission unit 321, a radio signal reception unit 322, and a HARQ processing unit 323. It should be noted that FIG. 24 illustrates functional units of the user apparatus 3 especially related to the third embodiment only, and thus, the user apparatus 3 further includes at least functions for performing operations according to LTE (not shown in the figure). Further, a functional structure illustrated in FIG. 24 is only an example. Functional classification and names of functional units may be anything as long as operations related to one or more embodiments can be performed.

The radio signal transmission unit 321 includes a function for generating various kinds of physical layer signals from an upper layer signal which should be transmitted from the user apparatus 3 and wirelessly transmitting the generated signals. The radio signal reception unit 322 includes a function for wirelessly receiving various kinds of signals from the remote base station 2, and obtaining upper layer signals from the received physical layer signals.

The HARQ processing unit 323 performs HARQ processing with the central base station 1 or the remote base station 2. Further, in the case where a UL grant specifying a HARQ process ID is received, the HARQ processing unit 323 performs HARQ processing by using the specified HARQ process ID. Further, in the case where a UL grant specifying a HARQ process ID, the HARQ processing unit 323 transmits a TB to the remote base station 2 (or the central base station 1) at any TTI (subframe) timing.

<Summary>

As described above, a base station is provided. The base station is used as a first base station in a mobile communication system including the first base station, a second base station communicating with the first base station, and a user apparatus communicating with the first base station. The base station includes a first reception unit configured to receive from the second base station a process ID used for error correction processing; a second reception unit configured to receive data from the user apparatus; and a transmission unit configured to transmit the data and the process ID to the second base station in the case where the data is received from the user apparatus. With the above remote base station 2, a technology is provided which enables performing appropriate communications even in the case where the transmission delay between the base station and the remote base station is big in a mobile communication network based on a C-RAN.

Further, the data may be an acknowledgment or a non-acknowledgment in error correction processing performed in downlink communications. With the above arrangement, it is possible for the central base station 1 to properly determine the HARQ process ID, by the HARQ process of which HARQ process ID the ACK/NACK should be processed.

Further, the transmission unit may transmit a codeword associated with the acknowledgment or the non-acknowledgment to the second base station. With the above arrangement, even in the case where communications according to MIMO spatial multiplexing are performed and multiple TBs are simultaneously transmitted to the user apparatus 3, it is possible for the central base station 1 to determine which TB the ACK/NACK corresponds to.

Further, the data may be a transport block transmitted from the user apparatus in uplink communications. With the above arrangement, it is possible for the central base station 1 to properly determine the HARQ process ID, by the HARQ process of which HARQ process ID the TB should be processed.

Further, the transmission unit may transmit the transport block or a MAC PDU generated from the transport block, and the process ID, by setting the transport block, or a MAC PDU generated from the transport block in the payload part in a predetermined protocol used between the base station and the second base station, and by setting the process ID in the header part in the predetermined protocol. With the above arrangement, it is possible for the remote base station 2 to transmit the TB or MAC PDU and the HARQ process ID to the central base station 1 by using the predetermined transmission protocol used between the central base station 1 and the remote base station 2.

Further, the "unit" included in the above apparatuses may be substituted by "means", "circuit", "device", etc.

Fourth Embodiment

<Process Overview>

In a mobile communication system according to a fourth embodiment, it is assumed that fluctuations of the transmission delay time occur between the central base station 1 and the remote base station 2, and, in the case where information related to radio quality (hereinafter, referred to as "quality information") is transmitted from the remote base station 2 to the central base station 1, priority control is performed in a transmission protocol defined between the central base station 1 and the remote base station 2. Further, in the case where the quality information cannot be transmitted to the central base station 1 within a predetermined time, old quality information is discarded. With the above arrangement, it is possible for a mobile communication system according to the fourth embodiment to properly perform communications even in the case where fluctuations of the transmission delay time occur.

Figure 25A:
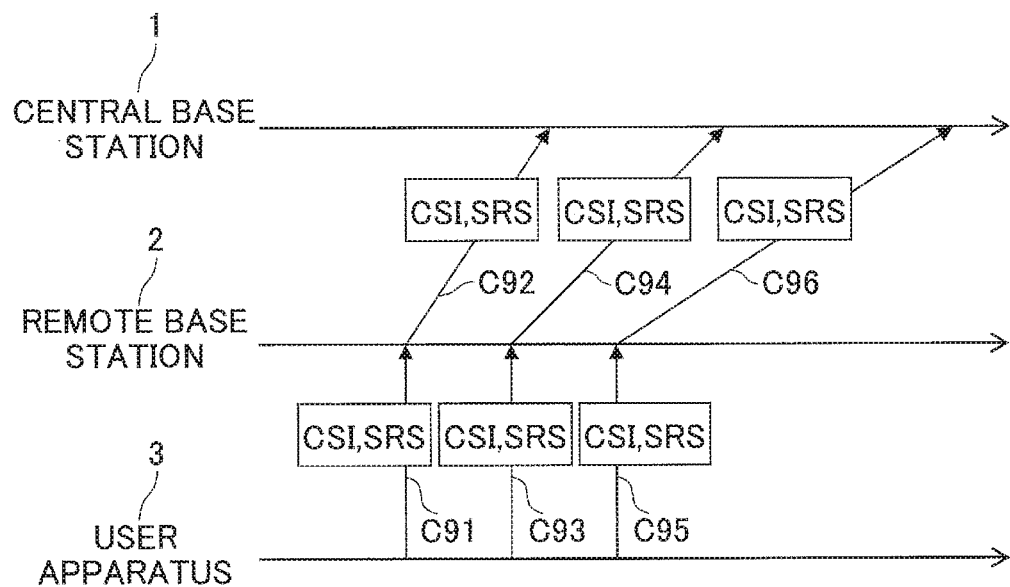
FIG. 25A is a drawing illustrating an overview of a process according to a fourth embodiment.
Figure 25B:
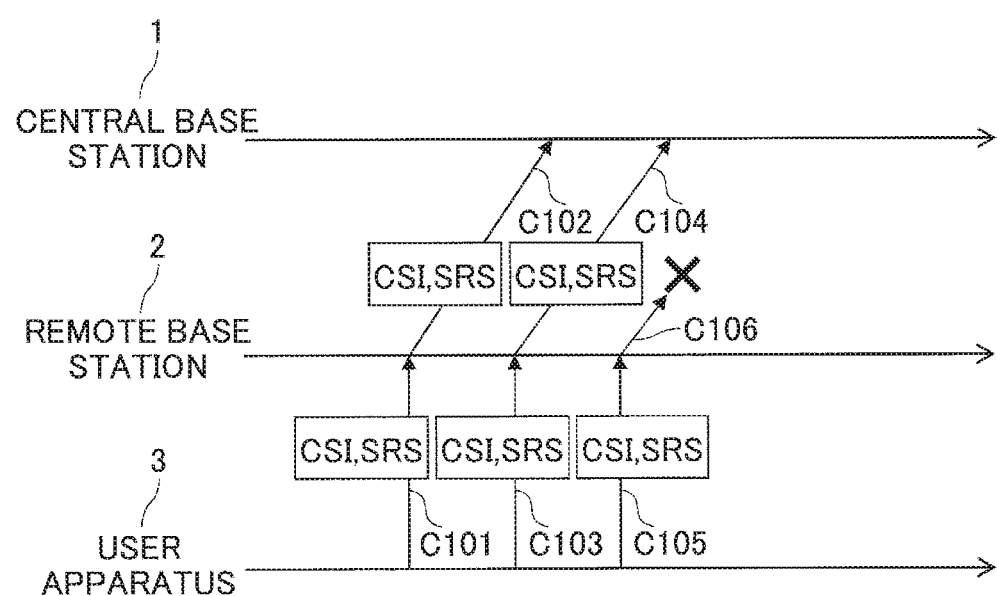
FIG. 25B is a drawing illustrating an overview of a process according to a fourth embodiment.

FIG. 25A and FIG. 25B are drawings illustrating an overview of a process according to the fourth embodiment. FIG. 25A illustrates a state in which quality information transmission is delayed in the case where fluctuations of transmission delay time have occurred.

As illustrated in FIG. 25A, CSIs or sounding reference signals (SRSs) are transmitted from the user apparatus 3 to the remote base station 2 (C91, C93, C95), and further, transmitted from the remote base station 2 to the central base station 1 (C92, C94, C96).

Here, the delay of the transmitted CSI or SRS (C96) is greater than that of the transmitted CSI or SRS (C92). The CSI is information necessary for the central base station 1 to properly perform downlink scheduling processing. If the CSI report from the user apparatus 3 is delayed, then the radio propagation situation may change during the delay, and there is a possibility that the appropriate scheduling processing will not be performed. Similarly, the SRS is information necessary for the central base station 1 to perform uplink channel estimation, uplink scheduling, etc. If the SRS report from the user apparatus 3 is delayed, then the radio propagation situation may change during the delay, and there is a possibility that appropriate channel estimation and the appropriate scheduling control will not be performed.

Therefore, in the fourth embodiment, in the case where the quality information is transmitted from the remote base station 2 to the central base station 1, priority control is performed in a transmission protocol defined between the central base station 1 and the remote base station 2. Further, old quality information will be discarded.

FIG. 25B illustrates an operation example according to the fourth embodiment. C101 through C106 correspond to C91 through C96 of FIG. 25A, respectively. Referring to FIG. 25B, the delay time of CSIs or SRSs arriving at the central base station 1 is reduced to a certain range.

With the above arrangement, it is possible for a mobile communication system according to the fourth embodiment to reduce communication quality degradation and properly perform communications even in the case where fluctuations of the transmission delay time occur.

<Processing Steps>

(Quality Information Transmission Processing)

Figure 26:
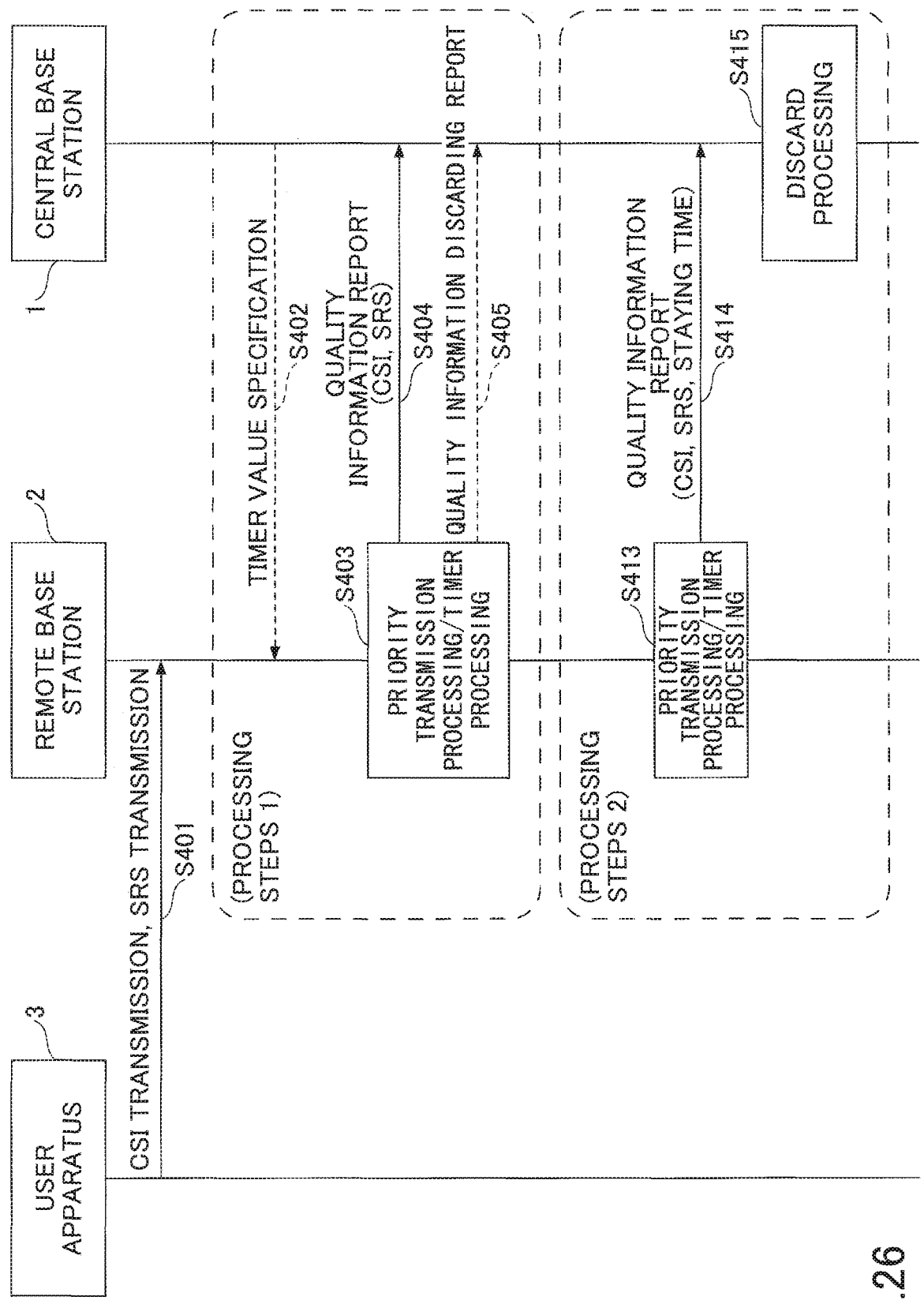
FIG. 26 is a sequence diagram illustrating quality information transmission processing according to a fourth embodiment.

FIG. 26 is a sequence diagram illustrating quality information transmission processing according to a fourth embodiment. Referring to FIG. 26, processing steps for transmitting quality information to the central base station 1 will be described.

In the following, processing steps of step S402 through step S405 illustrate a case where old quality information is discarded by the remote base station 2, and processing steps of step S413 through step S415 illustrate a case where old quality information is discarded by the central base station 1.

In the following description, it is assumed that the quality information is, but not limited to, a CSI or a SRS. First, processing steps in the case where old quality information is discarded by the remote base station 2 will be described.

In step S401, quality information (CSI, SRS) is transmitted from the user apparatus 3. It should be noted that the CSI is transmitted via a PUCCH or a PUSCH. Further, the SRS is mapped to OFDM symbols at the end of each subframe in the PUSCH.

In step S402, the central base station 1 may transmit a timer value specifying signal to the remote base station 2. The timer value specifying signal includes a timer value indicating a time limit for the quality information transmitted from the user apparatus 3 to be transmitted to the central base station 1. It should be noted that the timer value may be stored in the remote base station 2 in advance. Further, a different timer value may be set for each quality information. For example, the CSI further includes a channel quality indicator (CQI), a rank indicator (RI), precoding matrix indicator (PMI). Different timer values may be set for CQI, RI, and PMI, respectively. For example, a timer value longer than that for CQI is set for the RI which has relatively smaller time fluctuations than those of the CQI which has big time fluctuations, and thus, it is possible to prevent available quality information from being discarded.

In step S403, the remote base station 2 performs priority transmission processing in which quality information received in step S401 is transmitted to the central base station 1 by having given higher priority than data other than the quality information such as user data. For example, in the case where quality information is included in a layer 1 signal transmitted from the user apparatus 3, the quality information alone may be extracted from the layer 1 signal and encapsulated by using a predetermined protocol defined between the remote base station 2 and the central base station 1, and transmitted to the central base station 1 by having given higher priority.

Further, the remote base station 2 measures elapsed time from the quality information reception from the user apparatus 3. In the case where the quality information cannot be transmitted to the central base station 1 within a time set in the timer value, the remote base station 2 discard the quality information. It should be noted that, in order to prevent the quality information of the same user apparatus 3 from being discarded continuously, once quality information of a user apparatus 3 is discarded, quality information of the same user apparatus 3 may be given further higher priority and transmitted to the central base station 1.

In the case where the quality information can be transmitted to the central base station 1 within a time set in the timer value, the remote base station 2 proceeds to processing steps of step S404. In the case where the quality information cannot be transmitted to the central base station 1 within a time set in the timer value and the quality information is discarded, the remote base station 2 proceeds to processing steps of step S405.

In step S404, the remote base station 2 transmits a quality information reporting signal. In the quality information reporting signal, quality information is included. The quality information reporting signal is, for example, a signal of a predetermined transmission protocol defined between the central base station 1 and the remote base station 2. It should be noted that, in the quality information reporting signal, an identifier of the user apparatus 3 (RNTI, etc.) and an identifier for identifying a cell under the remote base station 2 (CellIndex, ServCellIndex, etc.) may be further included.

In step S405, the remote base station 2 may transmit a quality information discarding report signal. In the quality information discarding report signal, discarded quality information may be included.

Next, processing steps in the case where old quality information is discarded by the central base station 1 will be described.

In step S413, the remote base station 2 performs priority transmission processing so that quality information received in step S401 is given higher priority and transmitted to the central base station 1. For example, in the case where quality information is included in a layer 1 signal transmitted from the user apparatus 3, the quality information alone may be extracted from the layer 1 signal and encapsulated by using a predetermined protocol defined between the remote base station 2 and the central base station 1, given higher priority, and transmitted to the central base station 1. It should be noted that the remote base station 2 measures the elapsed time from the quality information reception from the user apparatus 3 (that is, staying time in the remote base station 2).

In step S414, the remote base station 2 transmits a quality information reporting signal. In the quality information reporting signal, the quality information and the staying time are included.

In step S415, in the case where the staying time included in the quality information reporting signal exceeds a predetermined time, the central base station 1 discards the received quality information. It should be noted that a different predetermined time value may be set for different quality information items. The central base station 1 may compare, for each quality information item, the staying time with corresponding predetermined time to determine whether the quality information should be discarded. With the above arrangement, for example, for the RI which has relatively smaller time fluctuations than those of the CQI, the predetermined time longer than that for the CQI whose time fluctuations are bigger is set, and thus, it is possible to prevent quality information items from being unnecessarily discarded.

It should be noted that the processing steps described above may be used for transmission of information other than the quality information. For example, when transmitting a scheduling request (SR) signal or a ACK/NACK signal from the user apparatus 3 to the central base station 1, the remote base station 2 may give higher priority to the signals to transmit to the central base station 1.

Quality Information Transmission Processing (Modified Example)

Figure 27:
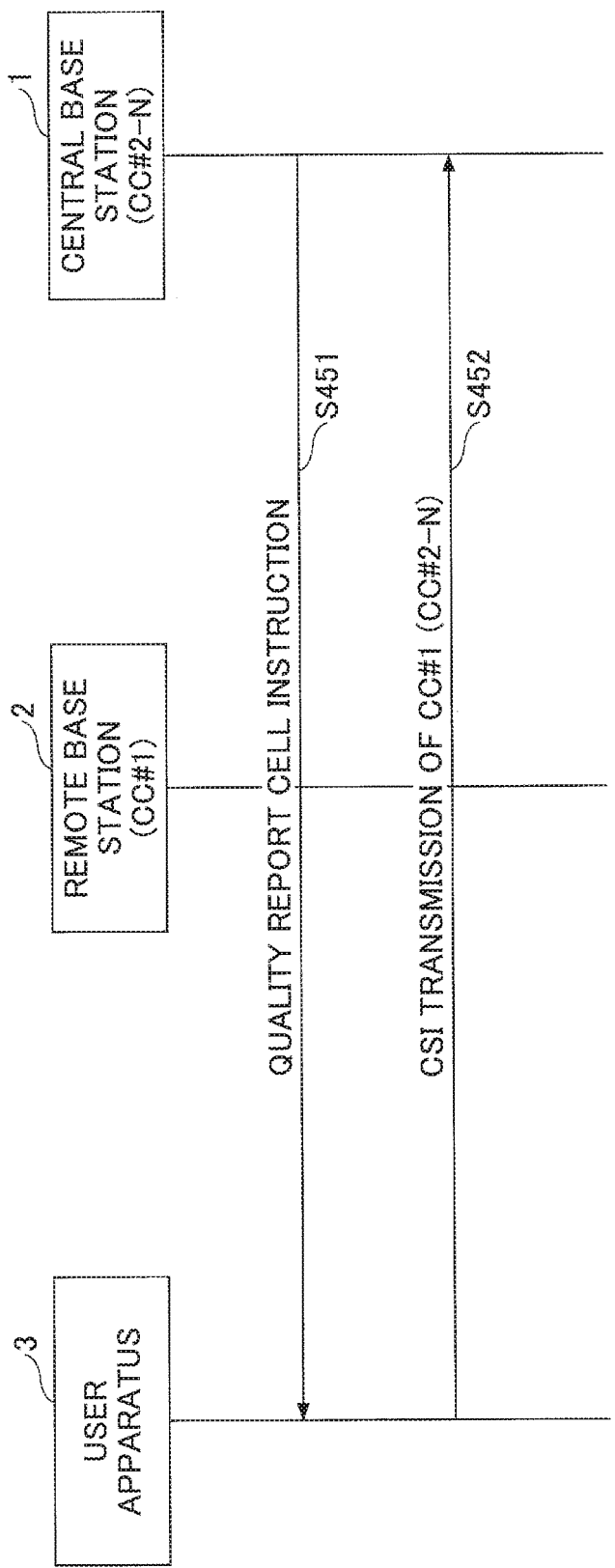
FIG. 27 is a sequence diagram illustrating quality information transmission processing (modified example 1) according to a fourth embodiment.

FIG. 27 is a sequence diagram illustrating quality information transmission processing (modified example 1) according to a fourth embodiment. In the processing steps, it is assumed that communications according to CA are performed. In the processing steps, the central base station 1 obtains quality information related to a cell (CC #1) under the remote base station 2 directly from the user apparatus 3. With the above arrangement, the impact, due to the transmission delay and the fluctuations of the transmission delay between the central base station 1 and the remote base station 2, is reduced as much as possible.

It should be noted that, in FIG. 27, it is assumed that CC #1 exists under the remote base station 2, and CC #2 through CC #N exist under the central base station 1. Further, it is assumed that the quality information in the processing steps is CSI.

In step S451, the central base station 1 instructs the user apparatus 3 to transmit a quality report (CSI) related to CC #1 via any one of CC #2 through CC #N by transmitting a quality report cell indication signal to the user apparatus 3. It should be noted that, regarding the processing steps of step S451, the central base station 1 may transmit an instruction at the time when CA is started.

In step S452, the user apparatus 3 transmits the quality information (CSI) related to CC #1 to the central base station 1 via the CC specified by the processing steps of step S451.

It should be noted that the processing steps described above may be used for transmission of information other than the quality information. For example, when transmitting a scheduling request (SR) signal or an ACK/NACK signal to the central base station 1, the user apparatus 3 may transmit the signals to the central base station 1 via the CC specified in step S451.

Further, the processing steps described above may be combined with the processing steps described by referring to FIG. 26. In other words, in the case where CA is not performed, the user apparatus 3 may transmit the quality information to the remote base station 2 according to the processing steps of FIG. 26, and in the case where CA is performed, the user apparatus 3 may transmit the quality information directly to the central base station 1 according to the processing steps of FIG. 27.

<Functional Configuration>
(Central Base Station)

Figure 28:
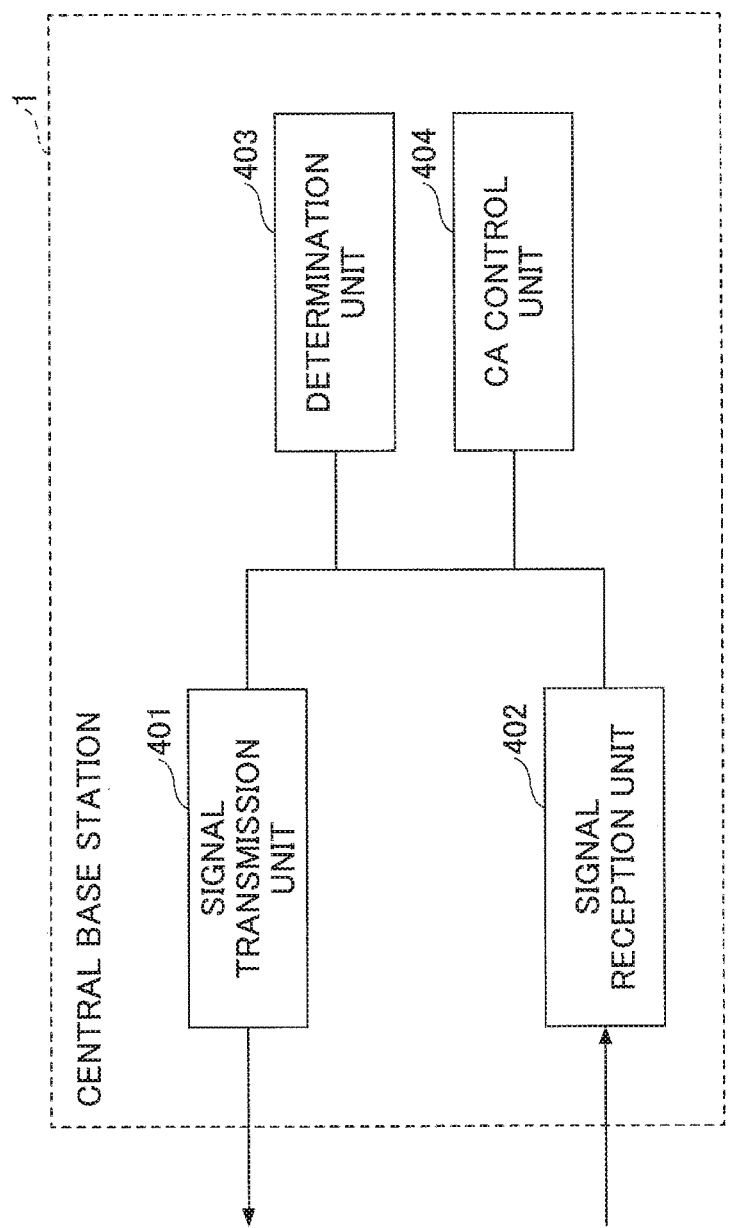
FIG. 28 is a drawing illustrating an example of a functional configuration of a central base station according to a fourth embodiment.

FIG. 28 is a drawing illustrating an example of a functional configuration of a central base station 1 according to the fourth embodiment. As illustrated in FIG. 28, the central base station 1 includes a signal transmission unit 401, a signal reception unit 402, a determination unit 403, and a CA control unit 404. It should be noted that FIG. 28 illustrates functional units of the central base station 1 especially related to the fourth embodiment only, and thus, the central base station 1 also includes at least functions for performing operations according to LTE (not shown in the figure). Further, a functional structure illustrated in FIG. 28 is only an example. Functional classification and names of functional units may be anything as long as operations related to one or more embodiments can be performed.

The signal transmission unit 401 includes a function for transmitting to the remote base station 2 or the user apparatus 3 various kinds of signals up to layer 2 or layer 1 generated from an upper layer signal which should be transmitted from the central base station 1. The signal reception unit 402 includes a function for receiving various kinds of signals from the remote base station 2 or the user apparatus 3, and obtaining upper layer signals from the received layer 2 or layer 1 signals.

Further, the signal transmission unit 401 has a function for transmitting to the remote base station 2 a timer value indicating a time limit until the quality information transmitted from the user apparatus 3 is transmitted to the central base station 1.

The determination unit 403 determines whether the quality information should be discarded based on the staying time included in the quality information received from the remote base station 2. The determination unit 403 may, for example, by comparing a predetermined time with the staying time, determine that the quality information should be discarded if the staying time exceeds the predetermined time, and determine that the quality information should not be discarded if the staying time is equal to or less than the predetermined time. Further, a different predetermined time value may be set for different quality information.

The CA control unit 404 instructs the user apparatus 3 to add a CC, remove a CC, etc. It should be noted that the CA control unit 404 may instruct the remote base station 2 to regulate the cells under the remote base station 2. Further, the CA control unit 305 may instruct the remote base station 2 to omit a part of broadcast information for the cells under the remote base station 2.

(Remote Base Station)

Figure 29:
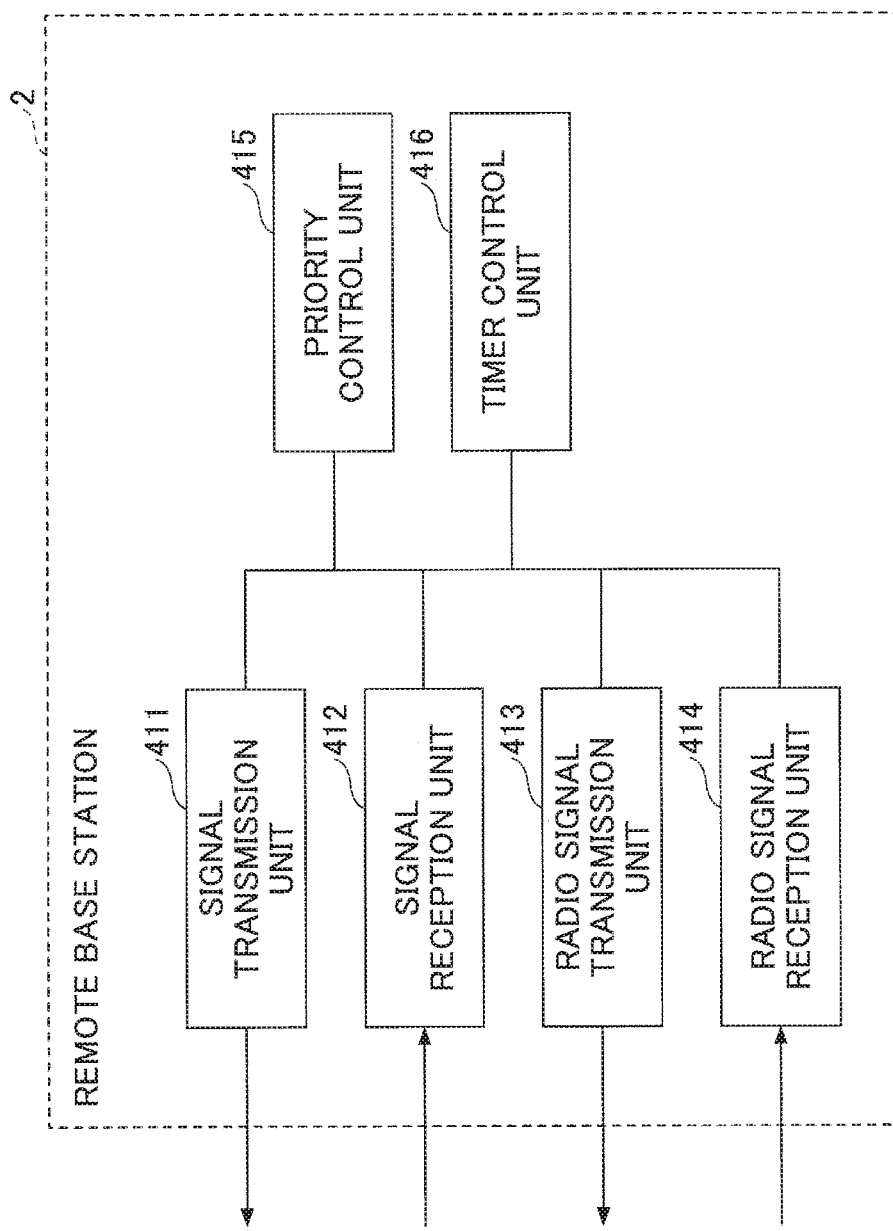
FIG. 29 is a drawing illustrating an example of a functional configuration of a remote base station according to a fourth embodiment.

FIG. 29 is a drawing illustrating an example of a functional configuration of a remote base station 2 according to the fourth embodiment. As illustrated in FIG. 29, the remote base station 2 includes a signal transmission unit 411, a signal reception unit 412, a radio signal transmission unit 413, a radio signal reception unit 414, a priority control unit 415, and a timer control unit 416. It should be noted that FIG. 29 illustrates functional units of the remote base station 2 especially related to the fourth embodiment only, and thus, the remote base station 2 also includes at least functions for performing operations according to LTE (not shown in the figure). Further, a functional structure illustrated in FIG. 29 is only an example. Functional classification and names of functional units may be anything as long as operations related to one or more embodiments can be performed.

The signal transmission unit 411 includes a function for generating a signal to be transmitted toward the central base station 1 from a radio signal received from the radio signal reception unit 414, and transmitting the generated signal to the central base station 1. The signal reception unit 412 includes a function for generating a layer 1 signal from a signal received from the central base station 1, and transmitting the generated signal to the radio signal transmission unit 413. The radio signal transmission unit 413 transmits the layer 1 signal received from the signal reception unit 412 to the user apparatus 3 by using a radio signal. The radio signal reception unit 414 transmits the radio signal received from the user apparatus 3 to the signal transmission unit 411.

The priority control unit 415 controls the signal transmission unit 411 in such a way that the quality information received from the user apparatus 3 is given higher priority than data other than the quality information such as user data, and transmitted to the central base station 1. Further, in order to prevent the quality information of a specific user apparatus 3 from being discarded continuously, the priority control unit 415 controls the signal transmission unit 411 in such a way that once quality information of a user apparatus 3 is discarded, quality information of the same user apparatus 3 may be given further higher priority and transmitted to the central base station 1.

The timer control unit 416 stores a timer value indicating a time limit until the quality information transmitted from the user apparatus 3 is transmitted to the central base station 1. It should be noted that the timer control unit 416 may receive the timer value from the central base station 1. The timer control unit 416 measures elapsed time from the quality information reception from the user apparatus 3. In the case where the quality information cannot be transmitted to the central base station 1 within a time set in the timer value, the timer control unit 416 instructs the signal transmission unit 411 to discard the quality information.

Further, the timer control unit 416 measures an elapsed time (staying time) from the quality information reception from the user apparatus 3, and instructs the signal transmission unit 411 to transmit together the quality information and the staying time to the user apparatus 3.

(User Apparatus)

Figure 30:
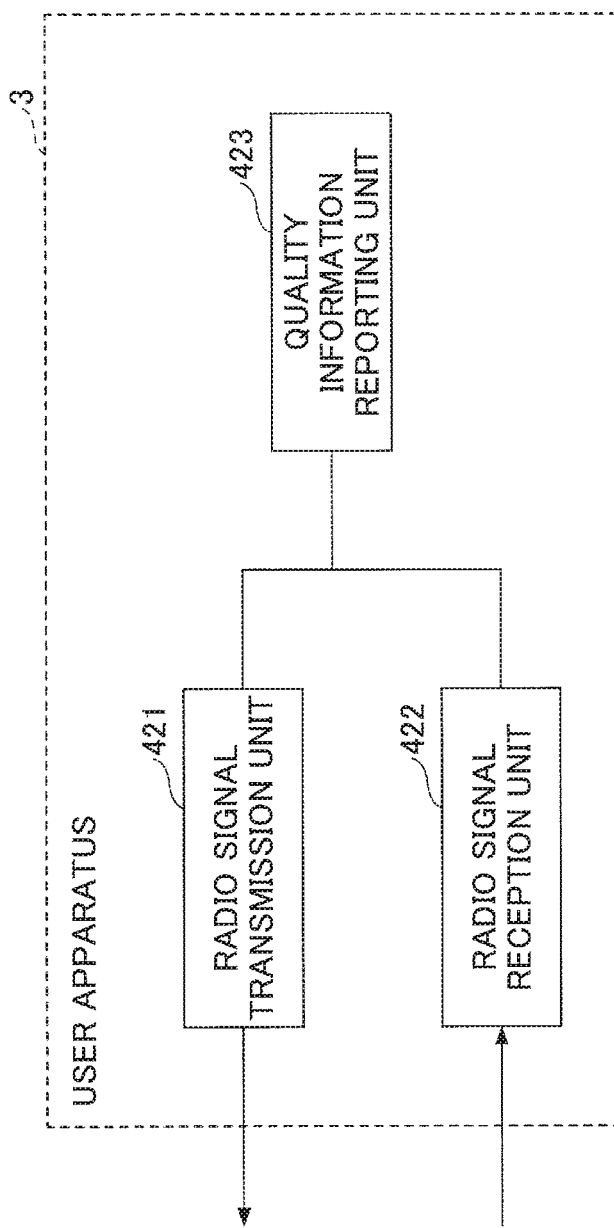
FIG. 30 is a drawing illustrating an example of a functional configuration of a user apparatus according to a fourth embodiment.

FIG. 30 is a drawing illustrating an example of a functional configuration of a user apparatus 3 according to the fourth embodiment. As illustrated in FIG. 30, the user apparatus 3 includes a radio signal transmission unit 421, a radio signal reception unit 422, and a quality information reporting unit 423. It should be noted that FIG. 30 illustrates functional units of the user apparatus 3 especially related to the fourth embodiment only, and thus, the user apparatus 3 further includes at least functions for performing operations according to LTE (not shown in the figure). Further, a functional structure illustrated in FIG. 30 is only an example. Functional classification and names of functional units may be anything as long as operations related to one or more embodiments can be performed.

The radio signal transmission unit 421 includes a function for generating various kinds of physical layer signals from an upper layer signal which should be transmitted from the user apparatus 3 and wirelessly transmitting the generated signals. The radio signal reception unit 422 includes a function for wirelessly receiving various kinds of signals from the remote base station 2, and obtaining upper layer signals from the received physical layer signals.

The quality information reporting unit 423 measures downlink radio quality (CSI, etc.) generates quality information (CSI, SRS, etc.) and transmits the generated quality information to the remote base station 2. Further, the quality information reporting unit 423 transmits the quality information directly to the central base station 1 according to an instruction from the central base station 1.

SUMMARY

As described above, according to the fourth embodiment, a base station is provided. The base station is used as a first base station in a mobile communication system including the first base station, a second base station communicating with the first base station, and a user apparatus communicating with the first base station. The base station includes a first reception unit configured to receive from the user apparatus first data including quality information used for scheduling operations performed by the second base station and second data different from the first data; and a transmission unit configured to transmit the first data to the base station by giving higher priority to the first data than to the second data. With the above remote base station 2, a technology is provided which enables performing appropriate communications even in the case where the transmission delay between the base station and the remote base station is big in a mobile communication network based on C-RAN.

Further, the base station may include a second reception unit configured to receive from the second base station timer information indicating a time limit until the first data is transmitted to the second base station from the first data reception. The transmission unit may discard the first data in the case where the first data cannot be transmitted to the second base station within the time limit. With the above arrangement, it is possible for the remote base station 2 not to transmit old quality information to the central base station, and it is possible to reduce communication quality degradation due to the scheduling control based on erroneous quality information.

Further, in the case where the first data is discarded, the transmission unit may report to the second base station that the first data has been discarded. With the above arrangement, it is possible for the remote base station 2 to cause the central base station 1 to, for example, perform scheduling operations by other means.

Further, the transmission unit may transmit information indicating the staying time from the first data reception from the user apparatus to the transmission to the second base station and the first data to the second base station. With the above arrangement, it is possible for the remote base station 2 to cause the central base station 1 to determine whether the quality information is new and it is possible to reduce communication quality degradation due to the scheduling operations based on erroneous quality information.

Further, the first data may be at least one of a channel quality indicator, a precoding matrix indicator, a rank indicator, and a sounding reference signal. With the above arrangement, it is possible for the remote base station 2 to give higher priority to various quality information items and to transmit the quality information items to the central base station 1.

Further, the "unit" included in the above apparatuses may be substituted for by "means", "circuit", "device", etc.

<Hardware Structure>

As described above, functional structures of a central base station 1, a remote base station 2, and a user apparatus 3 according to the first through fourth embodiment may be entirely realized by a hardware circuit (e.g., one or more IC chips), or partially realized by a hardware circuit and other parts may be realized by a CPU and a program.

(Central Base Station)

Figure 31:
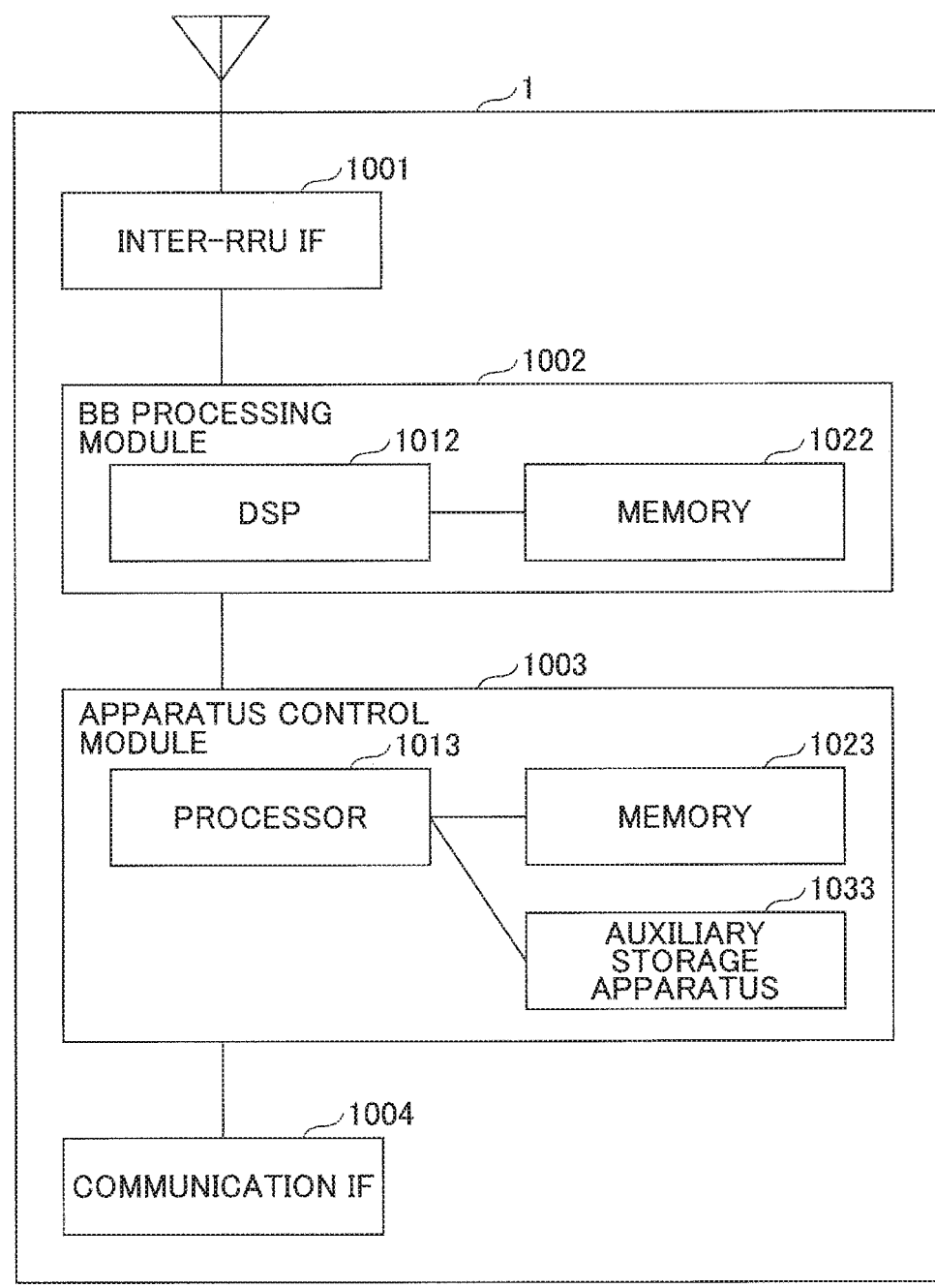
FIG. 31 is a drawing illustrating an example of a hardware configuration of a central base station according to one or more embodiments.

FIG. 31 is a drawing illustrating an example of a hardware configuration of a central base station according to one or more embodiments. FIG. 31 illustrates a structure closer to an implementation example compared to FIG. 7, FIG. 13, FIG. 22, or FIG. 28. As illustrated in FIG. 31, the central base station 1 includes an inter-RRU IF 1001 as an interface for connecting to the remote base station 2, a baseband (BB) processing module 1002 for performing a baseband signal processing, an apparatus control module 1003 for performing a process of an upper layer, etc., and a communication IF 1004 as an interface for connecting to a core network, etc.

The inter-RRU IF 1001 has a function for connecting a physical line of fronthaul (FH) which connects the central base station 1 and the remote base station 2, and a function for terminating a protocol used in FH. The inter-RRU IF 1001 includes, for example, a part of the signal transmission unit 101 and a part of the signal reception unit 102 illustrated in FIG. 7; a part of the signal transmission unit 201 and a part of the signal reception unit 202 illustrated in FIG. 13; a part of the signal transmission unit 301 and a part of the signal reception unit 302 illustrated in FIG. 22; and a part of the signal transmission unit 401 and a part of the signal reception unit 402 illustrated in FIG. 28.

The BB processing module 1002 performs a process of converting bidirectionally between an IP packet and a signal transmitted/received to/from the remote base station 2. DSP 1012 is a processor for performing a signal processing in the BB processing module 1002. A memory 1022 is used as a work area of the DSP 1012. The BB processing module 1002 includes, for example, a part of the signal transmission unit 101, a part of the signal reception unit 102, the scheduling unit 103, the HARQ processing unit 104, the processing method instruction unit 105, and the transmission delay measurement unit 107 illustrated in FIG. 7; a part of the signal transmission unit 201, a part of the signal reception unit 202, and the scheduling unit 203 illustrated in FIG. 13; a part of the signal transmission unit 301, a part of the signal reception unit 302, the scheduling unit 303, the HARQ processing unit 304, and the CA control unit 305 illustrated in FIG. 22; and a part of the signal transmission unit 401, a part of the signal reception unit 402, the determination unit 403, and the CA control unit 404 illustrated in FIG. 28.

The apparatus control module 1003 performs an IP layer protocol process, an operation and maintenance (OAM) process, etc. A processor 1013 performs a process for the apparatus control module 1003. A memory 1023 is used as a work area of the processor 1013. An auxiliary storage apparatus 1033 is, for example, a HDD, etc., and stores various types of setting information items, etc., used for operations of the base station eNB. The apparatus control module 1003 includes, for example, the capability information reception unit 106 illustrated in FIG. 7.

(Remote Base Station)

Figure 32:
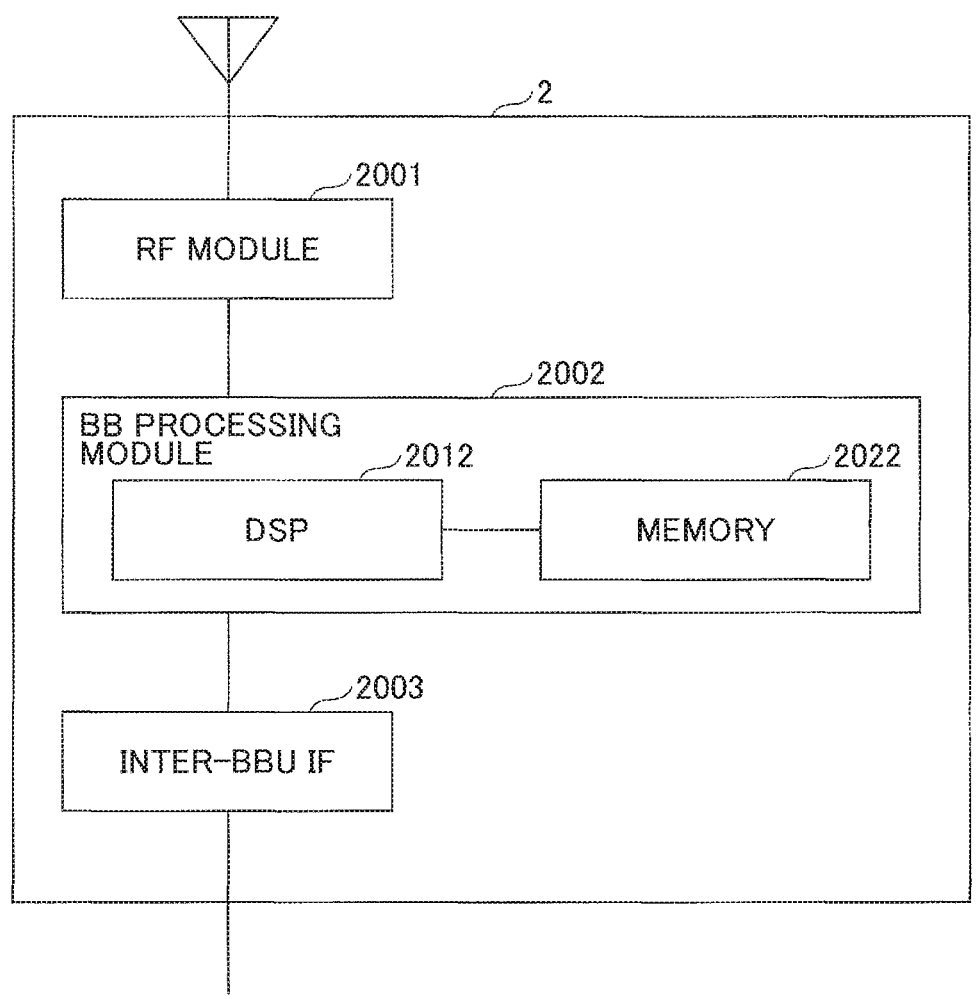
FIG. 32 is a drawing illustrating an example of a hardware configuration of a remote base station according to one or more embodiments.

FIG. 32 is a drawing illustrating an example of a hardware configuration of a remote base station according to one or more embodiments. FIG. 32 illustrates a structure closer to an implementation example compared to FIG. 8, FIG. 14, FIG. 23, or FIG. 29. As illustrated in FIG. 32, the base station 2 includes a radio frequency (RF) module 2001 for performing a process related to a radio signal, a BB processing module 2002 for performing baseband signal processing, and an inter-BBU IF 2003 as an interface for connecting to the central base station 1.

The RF module 2001 generates a radio signal to be transmitted from an antenna by performing digital-to-analog (D/A) conversion, modulation, frequency conversion, power amplification, etc., for a digital baseband signal received from the BB processing module 2002. Further, the RF module 161 generates a digital baseband signal by performing frequency conversion, analog to digital (A/D) conversion, demodulation, etc., for a received radio signal, and transmits the generated signal to the BB processing module 2002. The RF module 2001 include an RF function. The RF module 2001 includes, for example, a part of the radio signal transmission unit 113 and a part of the radio signal reception unit 114 illustrated in FIG. 8; a part of the radio signal transmission unit 213 and a part of the radio signal reception unit 214 illustrated in FIG. 14; a part of the radio signal transmission unit 313 and a part of the radio signal reception unit 314 illustrated in FIG. 23; and a part of the radio signal transmission unit 413 and a part of the radio signal reception unit 414 illustrated in FIG. 29.

The BB processing module 2002 performs bidirectionally converting processing between a signal transmitted/received to/from the central base station 1 and a digital baseband signal via the inter-BBU IF 2003. A digital signal processor (DSP) 2012 is a processor for performing signal processing in the BB processing module 2002. A memory 2022 is used as a work area of the DSP 2012. The BB processing module 2002 includes, for example, a part of the radio signal transmission unit 113, a part of the radio signal reception unit 114, the HARQ processing unit 115, the processing method accepting unit 116, and the transmission delay measurement unit 117 illustrated in FIG. 8; a part of the radio signal transmission unit 213, a part of the radio signal reception unit 214, the HARQ processing unit 215, and the retransmission processing unit 216 illustrated in FIG. 14; a part of the radio signal transmission unit 313, a part of the radio signal reception unit 314, and the HARQ processing unit 315 illustrated in FIG. 23; and a part of the radio signal transmission unit 413, a part of the radio signal reception unit 414, the priority control unit 415, and the timer control unit 416 illustrated in FIG. 29.

The inter-BBU IF 2003 has a function for connecting a physical line of fronthaul (FH) which connects the central base station 1 and the remote base station 2, and a function for terminating a protocol used in FH. The inter-BBU IF 2003 includes, for example, the signal transmission unit 111 and the signal reception unit 112 illustrated in FIG. 8; the signal transmission unit 211 and the signal reception unit 212 illustrated in FIG. 14; the signal transmission unit 311 and the signal reception unit 312 illustrated in FIG. 23; and the signal transmission unit 411 and the signal reception unit 412 illustrated in FIG. 29.

(User Apparatus)

Figure 33:
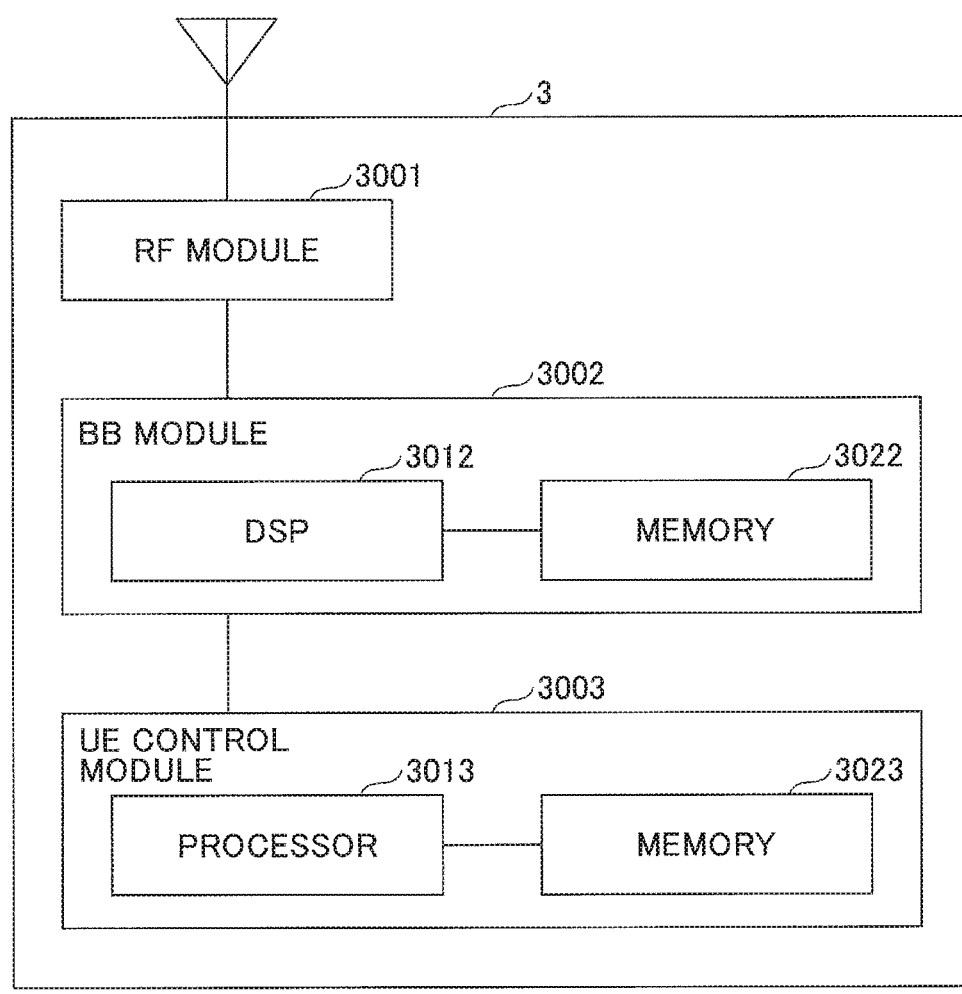
FIG. 33 is a drawing illustrating an example of a hardware configuration of a user apparatus according to one or more embodiments.

FIG. 33 is a drawing illustrating an example of a hardware configuration of a user apparatus 1 according to one or more embodiments. FIG. 33 illustrates a structure closer to an implementation example compared to FIG. 9, FIG. 15, FIG. 24, or FIG. 30. As illustrated in FIG. 33, the user apparatus 3 includes a RF module 3001 for performing a process related to a wireless signal, a BB processing module 3002 for performing baseband signal processing, and a UE control module 3003 for performing a process of an upper layer, etc.

The RF module 3001 generates a radio signal to be transmitted from an antenna by performing D/A conversion, modulation, frequency conversion, power amplification, etc., for a digital baseband signal received from the BB processing module 3002. Further, the RF module 401 generates a digital baseband signal by performing frequency conversion, A/D conversion, demodulation, etc., for a received radio signal, and transmits the generated signal to the BB processing module 3002. The RF module 3001 includes, for example, a part of the radio signal transmission unit 121 and a part of the radio signal reception unit 122 illustrated in FIG. 9; a part of the radio signal transmission unit 221 and a part of the radio signal reception unit 222 illustrated in FIG. 15; a part of the radio signal transmission unit 321 and a part of the radio signal reception unit 322 illustrated in FIG. 24; and a part of the radio signal transmission unit 421 and a part of the radio signal reception unit 422 illustrated in FIG. 30.

The BB processing module 3002 performs a process of converting bidirectionally between an IP packet and a digital baseband signal. A Digital signal processor (DSP) 3012 is a processor for performing signal processing in the BB processing module 3002. A memory 3022 is used as a work area of the DSP 3012. The BB processing module 3002 includes, for example, a part of the radio signal transmission unit 121, a part of the radio signal reception unit 122, the HARQ processing unit 123, and the processing method accepting unit 124 illustrated in FIG. 9; a part of the radio signal transmission unit 221, a part of the radio signal reception unit 222, and the HARQ processing unit 223 illustrated in FIG. 15; a part of the radio signal transmission unit 321, a part of the radio signal reception unit 322, and the HARQ processing unit 323 illustrated in FIG. 24; and a part of the radio signal transmission unit 421, a part of the radio signal reception unit 422, and the quality information reporting unit 423 illustrated in FIG. 30.

The UE control module 3003 performs an IP layer protocol process, processes of various types of applications, etc. A processor 3013 performs a process for the UE control module 3003. A memory 3023 is used as a work area of the processor 3013. The UE control module 3003 includes, for example, the capability reporting unit 125 illustrated in FIG. 9.

<Supplementary Description of Embodiment>

The apparatuses (central base station 1/remote base station 2/user apparatus 3) according to one or more embodiments may include a CPU and a memory, may be realized by having a program executed by the CPU (processor), may be realized by hardware such as hardware circuitry in which the logic described in one or more embodiments is included, or may be realized by a mixture of a program and hardware.

As described above, embodiments have been described. The disclosed invention is not limited to these embodiments, and a person skilled in the art would understand various variations, modifications, replacements, or the like. Specific examples of numerical values have been used for encouraging understanding of the present invention. These numeric values are merely examples and, unless otherwise noted, any appropriate values may be used. In the above description, partitioning of items is not essential to the present invention. Matters described in more than two items may be combined if necessary. Matters described in one item may be applied to matters described in another item (as long as they do not conflict). In a functional block diagram, boundaries of functional units or processing units do not necessarily correspond to physical boundaries of parts. Operations of multiple functional units may be physically performed in a single part, or operations of a single functional unit may be physically performed by multiple parts. The order of steps in the above described sequences and flowcharts according to one or more embodiments may be changed as long as there is no contradiction. For the sake of description convenience, the central base station 1, the remote base station 2, and the user apparatus 3 have been described using functional block diagrams. These apparatuses may be implemented by hardware, by software, or by combination of both. The software which is executed by a processor included in a central base station 1 according to one or more embodiments; the software which is executed by a processor included in a remote base station 2 according to one or more embodiments; and the software which is executed by a processor included in a user apparatus 3 according to one or more embodiments may be stored in a random access memory (RAM), a flash memory, a read-only memory (ROM), an EPROM, an EEPROM, a register, a hard disk drive (HDD), a removable disk, a CD-ROM, a database, a server, or any other appropriate recording medium.

The present invention is not limited to the above embodiments and various variations, modifications, alternatives, replacements, etc., may be included in the present invention without departing from the spirit of the invention.

In one or more embodiments, the remote base station 2 is an example of a first base station. The central base station 1 is an example of a second base station.

DESCRIPTION OF THE REFERENCE NUMERALS

1 Central base station
2 Remote base station
3 User apparatus
101 Signal transmission unit
102 Signal reception unit
103 Scheduling unit
104 HARQ processing unit
105 Processing method instruction unit
106 Capability information reception unit
107 Transmission delay measurement unit
111 Signal transmission unit
112 Signal reception unit
113 Radio signal transmission unit
114 Radio signal reception unit
115 HARQ processing unit
116 Processing method accepting unit
117 Transmission delay measurement unit 121 Radio signal transmission unit
122 Radio signal reception unit
123 HARQ processing unit
124 Processing method accepting unit
125 Capability reporting unit
201 Signal transmission unit
202 Signal reception unit
203 Scheduling unit
211 Signal transmission unit
212 Signal reception unit
213 Radio signal transmission unit
214 Radio signal reception unit
215 HARQ processing unit
216 Retransmission processing unit
221 Radio signal transmission unit
222 Radio signal reception unit
223 HARQ processing unit
301 Signal transmission unit
302 Signal reception unit
303 Scheduling unit
304 HARQ processing unit
305 CA control unit
311 Signal transmission unit
312 Signal reception unit
313 Radio signal transmission unit
314 Radio signal reception unit
315 HARQ processing unit
321 Radio signal transmission unit
322 Radio signal reception unit
323 HARQ processing unit
401 Signal transmission unit
402 Signal reception unit
403 Determination unit
404 CA control unit
411 Signal transmission unit
412 Signal reception unit
413 Radio signal transmission unit
414 Radio signal reception unit
415 Priority control unit
416 Timer control unit
421 Radio signal transmission unit
422 Radio signal reception unit
423 Quality information reporting unit
1001 Inter-RRU IF
1002 BB processing module
1003 Apparatus control module
1004 Communication IF
2001 RF module
2002 BB processing module
2003 Inter-BBU IF
3001 RF module
3002 BB processing module
3003 UE control module

What is claimed is:

1. A base station comprising:
a first reception unit configured to receive, from a same user apparatus included in a mobile communication system including the base station, another base station communicating with the base station, and the user apparatus communicating with the base station, first data including quality information used for scheduling controlling performed by the other base station and second data that is different from the first data and includes user data; and
a transmission unit configured to transmit the first data including the quality information to the other base station by giving higher priority to the first data including the quality information than to the second data that is received from the same user apparatus as the first data and includes the user data,
wherein the quality information and the user data are received from the user apparatus, and the quality information is transmitted to the other base station by giving higher priority to the quality information than to the user data.

2. The base station according to claim 1, further comprising:
a second reception unit configured to receive from the other base station timer information indicating a time limit from receiving the first data to transmitting the received first data to the other base station,
wherein the transmission unit discards the first data in the case where the first data cannot be transmitted to the other base station within the time limit.

3. The base station according to claim 2, wherein, in the case where the first data is discarded, the transmission unit reports to the other base station that the first data has been discarded.

4. The base station according to claim 3, wherein the first data is at least one of a channel quality indicator, a precoding matrix indicator, a rank indicator, and a sounding reference signal.

5. The base station according to claim 2, wherein the first data is at least one of a channel quality indicator, a precoding matrix indicator, a rank indicator, and a sounding reference signal.

6. The base station according to claim 1, wherein the transmission unit transmits to the other base station information indicating staying time from the first data reception from the user apparatus to the transmission to the other base station, and the first data.

7. The base station according to claim 6, wherein the first data is at least one of a channel quality indicator, a precoding matrix indicator, a rank indicator, and a sounding reference signal.

8. The base station according to claim 1, wherein the first data is at least one of a channel quality indicator, a precoding matrix indicator, a rank indicator, and a sounding reference signal.

9. A mobile communication system comprising:
a base station;
another base station communicating with the base station; and
a user apparatus communicating with the base station, wherein
the base station includes
a first reception unit configured to receive, from a same user apparatus, first data including quality information used for scheduling controlling performed by the other base station and second data that is different from the first data and includes user data, and
a transmission unit configured to transmit the first data including the quality information to the other base station by giving higher priority to the first data including the quality information than to the second data that is received from the same user apparatus as the first data and includes the user data,
the user apparatus includes
a transmission unit configured to transmit, to the base station, the first data including the quality information used for scheduling controlling performed by the other base station and the second data that is different from the first data and includes the user data, and the other base station includes
- a reception unit configured to receive, from the base station, the first data by having higher priority given to the first data including the quality information than to the second data that is received from the same user apparatus as the first data and includes the user data, and wherein the quality information and the user data are received from the user apparatus, and the quality information is transmitted to the other base station by giving higher priority to the quality information than to the user data.

* * * * *